(12) United States Patent
Saeedi Vahdat et al.

(10) Patent No.: US 12,279,410 B2
(45) Date of Patent: Apr. 15, 2025

(54) EPITAXIAL SINGLE CRYSTALLINE SILICON GROWTH FOR A HORIZONTAL ACCESS DEVICE

(71) Applicant: Micron Technology, Inc., Boise, ID (US)

(72) Inventors: Armin Saeedi Vahdat, Boise, ID (US); Gurtej S. Sandhu, Boise, ID (US); Scott E. Sills, Boise, ID (US); Si-Woo Lee, Boise, ID (US); John A. Smythe, III, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 17/705,680

(22) Filed: Mar. 28, 2022

(65) Prior Publication Data

US 2022/0223602 A1    Jul. 14, 2022

Related U.S. Application Data

(62) Division of application No. 17/035,819, filed on Sep. 29, 2020, now Pat. No. 11,289,491.

(51) Int. Cl.
*H10B 12/00* (2023.01)
*G11C 5/06* (2006.01)

(52) U.S. Cl.
CPC ............ *H10B 12/05* (2023.02); *G11C 5/063* (2013.01); *H10B 12/0335* (2023.02);
(Continued)

(58) Field of Classification Search
None
See application file for complete search history.

(56) References Cited

U.S. PATENT DOCUMENTS 10,446,578 B1    10/2019  Howder
10,607,995 B2    3/2020   Roberts et al.
(Continued)

OTHER PUBLICATIONS

U.S. Appl. No. 16/204,224, entitled, "Memory Arrays," filed Nov. 29, 2018, 43 pages.
(Continued)

*Primary Examiner* — Steven M Christopher
(74) *Attorney, Agent, or Firm* — Brooks, Cameron & Huebsch, PLLC

(57) ABSTRACT

Systems, methods, and apparatuses are provided for epitaxial single crystalline silicon growth for a horizontal access device. One example method includes depositing layers of a first dielectric material, a semiconductor material, and a second dielectric material to form a vertical stack, forming first vertical openings to form elongated vertical, pillar columns with first vertical sidewalls in the vertical stack, and forming second vertical openings through the vertical stack to expose second vertical sidewalls. Further, the example method includes selectively removing first portions of the semiconductor material from the second vertical openings to form horizontal openings with a remaining second portion of the semiconductor material at a distal end of the horizontal openings from the second vertical openings, and epitaxially growing single crystalline silicon within the horizontal openings from the distal end of the horizontal openings toward the second vertical openings to fill the horizontal openings.

14 Claims, 41 Drawing Sheets

(52) U.S. Cl.
CPC .......... *H10B 12/31* (2023.02); *H10B 12/482* (2023.02); *H10B 12/488* (2023.02)

(56) References Cited

U.S. PATENT DOCUMENTS

| | | | |
|---|---|---|---|
| 10,930,707 | B2 | 2/2021 | Fratin |
| 2016/0358933 | A1 | 12/2016 | Rabkin et al. |
| 2017/0125430 | A1 | 5/2017 | Nishikawa et al. |
| 2017/0133400 | A1 | 5/2017 | Yoo et al. |
| 2017/0278859 | A1 | 9/2017 | Sharangpani et al. |
| 2018/0006041 | A1 | 1/2018 | Xu et al. |
| 2018/0323200 | A1* | 11/2018 | Tang .................... H01L 23/528 |
| 2019/0019546 | A1 | 1/2019 | Luan |
| 2019/0103406 | A1 | 4/2019 | Tang et al. |
| 2019/0164985 | A1 | 5/2019 | Lee et al. |
| 2020/0411523 | A1* | 12/2020 | Shin ....................... H10B 12/02 |
| 2021/0257370 | A1* | 8/2021 | Son ......................... G11C 7/18 |

OTHER PUBLICATIONS

International Search Report and Written Opinion from international application No. PCT/US2021/040853, dated Nov. 1, 2021, 9 pages.

* cited by examiner

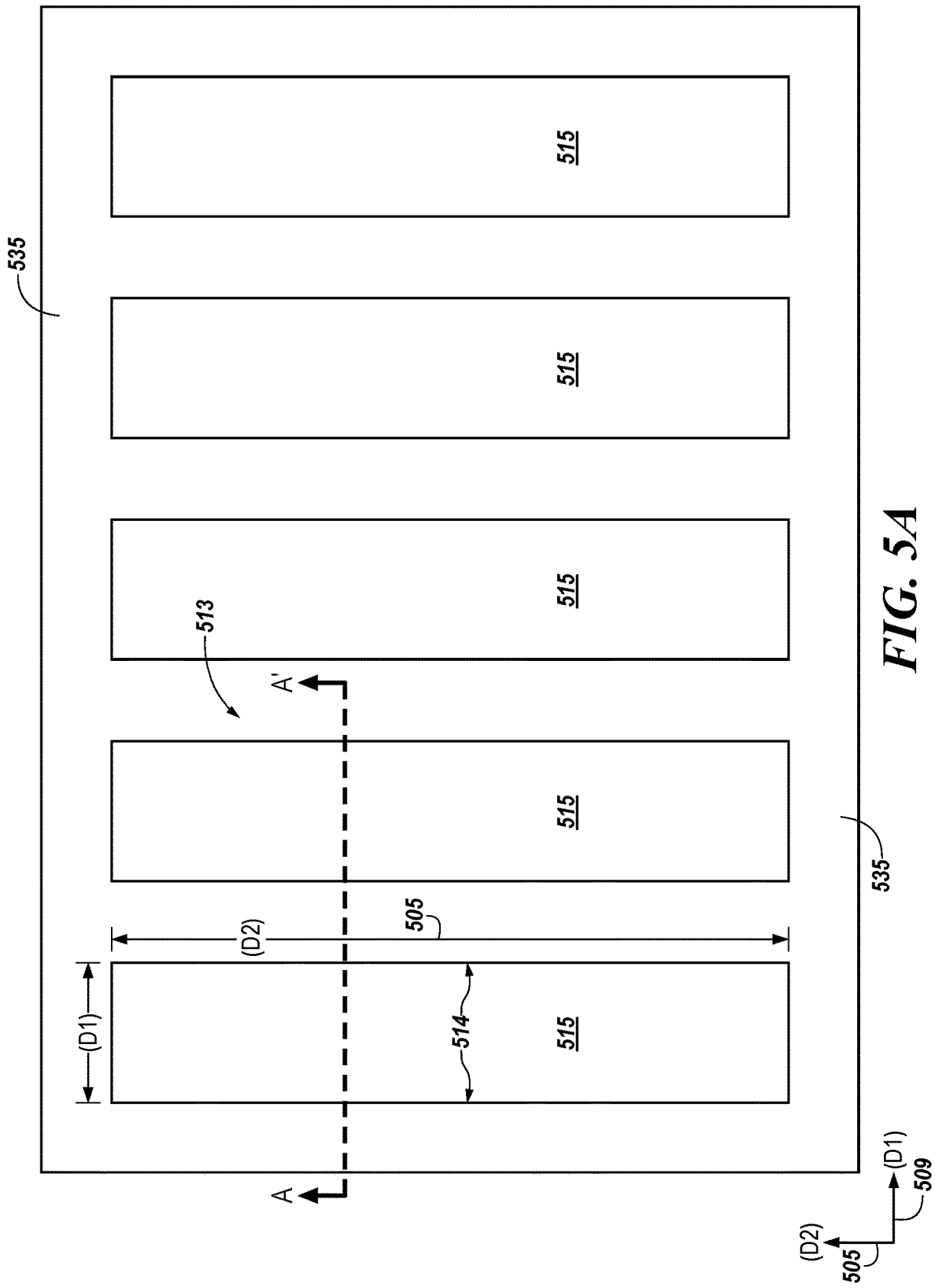

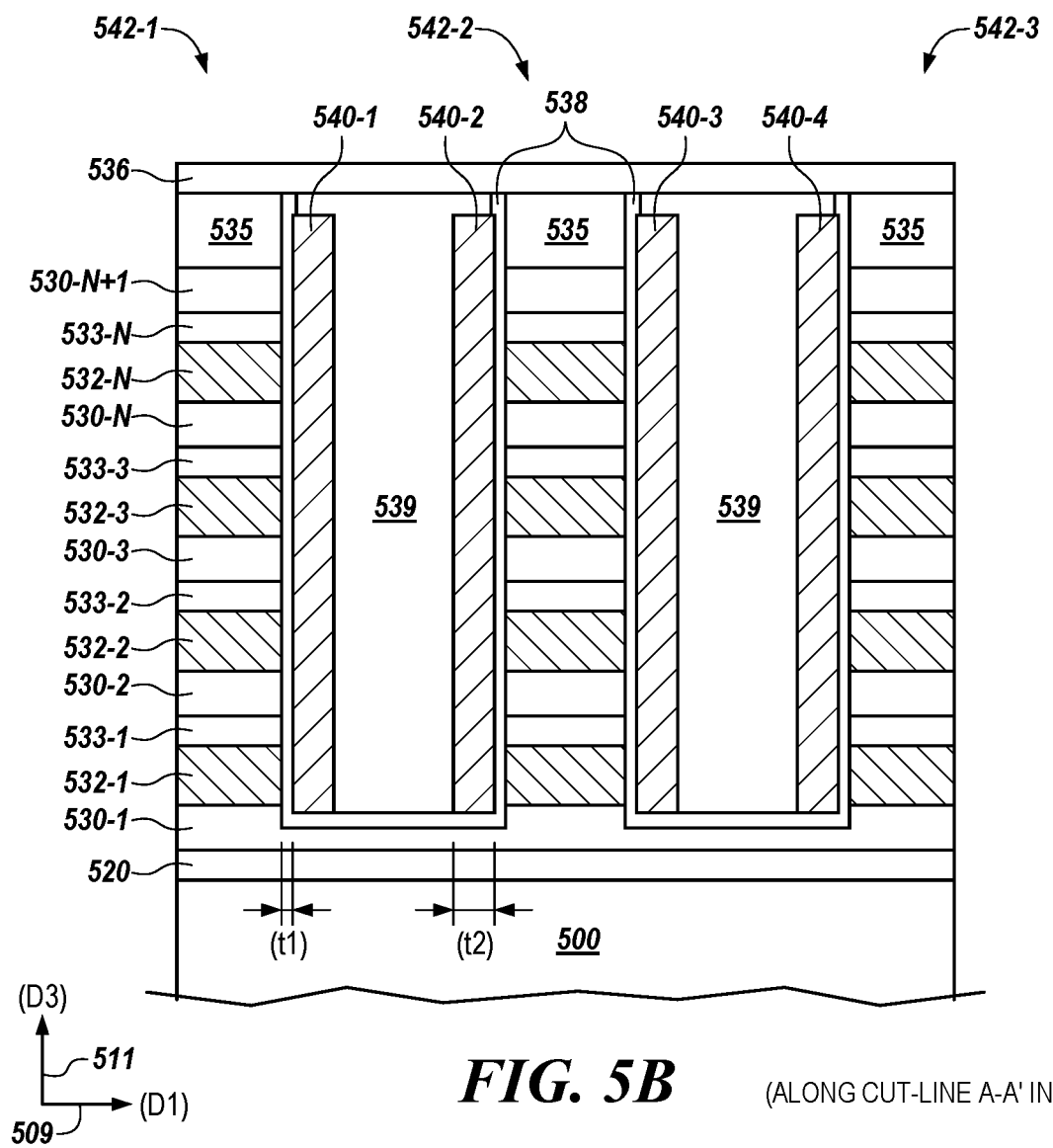
FIG. 5B  (ALONG CUT-LINE A-A' IN FIG 5A)

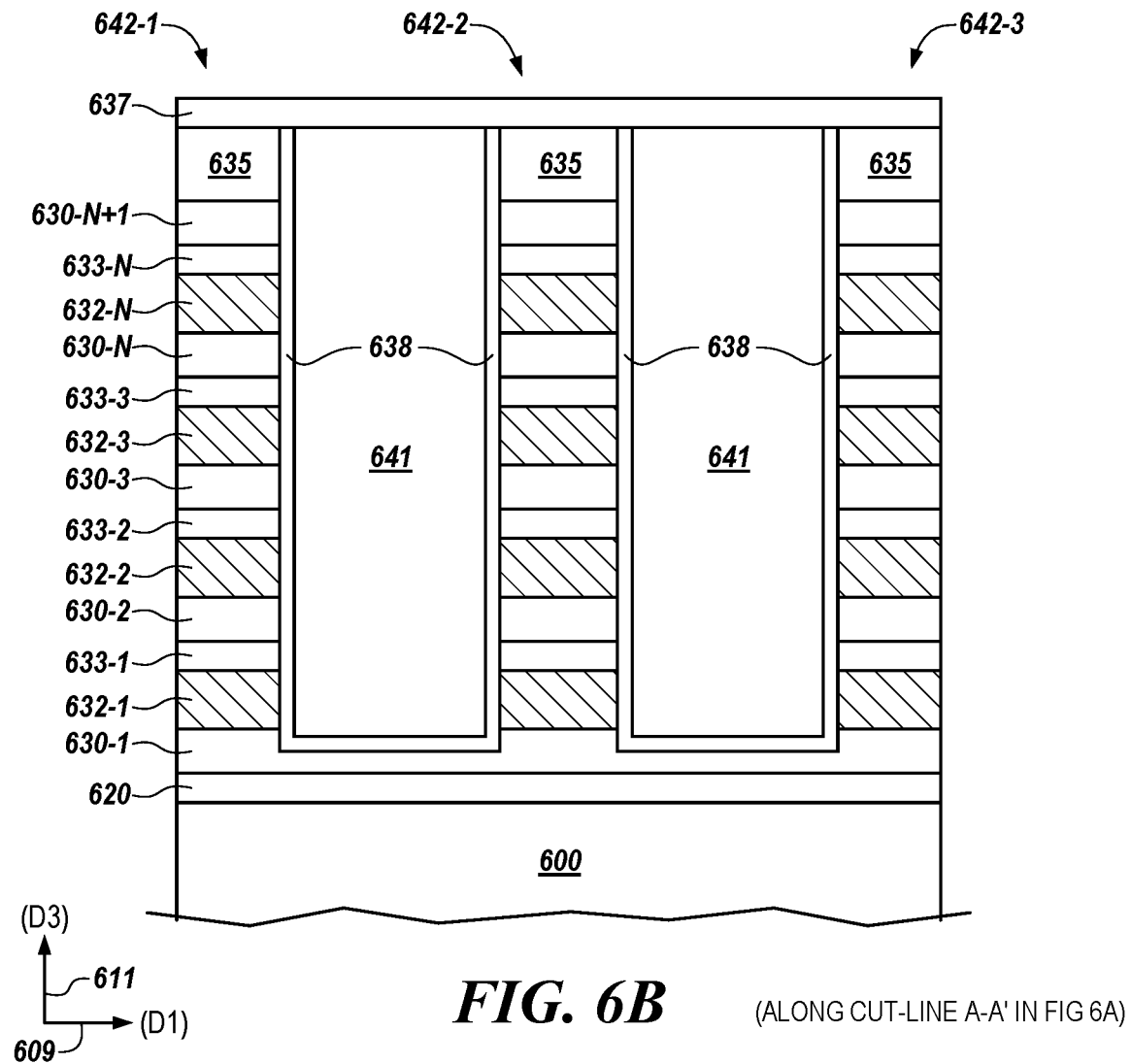
FIG. 6B (ALONG CUT-LINE A-A' IN FIG 6A)

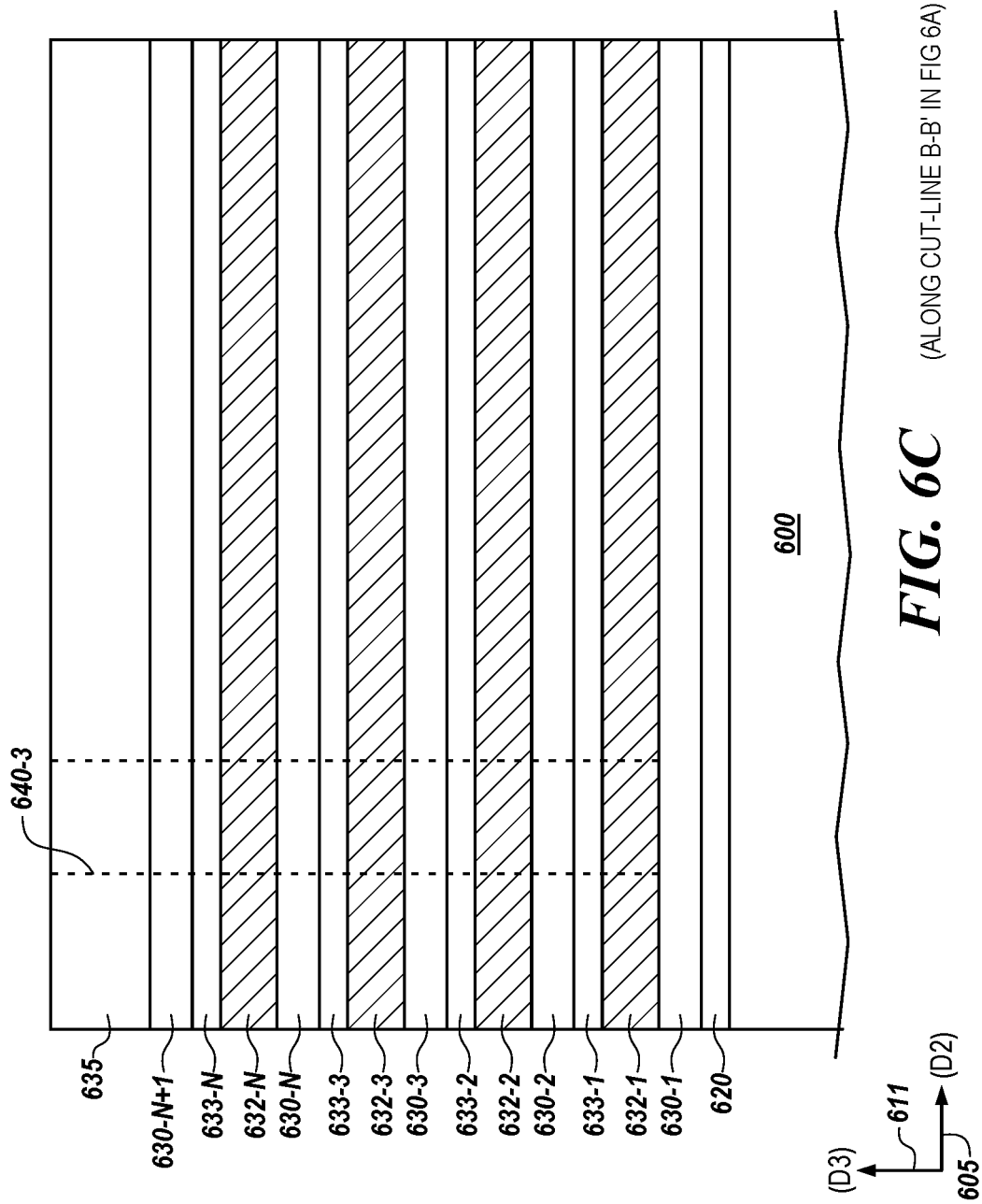
FIG. 6C (ALONG CUT-LINE B-B' IN FIG 6A)

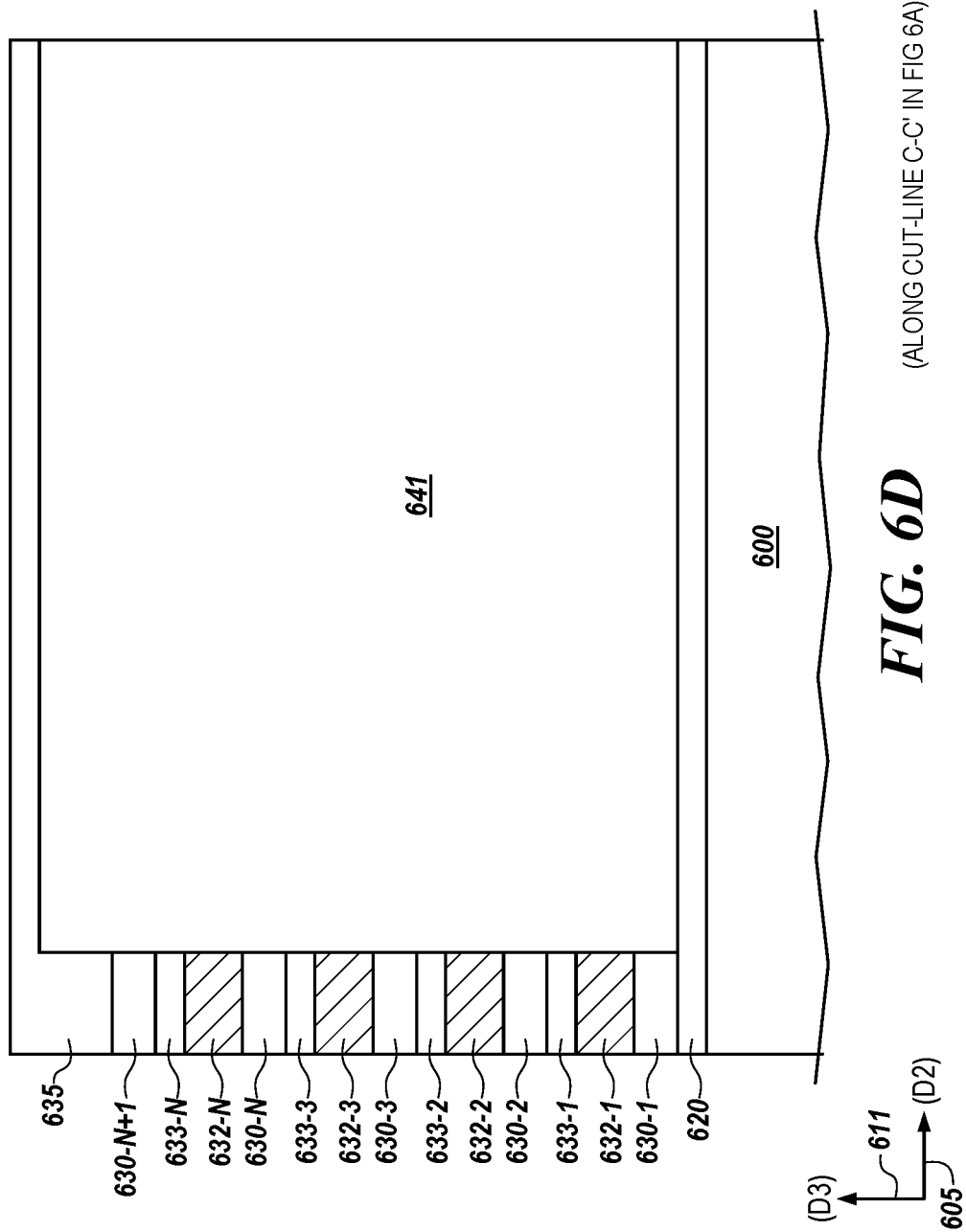
FIG. 6D (ALONG CUT-LINE C-C' IN FIG 6A)

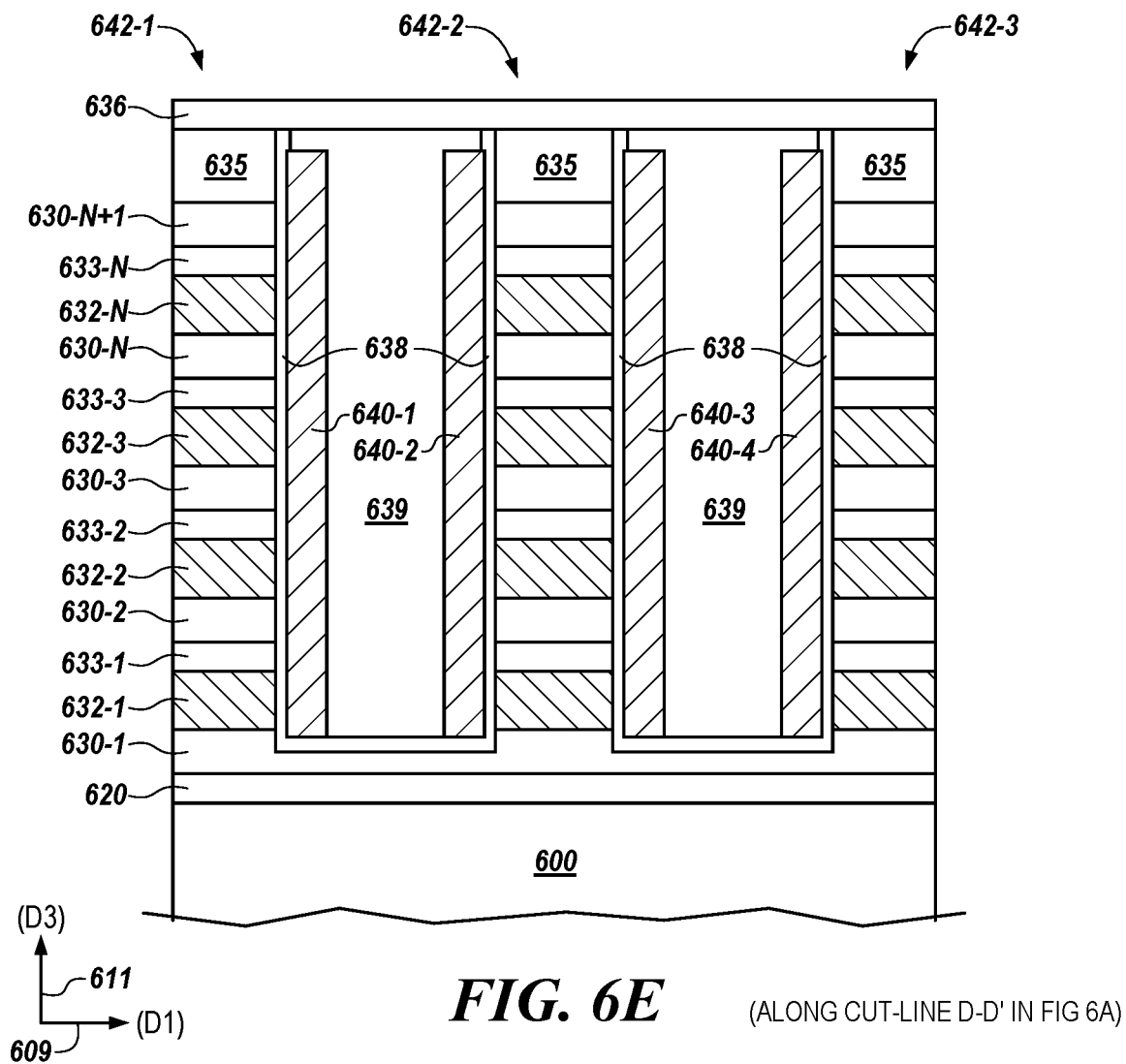
FIG. 6E (ALONG CUT-LINE D-D' IN FIG 6A)

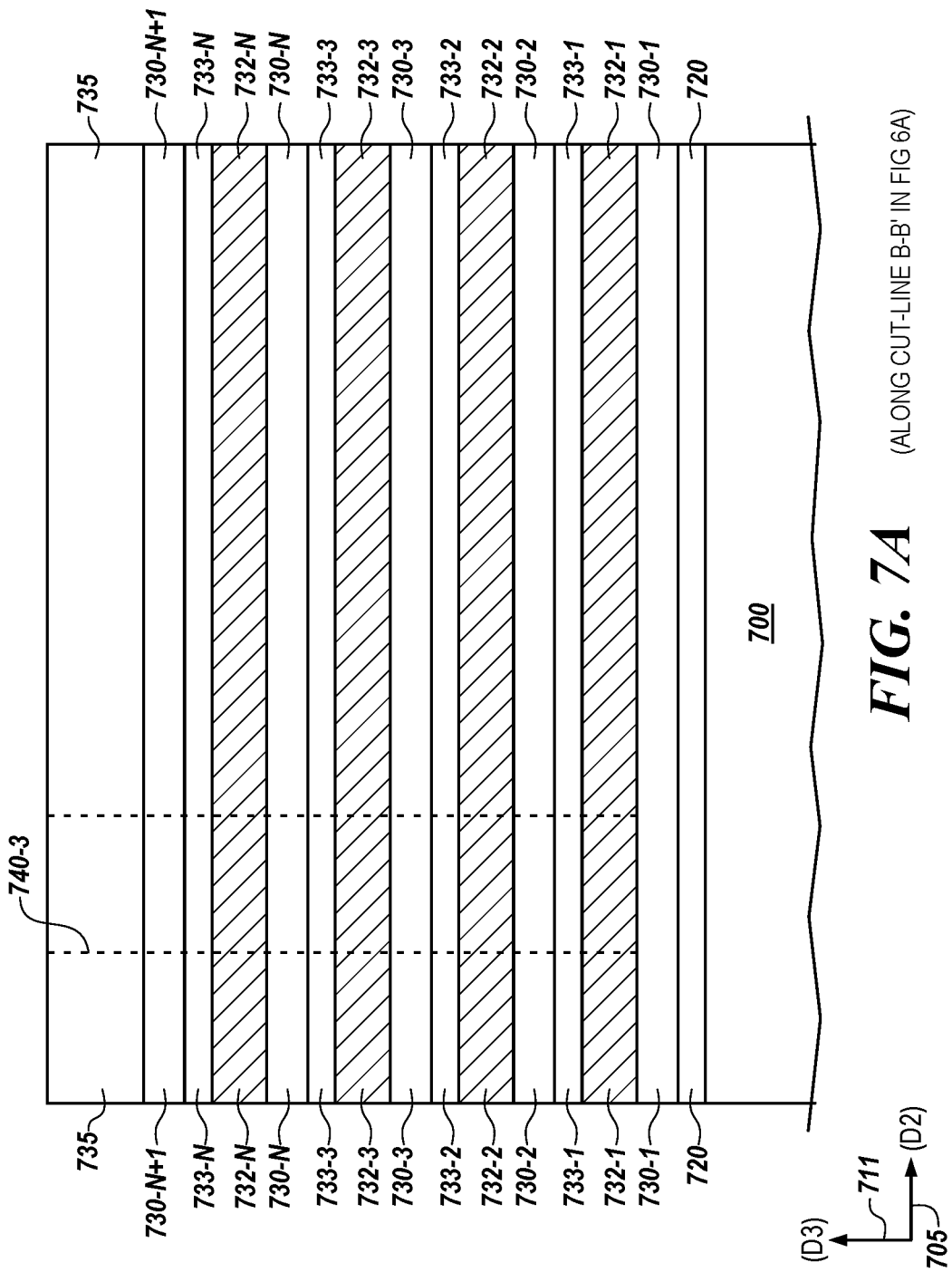
FIG. 7A (ALONG CUT-LINE B-B' IN FIG 6A)

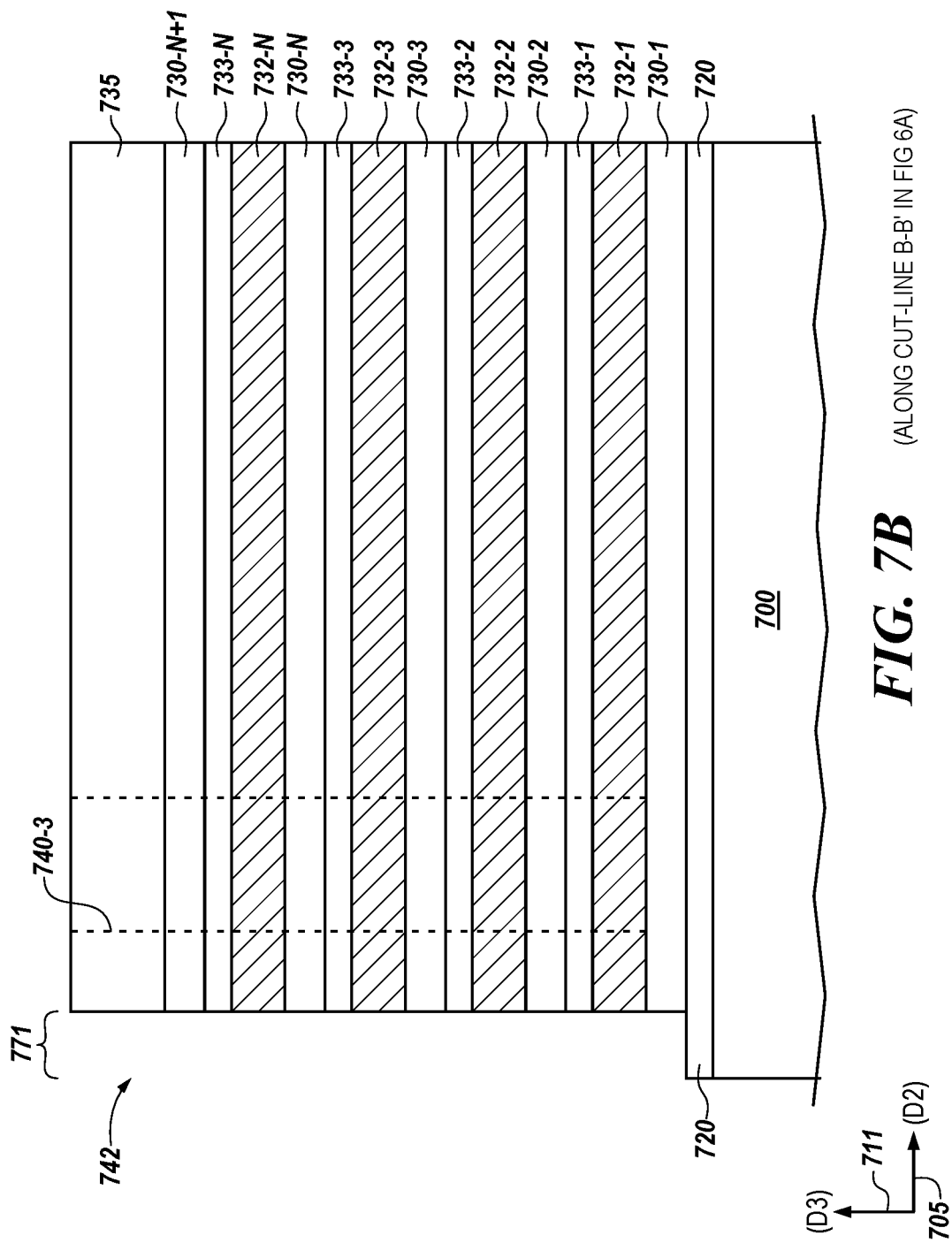
FIG. 7B (ALONG CUT-LINE B-B' IN FIG 6A)

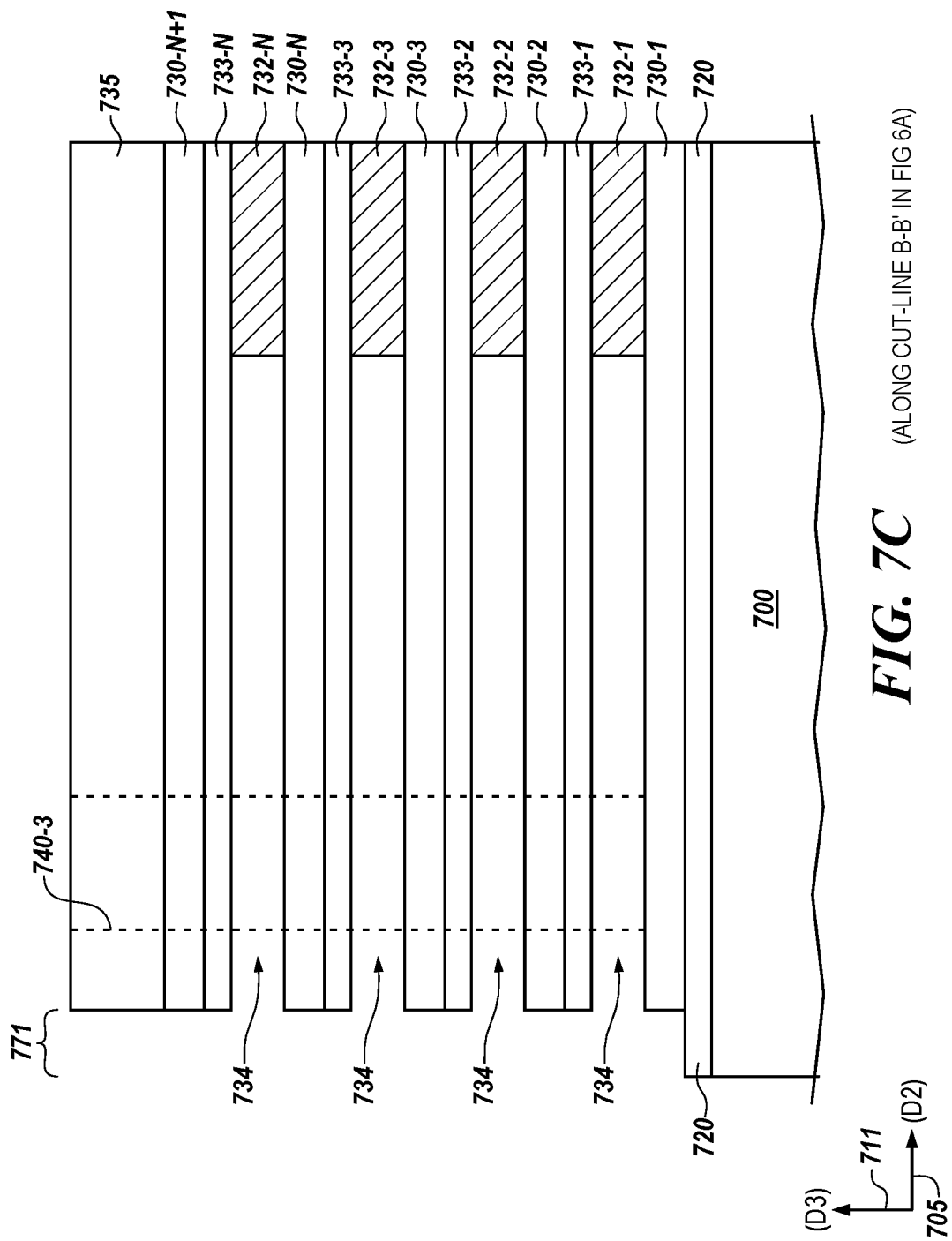
FIG. 7C (ALONG CUT-LINE B-B' IN FIG 6A)

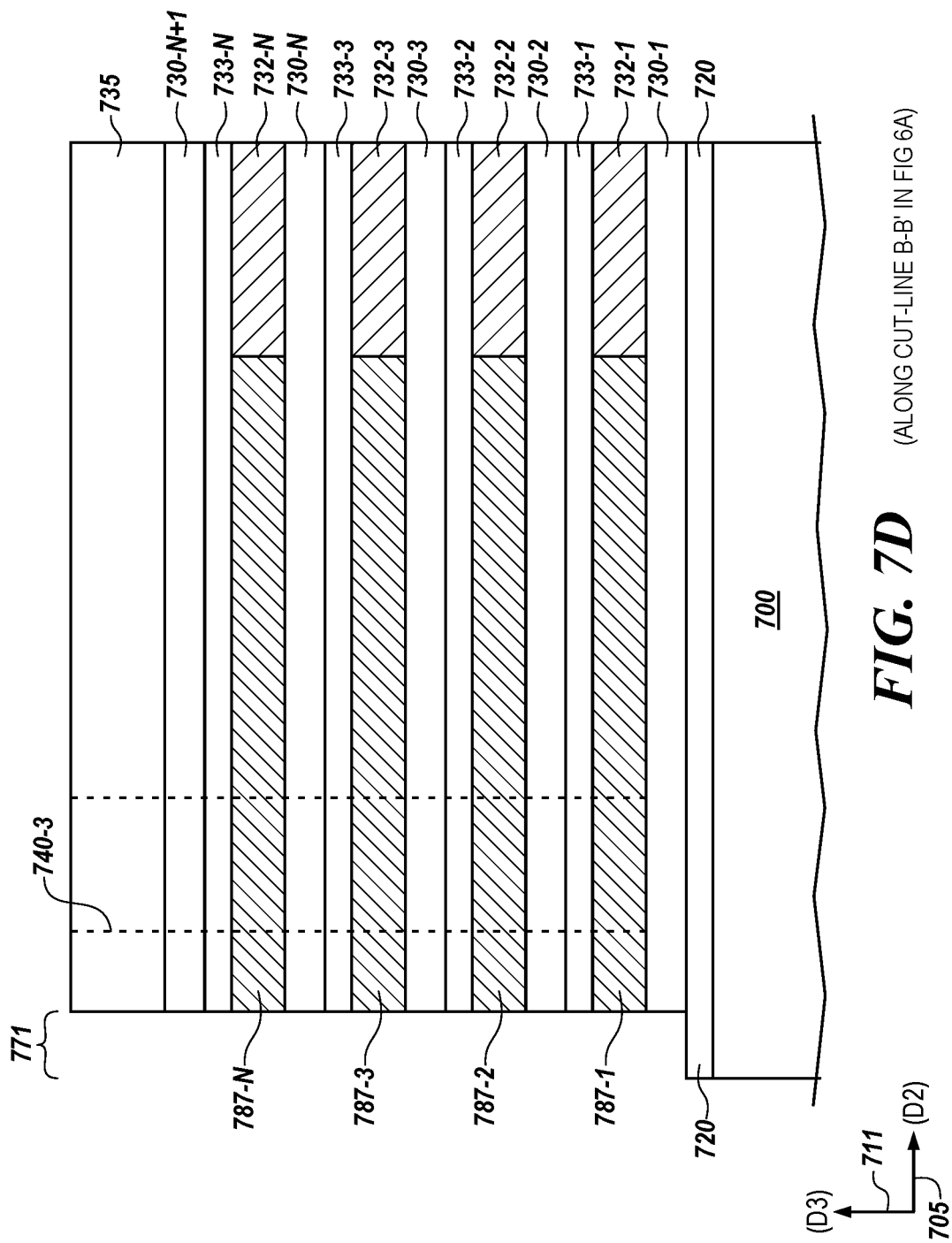
FIG. 7D (ALONG CUT-LINE B-B' IN FIG 6A)

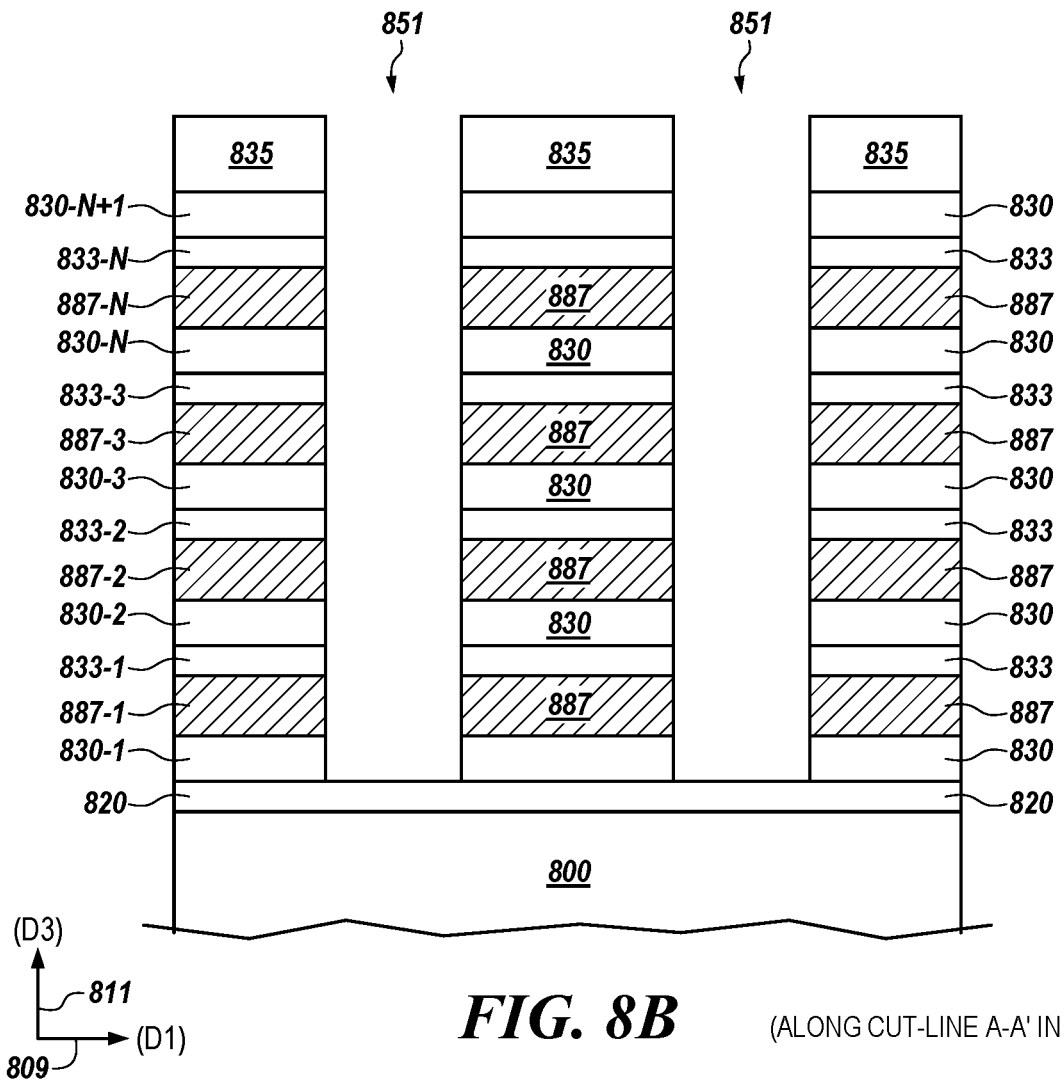
FIG. 8B (ALONG CUT-LINE A-A' IN FIG 8A)

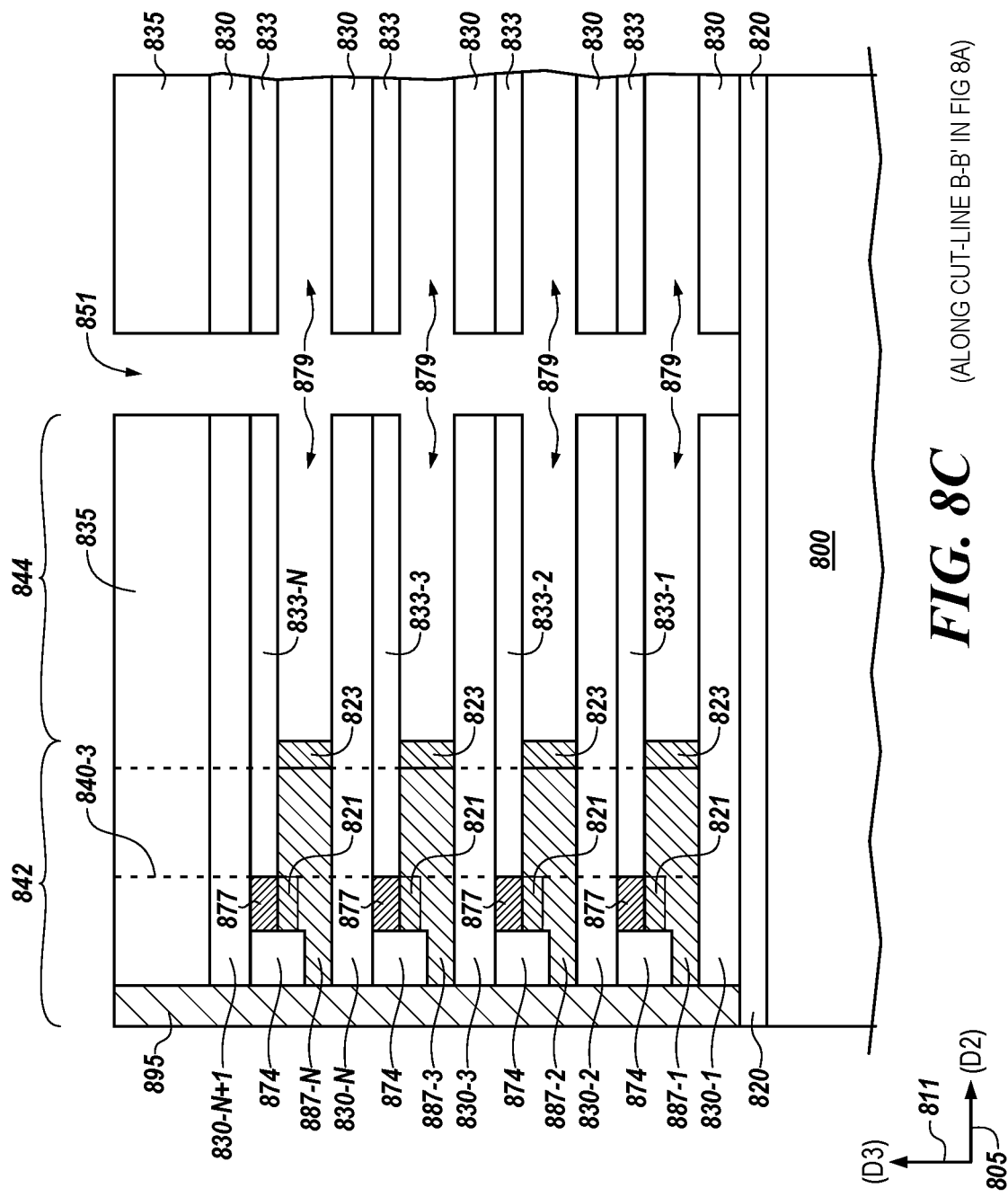
FIG. 8C (ALONG CUT-LINE B-B' IN FIG 8A)

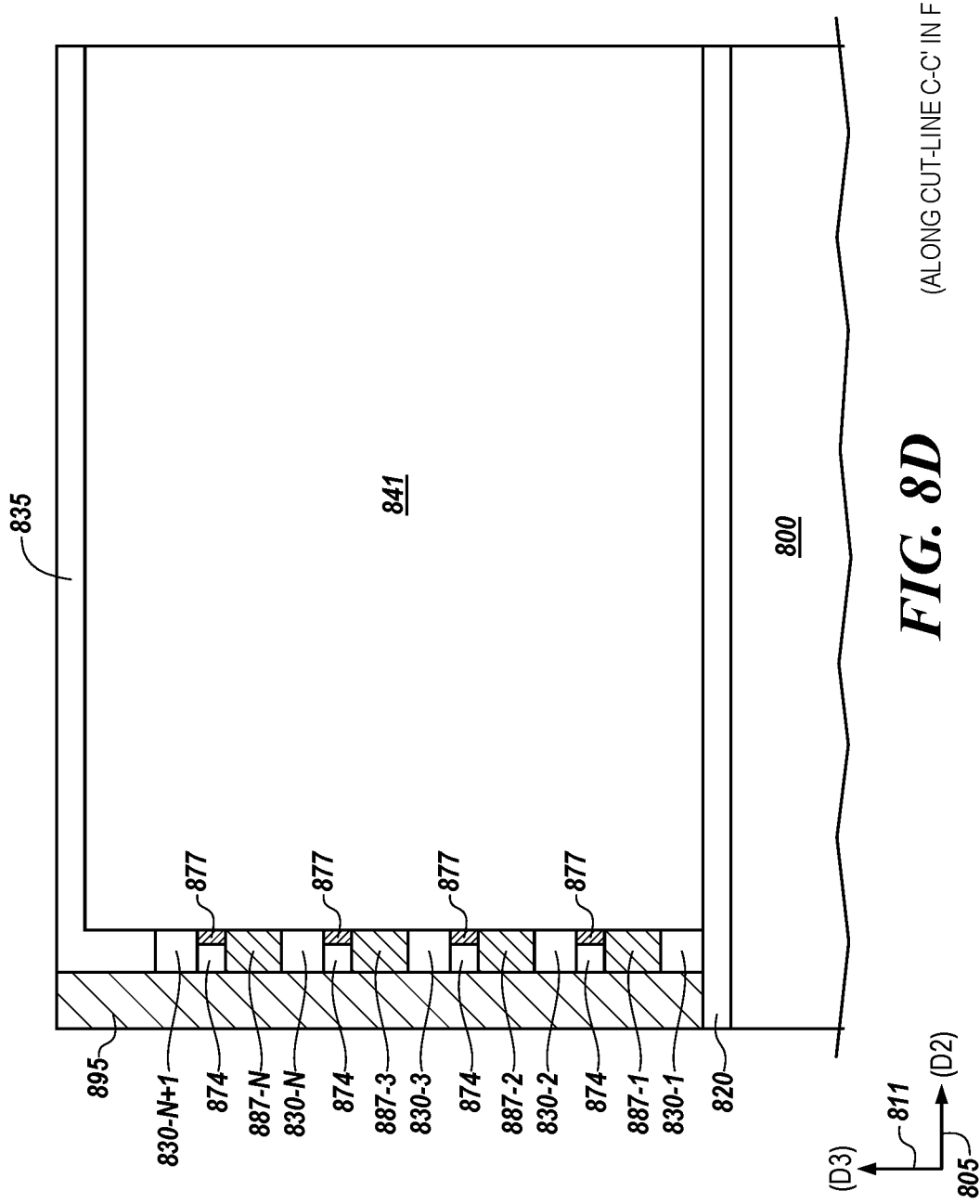

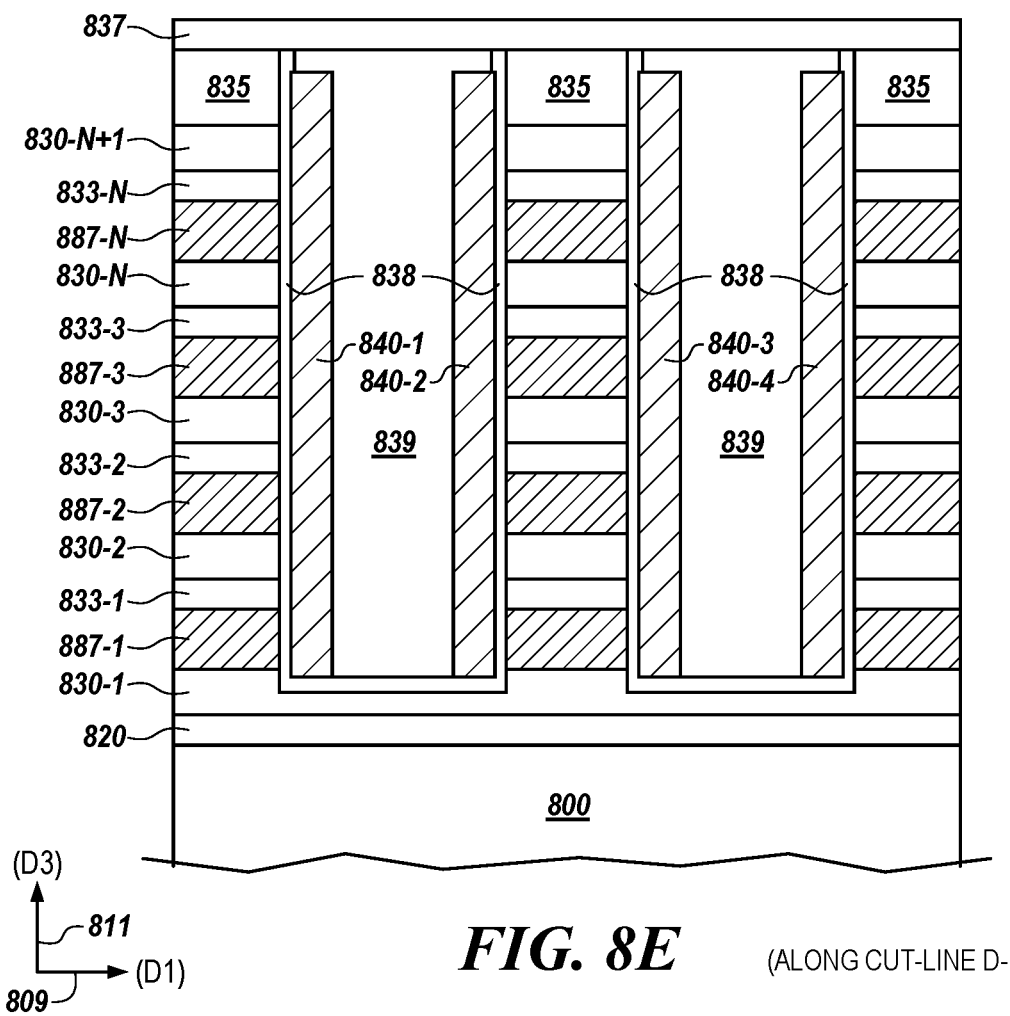
FIG. 8E (ALONG CUT-LINE D-D' IN FIG 8A)

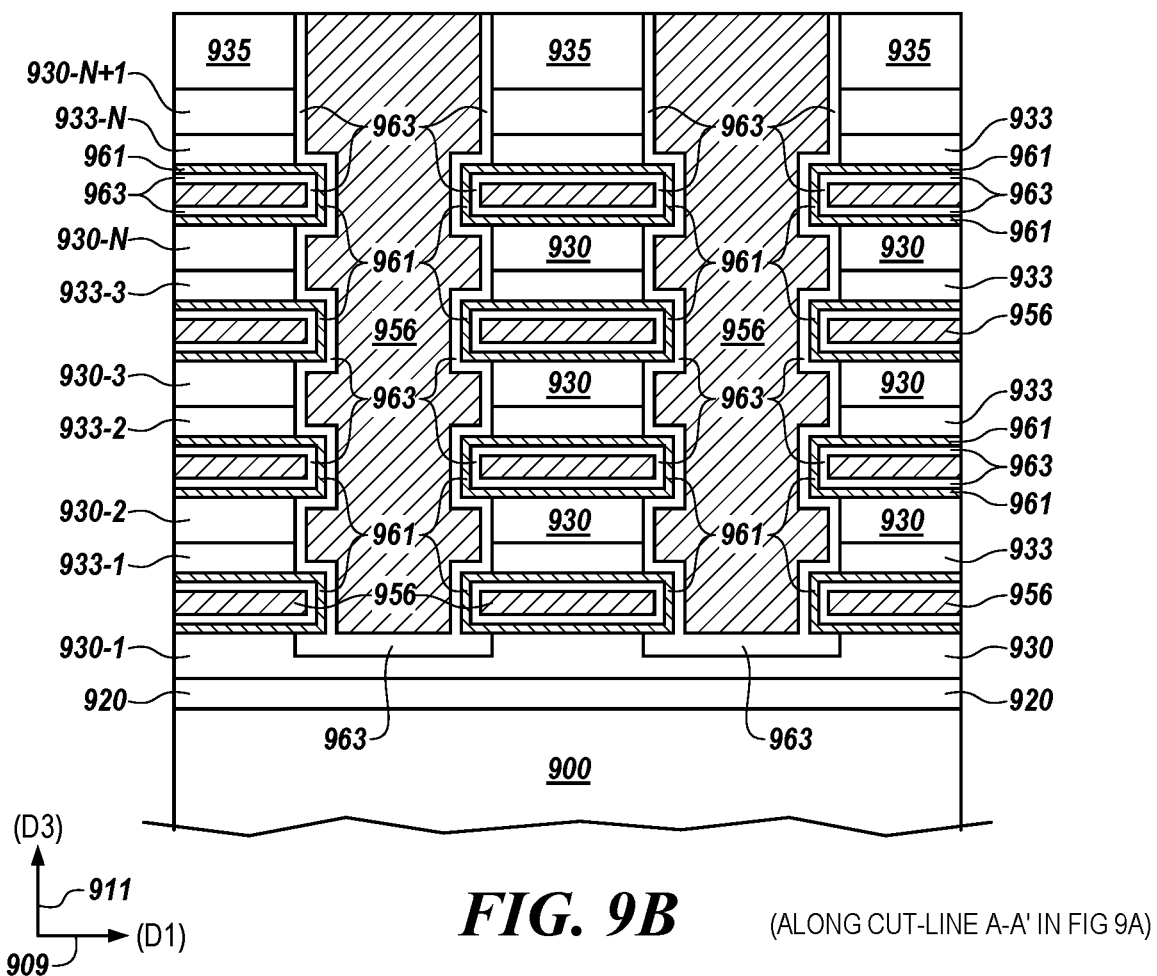
FIG. 9B (ALONG CUT-LINE A-A' IN FIG 9A)

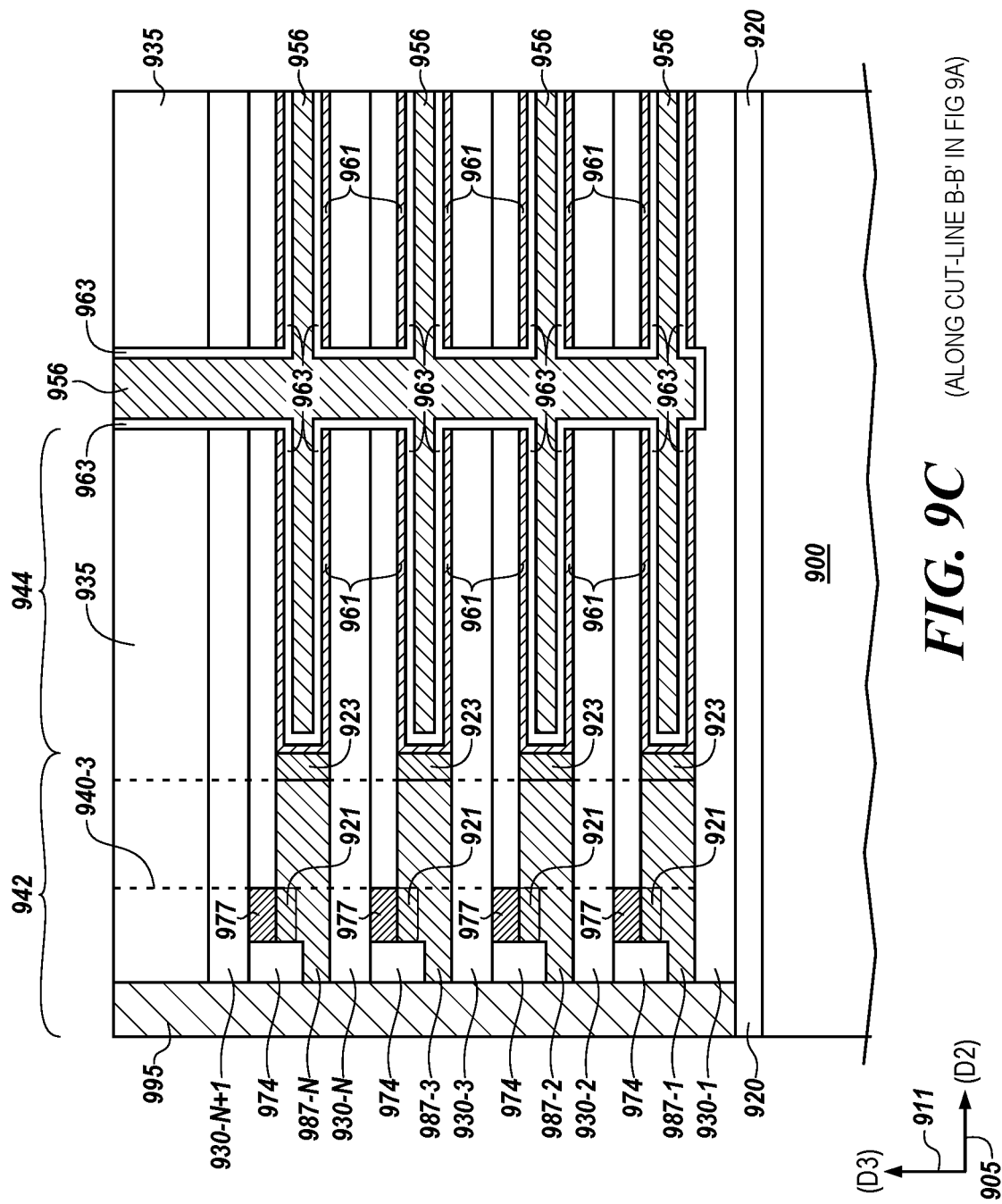
FIG. 9C (ALONG CUT-LINE B-B' IN FIG 9A)

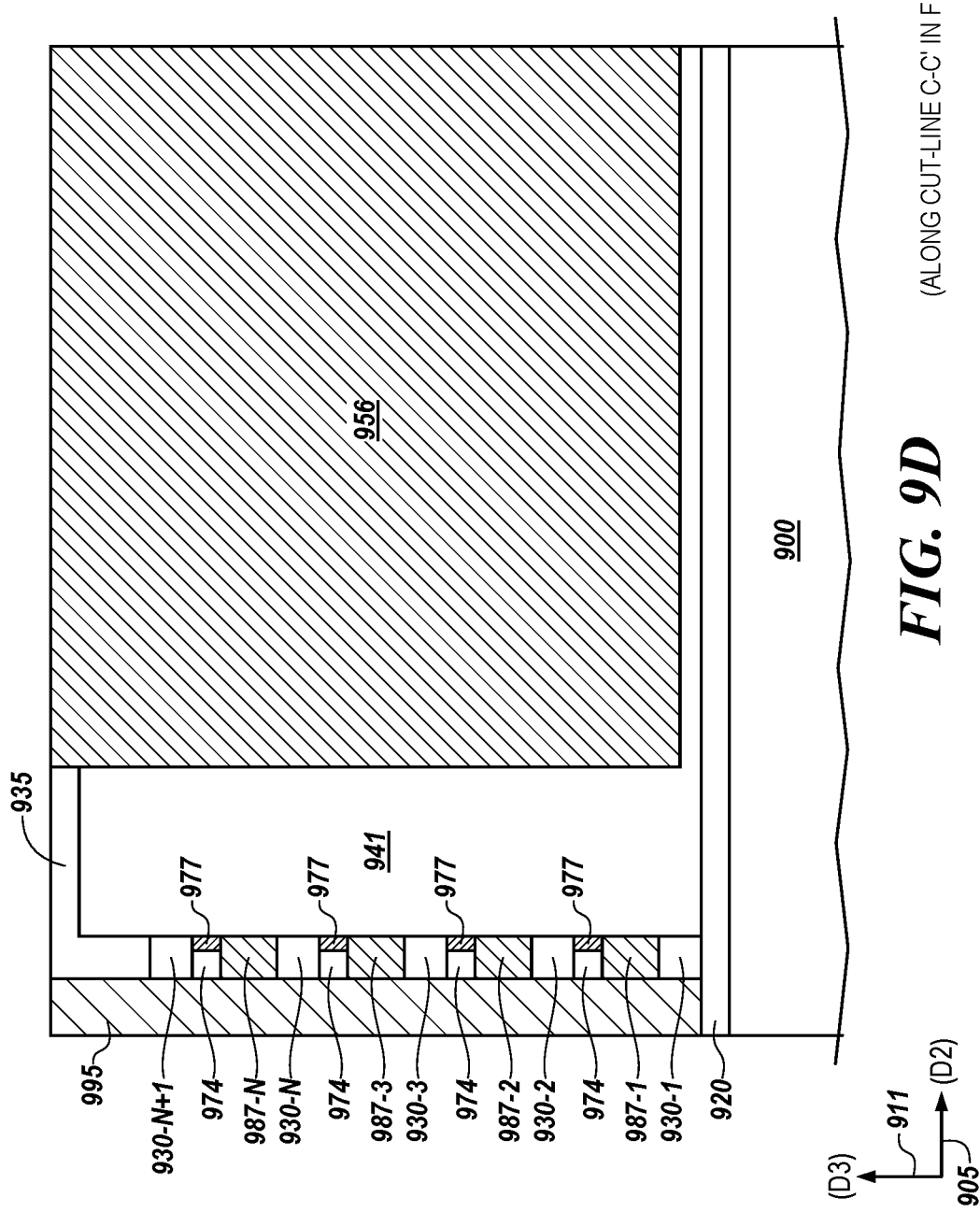

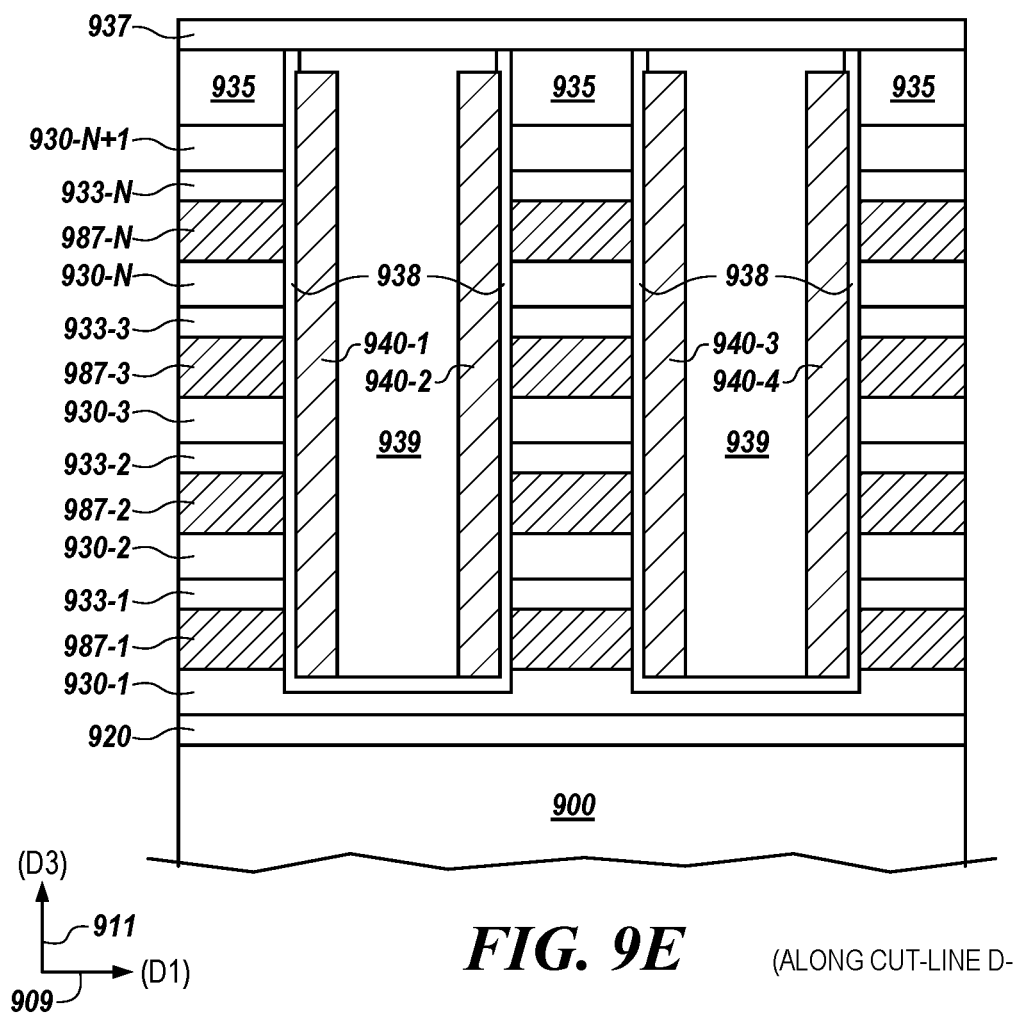
FIG. 9E (ALONG CUT-LINE D-D' IN FIG 9A)

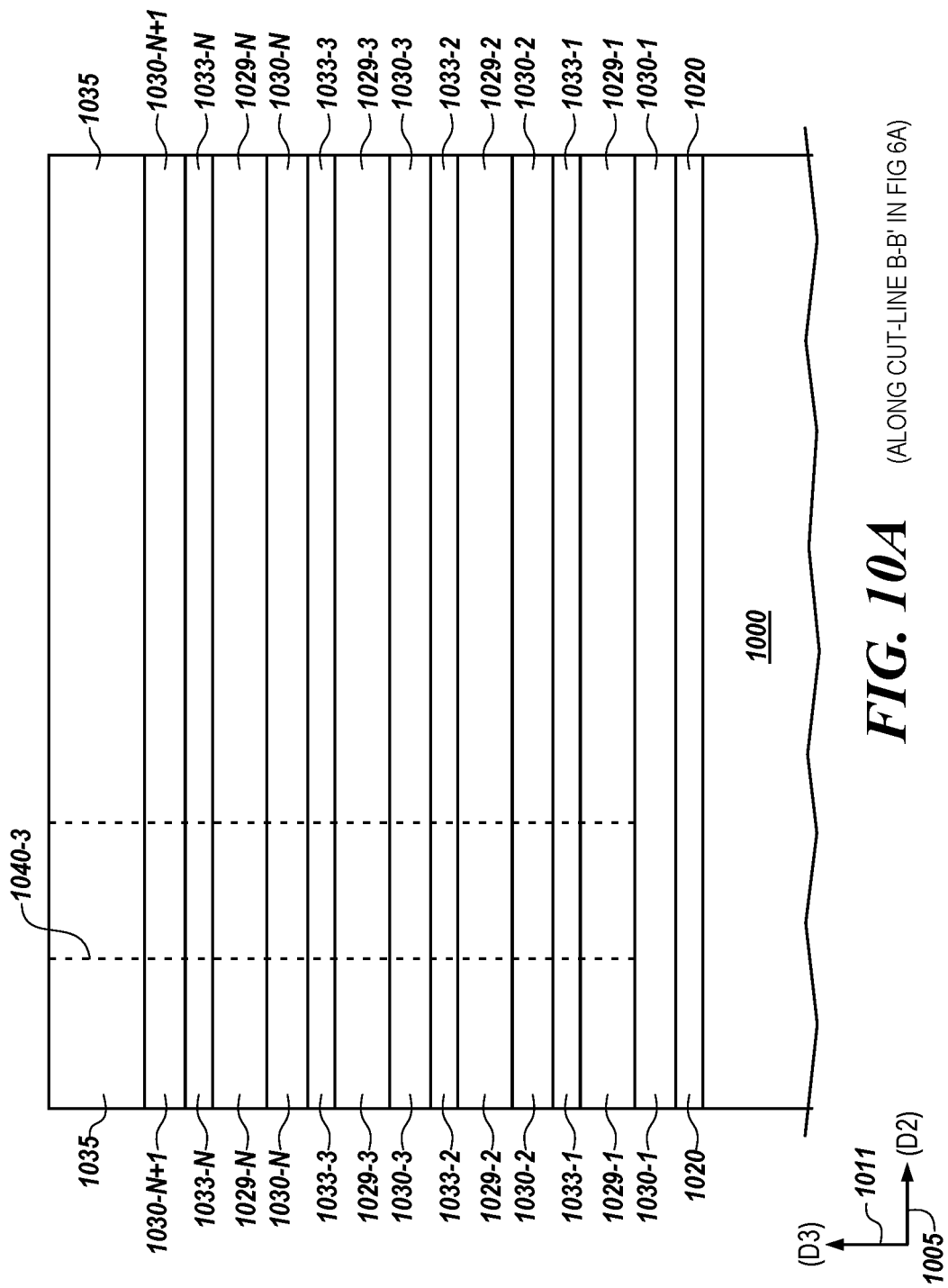
FIG. 10A (ALONG CUT-LINE B-B' IN FIG 6A)

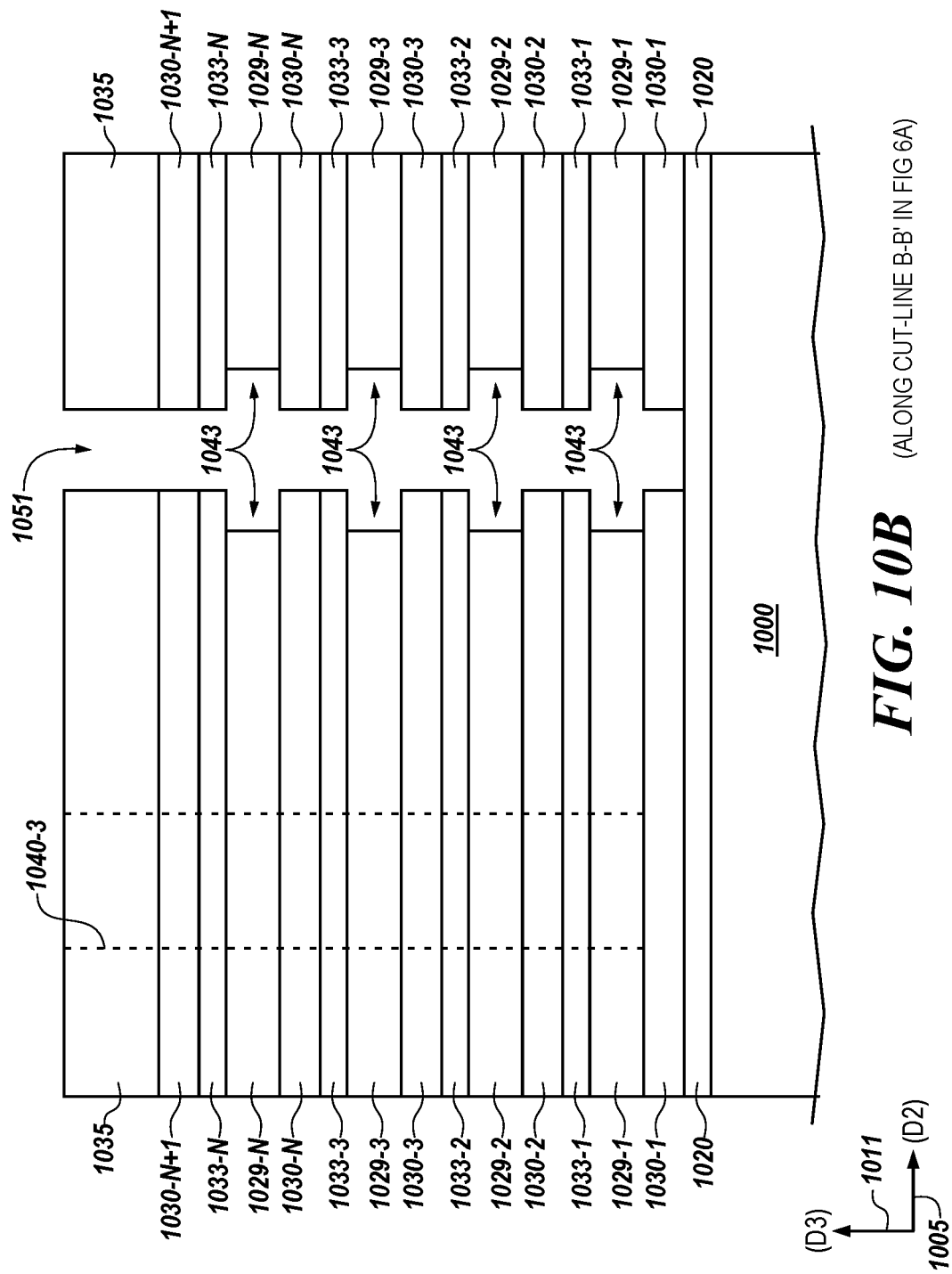
FIG. 10B (ALONG CUT-LINE B-B' IN FIG 6A)

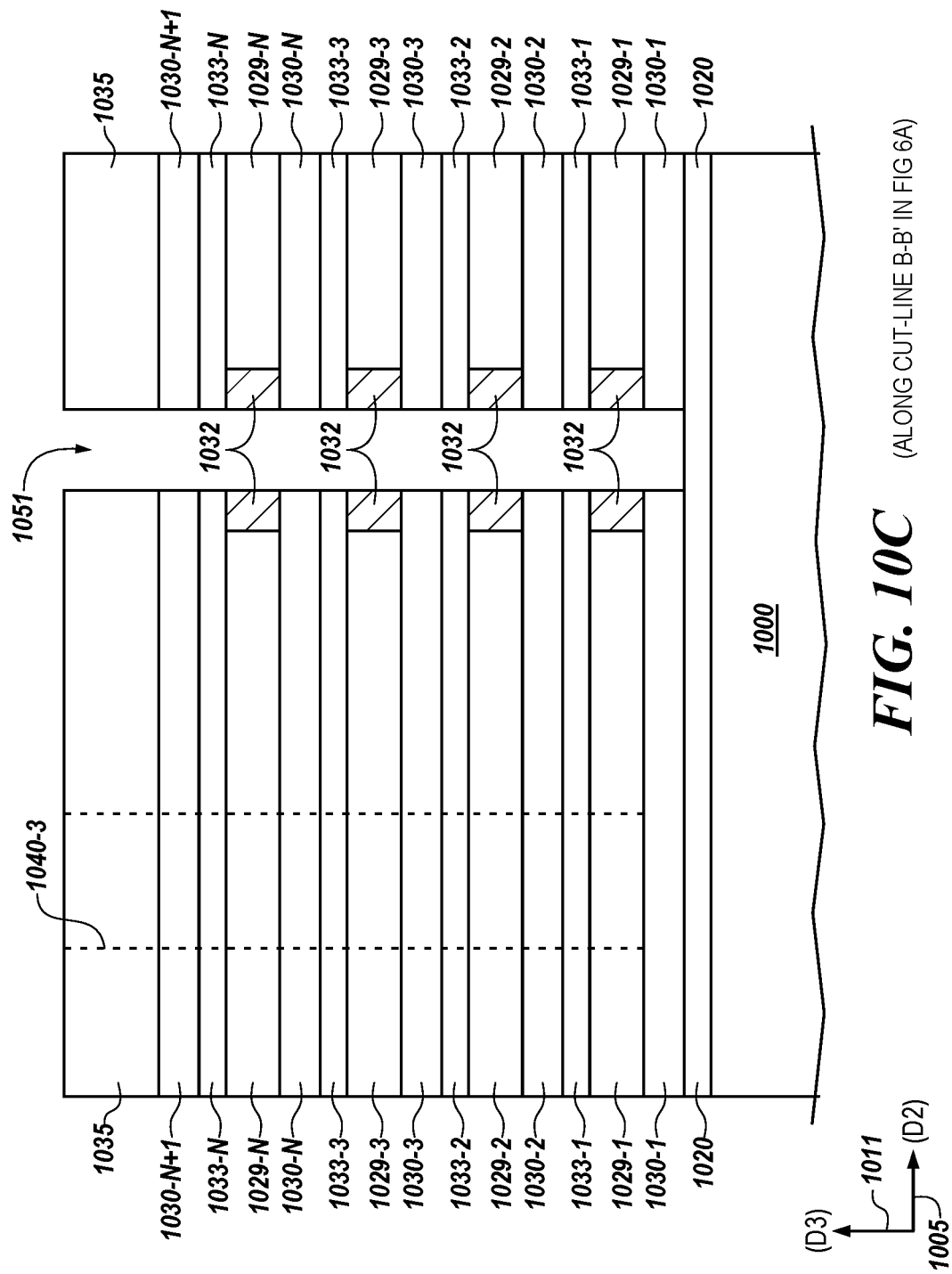
FIG. 10C (ALONG CUT-LINE B-B' IN FIG 6A)

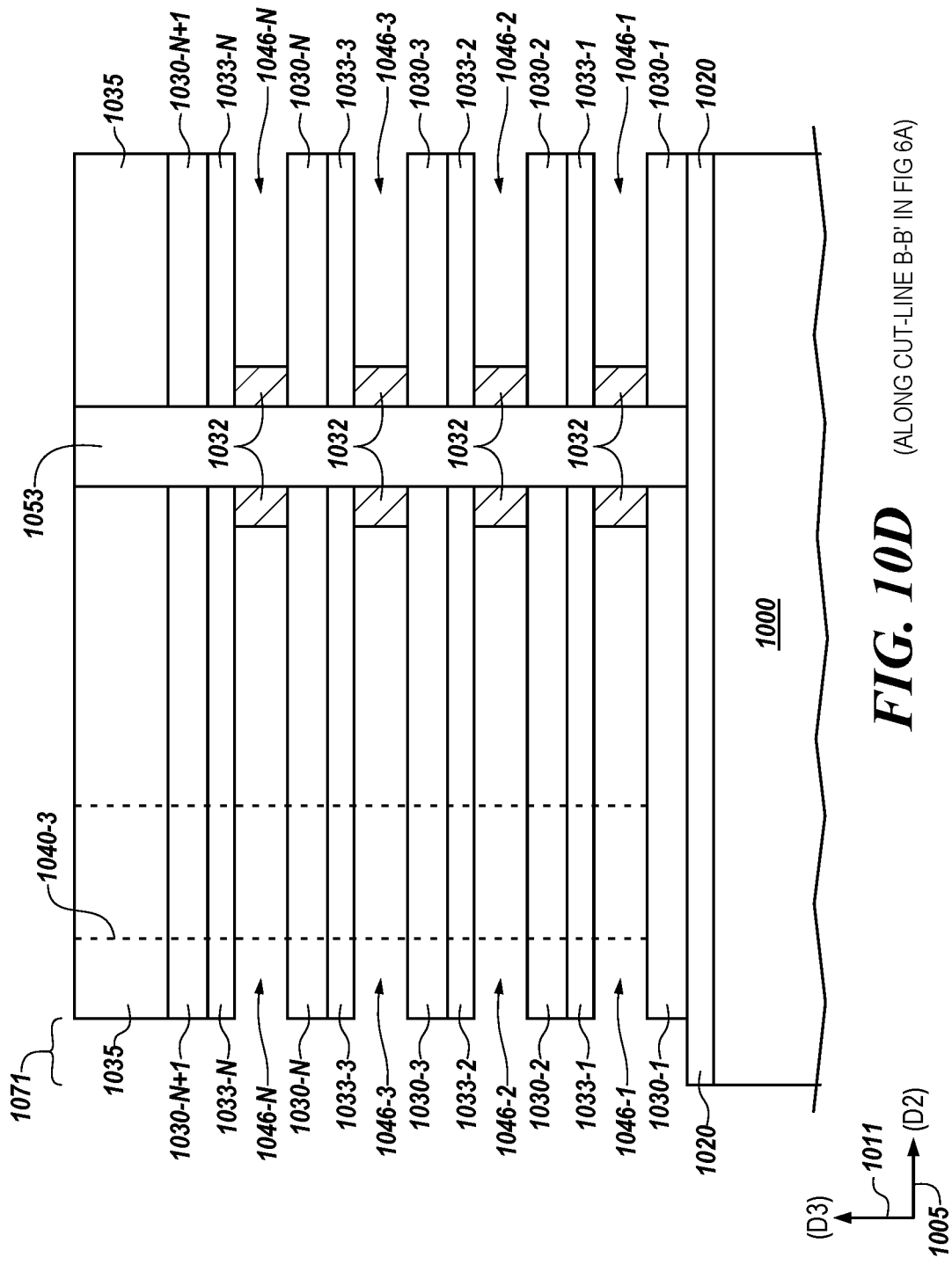
FIG. 10D (ALONG CUT-LINE B-B' IN FIG 6A)

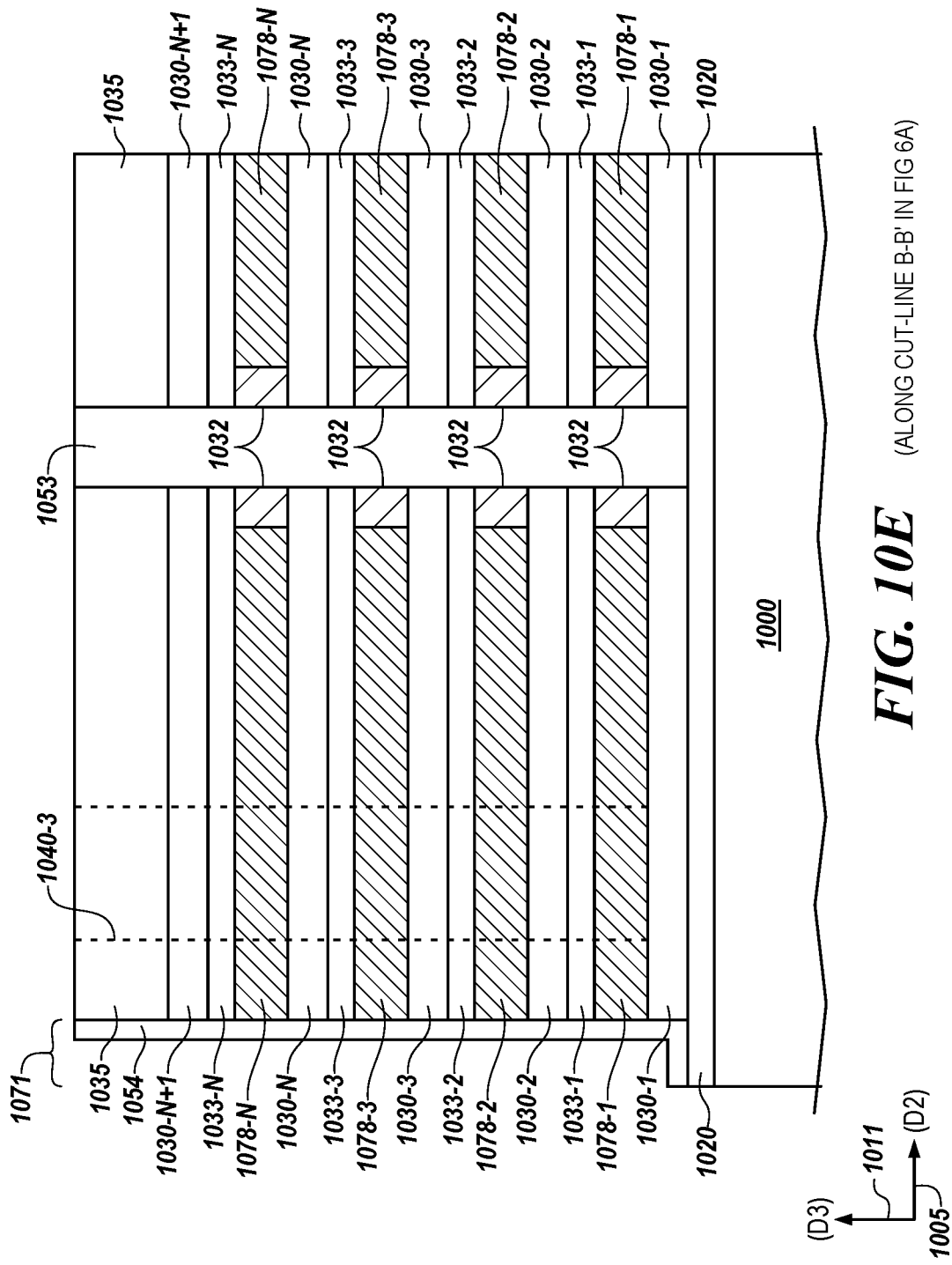
FIG. 10E (ALONG CUT-LINE B-B' IN FIG 6A)

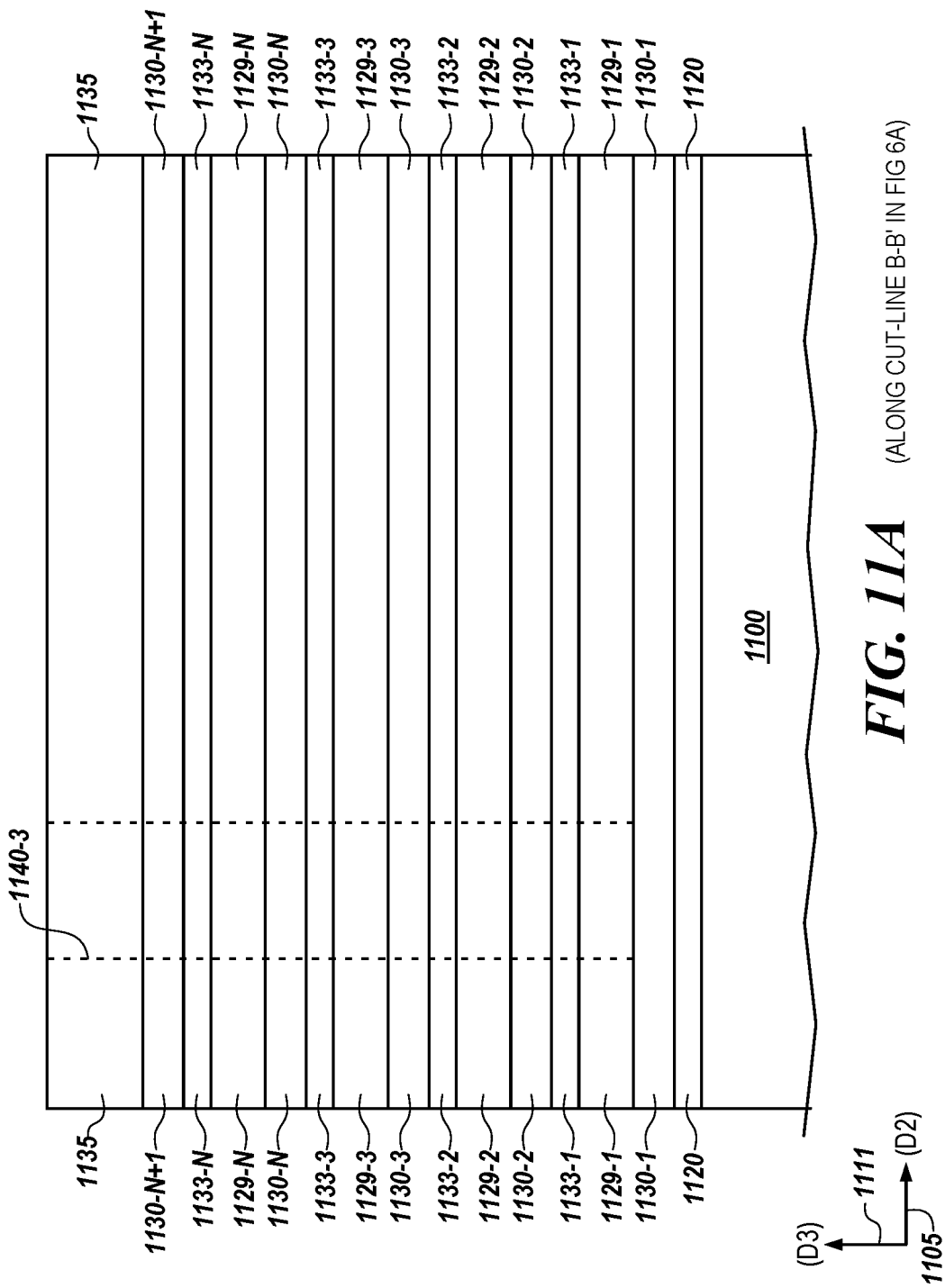
FIG. 11A (ALONG CUT-LINE B-B' IN FIG 6A)

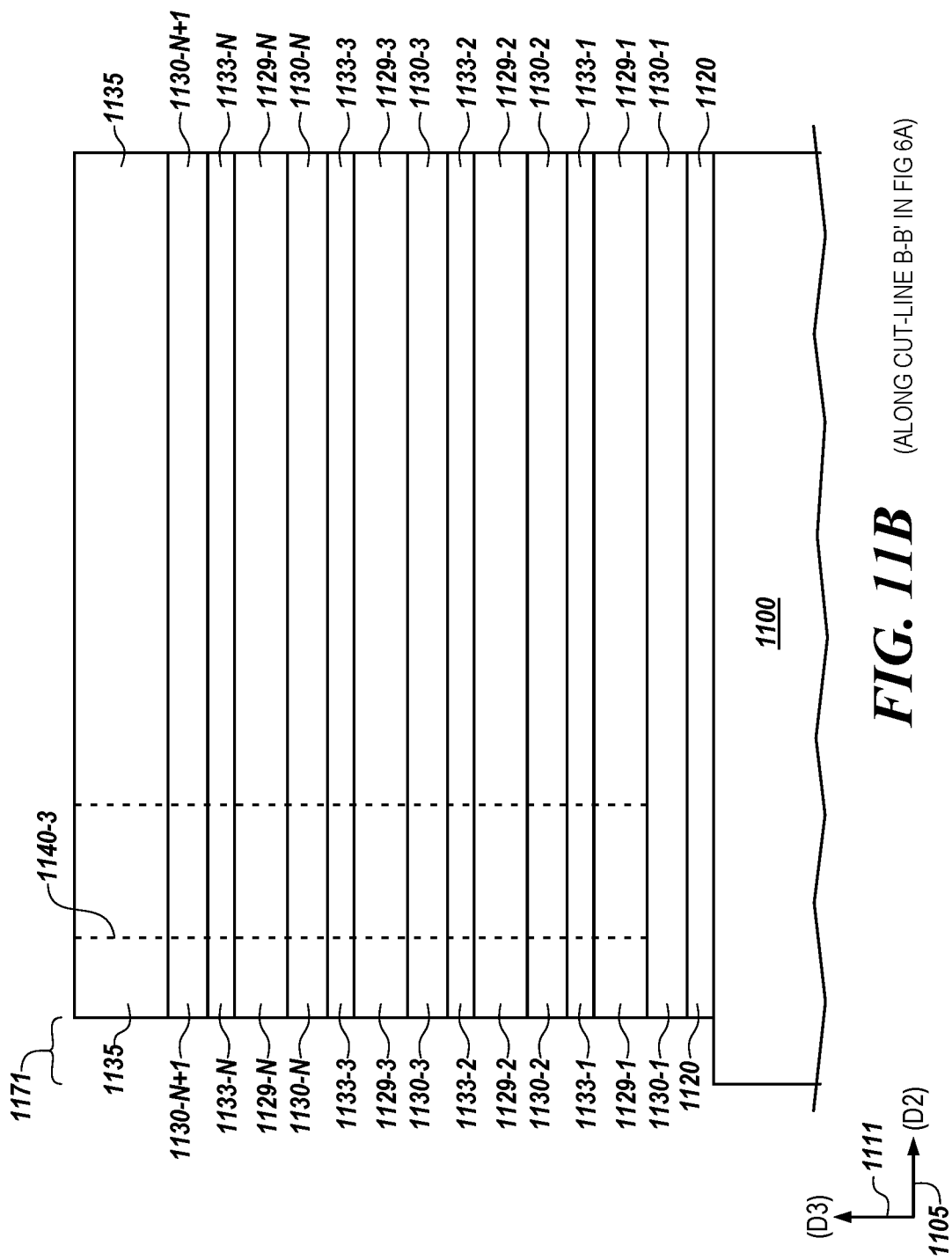
FIG. 11B (ALONG CUT-LINE B-B' IN FIG 6A)

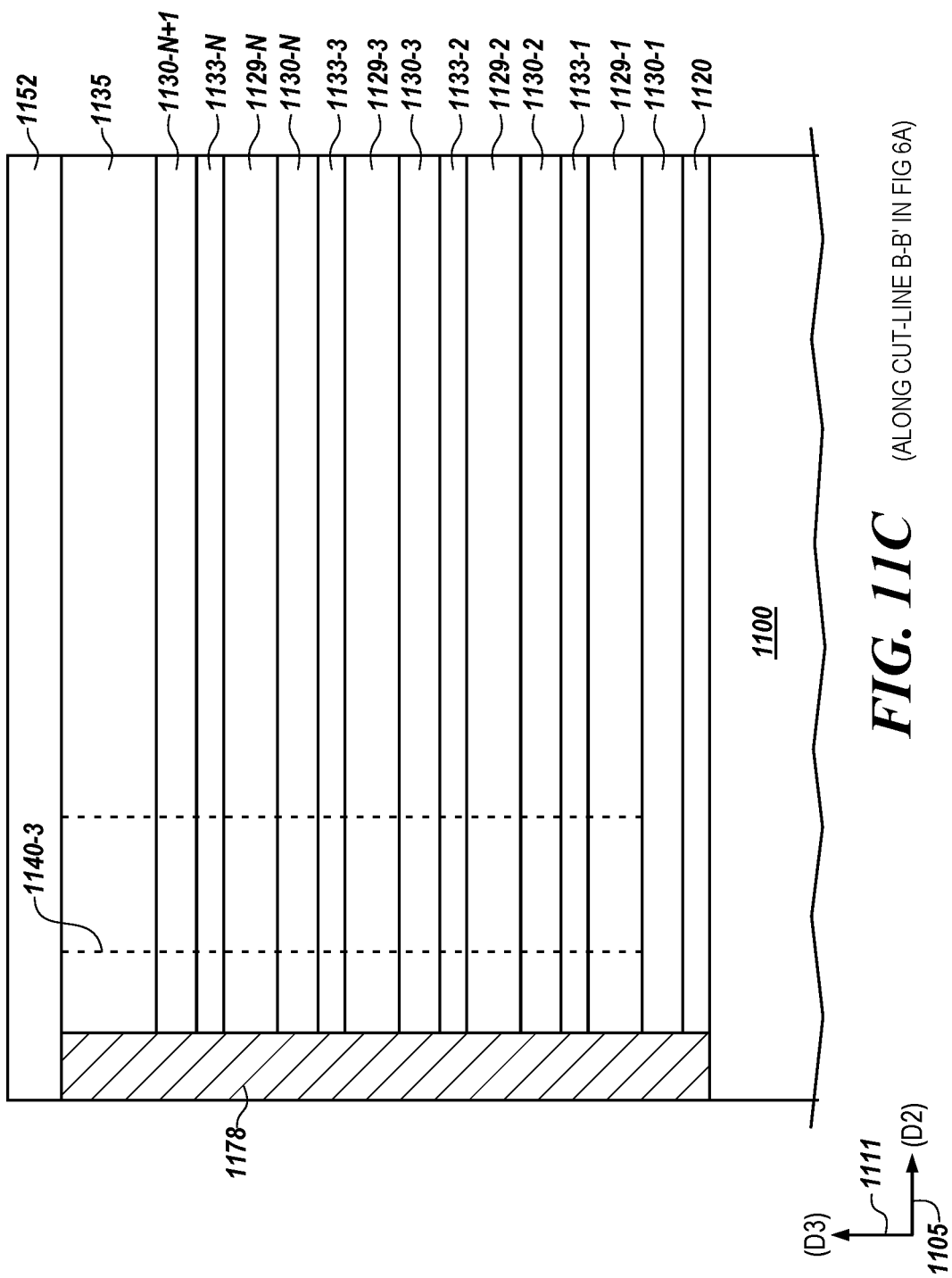
FIG. 11C (ALONG CUT-LINE B-B' IN FIG 6A)

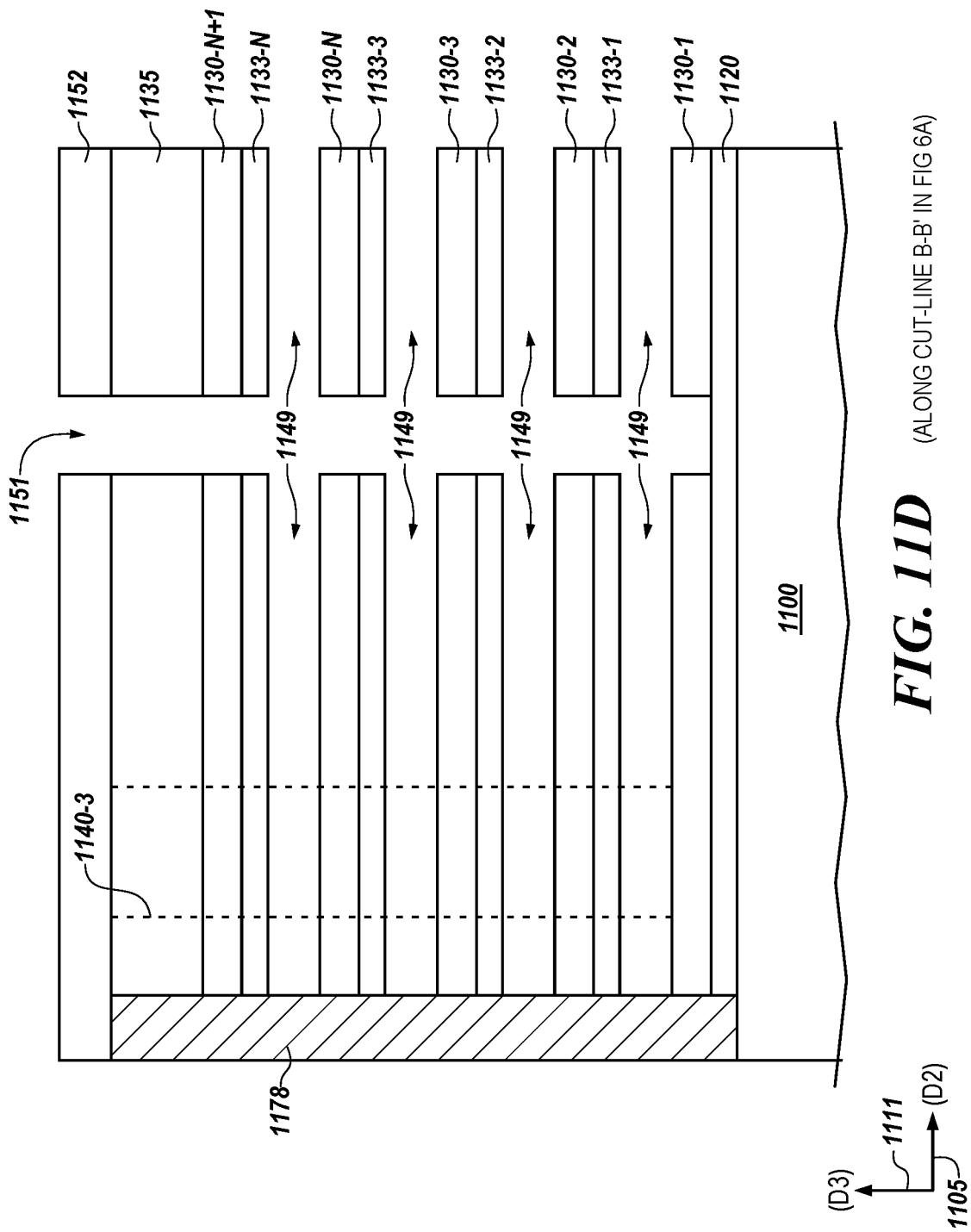
FIG. 11D (ALONG CUT-LINE B-B' IN FIG 6A)

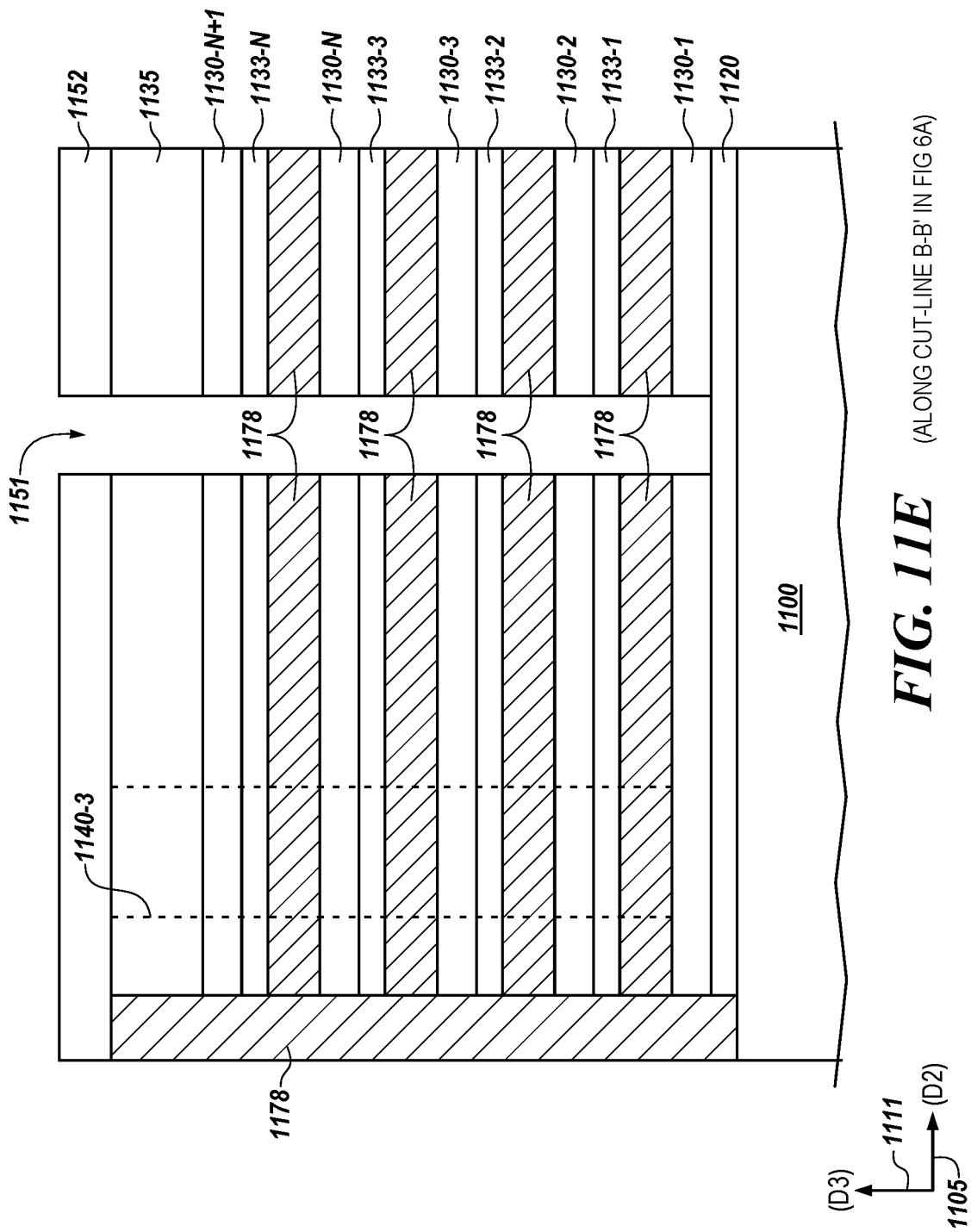
FIG. 11E (ALONG CUT-LINE B-B' IN FIG 6A)

EPITAXIAL SINGLE CRYSTALLINE SILICON GROWTH FOR A HORIZONTAL ACCESS DEVICE

PRIORITY INFORMATION

This application is a Divisional of U.S. patent application Ser. No. 17/035,819, filed on Sep. 29, 2020, the contents of which are incorporated herein by reference.

TECHNICAL FIELD

The present disclosure relates generally to memory devices, and more particularly, to epitaxial single crystalline silicon growth for a horizontal access device.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel and body region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

BRIEF DESCRIPTION OF THE DRAWINGS

FIGS. 5A-5B illustrate an example method, at another stage of a semiconductor fabrication process, for forming arrays of vertically stacked memory cells with epitaxial single crystalline silicon growth for a horizontal access device, in accordance with a number of embodiments of the present disclosure.

FIGS. 6A to 6E illustrate an example method, at another stage of a semiconductor fabrication process, for forming arrays of vertically stacked memory cells with epitaxial single crystalline silicon growth a horizontal access device, in accordance with a number of embodiments of the present disclosure.

FIGS. 7A to 7I illustrate an example method, at another stage of a semiconductor fabrication process, for forming arrays of vertically stacked memory cells with epitaxial single crystalline silicon growth for a horizontal access device, in accordance with a number of embodiments of the present disclosure.

FIGS. 8A to 8E illustrate an example method, at another stage of a semiconductor fabrication process, for forming arrays of vertically stacked memory cells with epitaxial single crystalline silicon growth for a horizontal access device, in accordance with a number of embodiments of the present disclosure.

FIG. 9A-9E illustrate an example method, at another stage of a semiconductor fabrication process, for forming arrays of a semiconductor fabrication process, for forming arrays of vertically stacked memory cells with epitaxial single crystalline silicon growth for a horizontal access device, in accordance with a number of embodiments of the present disclosure.

FIG. 10A-10E illustrate an example method, at another stage of a semiconductor fabrication process, for forming arrays of vertically stacked memory cells for epitaxial single crystalline silicon growth for a horizontal access device, in accordance with a number of embodiments of the present disclosure.

FIG. 11A-11E illustrate an example method, at another stage of a semiconductor fabrication process, for forming arrays of vertically stacked memory cells for epitaxial single crystalline silicon growth for a horizontal access device, in accordance with a number of embodiments of the present disclosure.

DETAILED DESCRIPTION

Figure 1:
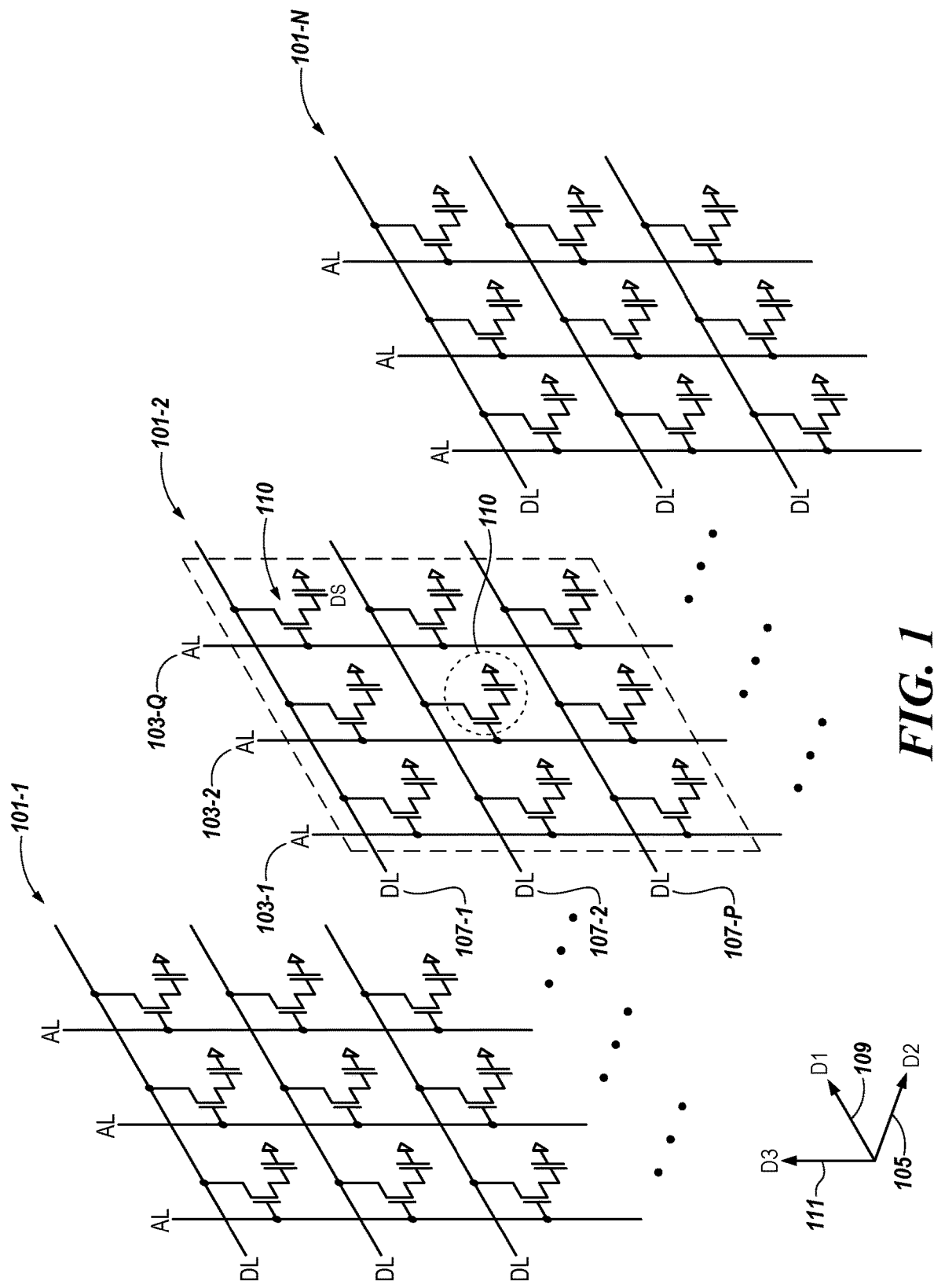
FIG. 1 is a schematic illustration of a vertical three dimensional (3D) memory, in accordance a number of embodiments of the present disclosure.

Embodiments of the present disclosure describe epitaxial single crystalline silicon growth for semiconductor devices. A channel is epitaxially grown from a polysilicon seed material and integrated into horizontal access devices in an array of vertically stacked memory cells. The horizontal access devices are integrated with vertically oriented access lines and integrated with horizontally oriented digit lines. The channel may provide improved electron mobility due to the increased grain size of the silicon material in the channel and a decreased density in the grain boundary. The decreased grain boundary density may also decrease the electron hole pair generation and decrease the value of the off current (Ioff). This may decrease the anneal process time in comparison to other processes not disclosed herein.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

FIG. 1 is a block diagram of an apparatus in accordance a number of embodiments of the present disclosure. FIG. 1 illustrates a circuit diagram showing a cell array of a three dimensional (3D) semiconductor memory device according to embodiments of the present disclosure. FIG. 1 illustrates a cell array may have a plurality of sub cell arrays 101-1, 101-2, ..., 101-N. The sub cell arrays 101-1, 101-2, ..., 101-N may be arranged along a second direction (D2) 105. Each of the sub cell arrays, e.g., sub cell array 101-2, may include a plurality of access lines 103-1, 103-2, ..., 103-Q (which also may be referred to a word lines). Also, each of the sub cell arrays, e.g., sub cell array 101-2, may include a plurality of digit lines 107-1, 107-2, ..., 107-P (which also may be referred to as bit lines, data lines, or sense lines). In FIG. 1, the digit lines 107-1, 107-2, ..., 107-P are illustrated extending in a first direction (D1) 109 and the access lines 103-1, 103-2, ..., 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the access lines 103-1, 103-2, ..., 103-Q are extending in a vertical direction, e.g., third direction (D3) 111.

A memory cell, e.g., 110, may include an access device, e.g., access transistor, and a storage node, e.g., storage capacitor, located at an intersection of each access line 103-1, 103-2, ..., 103-Q and each digit line 107-1, 107-2, ..., 107-P. By way of example, and not by way of limitation, a storage node may include conductive material, such as ferroelectric material. The ferroelectric material may include, but is not limited to, zirconium oxide ($ZrO_2$), hafnium oxide ($HfO_2$), lanthanum oxide ($LaO_2$), and aluminum oxide ($Al_2O_3$), or a combination thereof. Memory cells may be written to, or read from, using the access lines 103-1, 103-2, ..., 103-Q and digit lines 107-1, 107-2, ..., 107-P. The digit lines 107-1, 107-2, ..., 107-P may conductively interconnect memory cells along horizontal columns of each sub cell array 101-, 101-2, ..., 101-N, and the access lines 103-1, 103-2, ..., 103-Q may conductively interconnect memory cells along vertical rows of each sub cell array 101-1, 101-2, ..., 101-N. One memory cell, e.g. 110, may be located between one access line, e.g., 103-2, and one digit line, e.g., 107-2. Each memory cell may be uniquely addressed through a combination of an access line 103-1, 103-2, ..., 103-Q and a digit line 107-1, 107-2, ..., 107-P.

The digit lines 107-1, 107-2, ..., 107-P may be or include conducting patterns (e.g., metal lines) disposed on and spaced apart from a substrate. The digit lines 107-1, 107-2, ..., 107-P may extend in a first direction (D1) 109. The digit lines 107-1, 107-2, ..., 107-P in one sub cell array, e.g., 101-2, may be spaced apart from each other in a vertical direction, e.g., in a third direction (D3) 111.

The access lines 103-1, 103-2, ..., 103-Q may be or include conductive patterns (e.g., metal lines) extending in a vertical direction with respect to the substrate, e.g., in a third direction (D3) 111. The access lines in one sub cell array, e.g., 101-2, may be spaced apart from each other in the first direction (D1) 109.

A gate of a memory cell, e.g., memory cell 110, may be connected to an access line, e.g., 103-2, and a first conductive node, e.g., first source/drain region, of an access device, e.g., transistor, of the memory cell 110 may be connected to a digit line, e.g., 107-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

Figure 2:
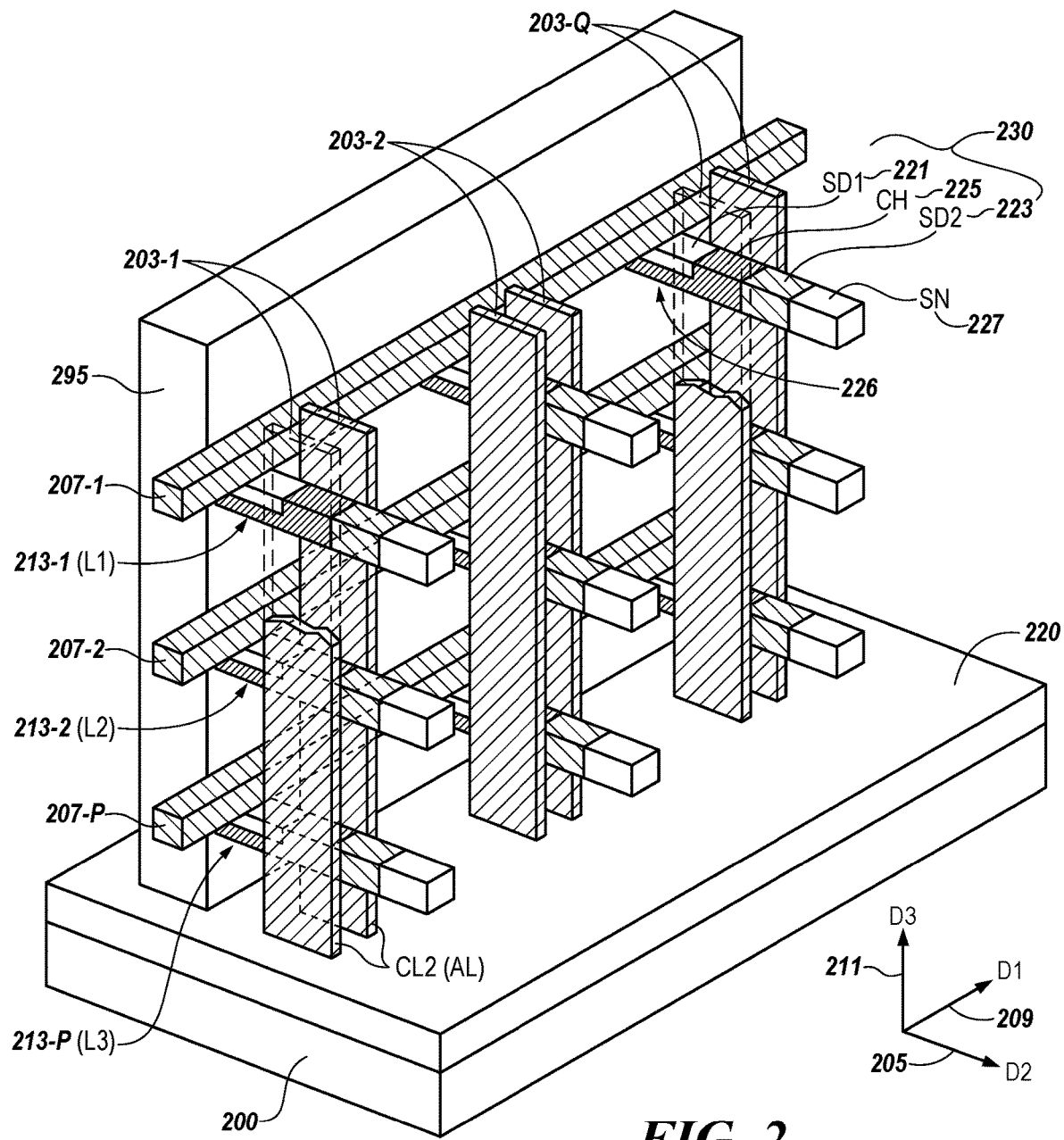
FIG. 2 is a perspective view illustrating a channel and body region of a three-node access device for semiconductor devices, in accordance with a number of embodiments of the present disclosure.
Figure 3:
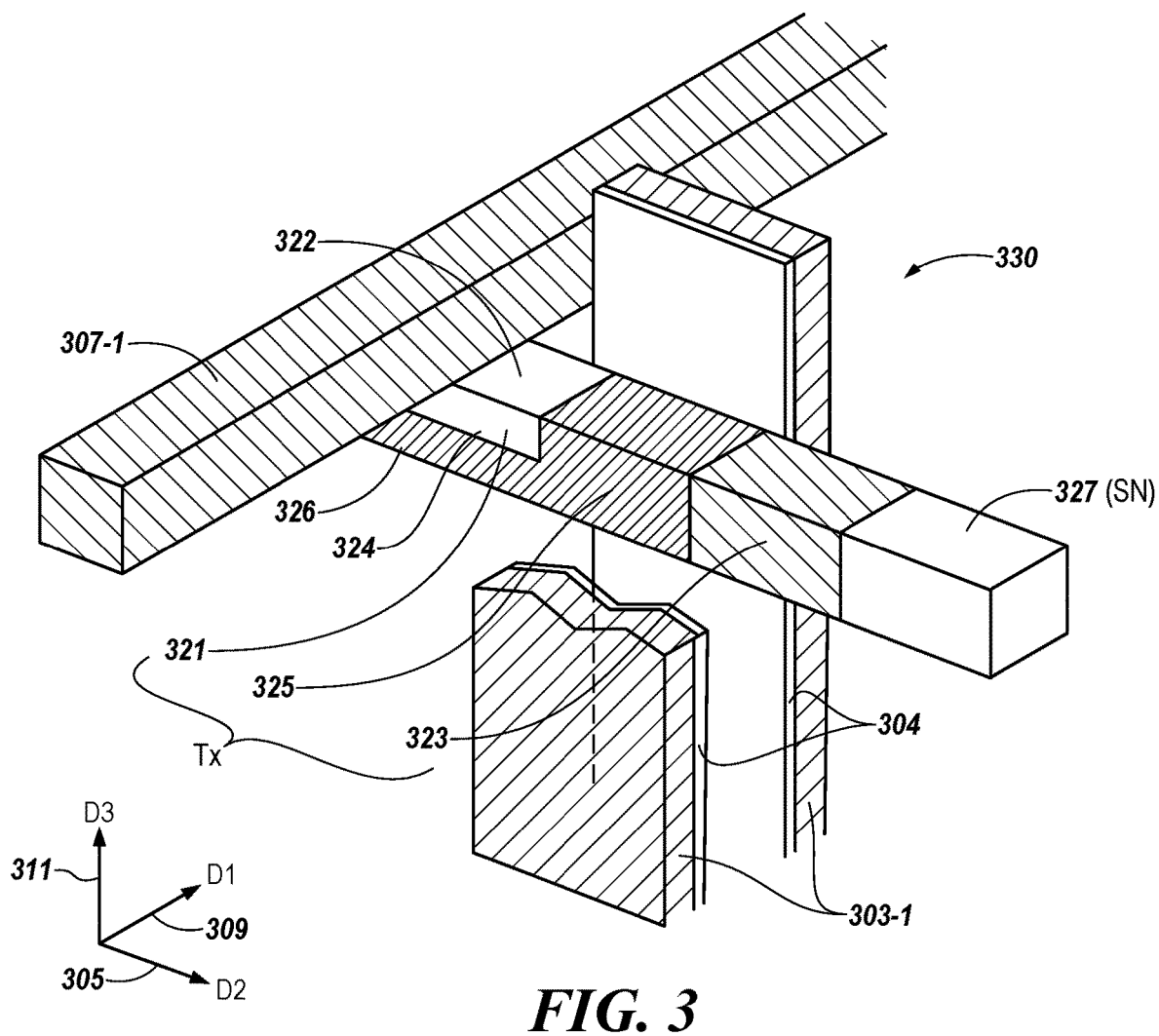
FIG. 3 is a perspective view illustrating a channel and body region of a three-node access device for semiconductor devices, in accordance with a number of embodiments of the present disclosure.

FIG. 2 illustrates a perspective view showing a three dimensional (3D) semiconductor memory device, e.g., a portion of a sub cell array 101-2 shown in FIG. 1 as a vertically oriented stack of memory cells in an array, according to some embodiments of the present disclosure. FIG. 3 illustrates a perspective view showing unit cell, e.g., memory cell 110 shown in FIG. 1, of the 3D semiconductor memory device shown in FIG. 2.

As shown in FIG. 2, a substrate 200 may have formed thereon one of the plurality of sub cell arrays, e.g., 101-2, described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells, e.g., memory cell 110 in FIG. 1, extending in a vertical direction, e.g., third direction (D3) 111. According to some embodiments the vertically oriented stack of memory cells may be fabricated such that each memory cell, e.g., memory cell 110 in FIG. 1, is formed on plurality of vertical levels, e.g., a first level (L1), a second level (L2), and a third level (L3). The repeating, vertical levels, L1, L2, and L3, may be arranged, e.g., "stacked", in a vertical direction, e.g., third direction (D3) 111 shown in FIG. 1, and separated from the substrate 200 by an insulator material 220. Each of the repeating, vertical levels, L1, L2, and L3 may include a plurality of discrete components, e.g., regions, to the laterally oriented access devices 230, e.g., transistors, and storage nodes, e.g., capacitors, including access line 203-1, 203-2, ..., 203-Q connections and digit line 207-1, 207-2, ..., 207-P connections. The plurality of discrete components to the laterally oriented access devices 230, e.g., transistors, may be formed in a plurality of iterations of vertically, repeating layers within each level, as described in more detail below in connection with FIGS. 7A-7I and 8A-8E and may extend horizontally in the second direction (D2) 205, analogous to second direction (D2) 105 shown in FIG. 1.

The plurality of discrete components to the laterally oriented access devices 230, e.g., transistors, may include a first source/drain region 221 and a second source/drain region 223 separated by a channel and body region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include Phosphorous (P) atoms and the p-type dopant may include atoms of Boron (B) formed in an oppositely doped body region of polysilicon semiconductor material. Embodiments, however, are not limited to these examples.

The storage node 227, e.g., capacitor, may be connected to one respective end of the access device. As shown in FIG. 2, the storage node 227, e.g., capacitor may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1, may similarly extend in the second direction (D2) 205, analogous to second direction (D2) 105 shown in FIG. 1.

As shown in FIG. 2 a plurality of horizontally oriented digit lines 207-1, 207-2, . . . , 207-P extend in the first direction (D1) 209, analogous to the first direction (D1) 109 in FIG. 1. The plurality of horizontally oriented digit lines 207-1, 207-2, . . . , 207-P may be analogous to the digit lines 107-1, 107-2, . . . , 107-P shown in FIG. 1. The plurality of horizontally oriented digit lines 207-1, 207-2, . . . , 207-P may be arranged, e.g., "stacked", along the third direction (D3) 211. The plurality of horizontally oriented digit lines 207-1, 207-2, . . . , 207-P may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), etc., and/or a metal-semiconductor compound, e.g., tungsten silicide, cobalt silicide, silver silicide, titanium silicide, etc. Embodiments, however, are not limited to these examples.

Among each of the vertical levels, (L1) 213-1, (L2) 213-2, and (L3) 213-M, the horizontally oriented memory cells, e.g., memory cell 110 in FIG. 1, may be spaced apart from one another horizontally in the first direction (D1) 209. However, as described in more detail below in connection with FIGS. 4A-4E, the plurality of discrete components to the laterally oriented access devices 230, e.g., first source/drain region 221 and second source/drain region 223 separated by a channel and body region 225, extending laterally in the second direction (D2) 205, and the plurality of horizontally oriented digit lines 207-1, 207-2, . . . , 207-P extending laterally in the first direction (D1) 209, may be formed within different vertical layers within each level. For example, the plurality of horizontally oriented digit lines 207-1, 207-2, . . . , 207-P, extending in the first direction (D1) 209, may be disposed on, and in electrical contact with, top surfaces of first source/drain regions 221 and orthogonal to laterally oriented access devices 230, e.g., transistors, extending laterally in the second direction (D2) 205. In some embodiments, the plurality of horizontally oriented digit lines 207-1, 207-2, . . . , 207-P, extending in the first direction (D1) 209 are formed in a higher vertical layer, farther from the substrate 200, within a level, e.g., within level (L1), than a layer in which the discrete components, e.g., first source/drain region 221 and second source/drain region 223 separated by a channel and body region 225, of the laterally oriented access device are formed. In some embodiments, the plurality of horizontally oriented digit lines 207-1, 207-2, . . . , 207-P, extending in the first direction (D1) 209, may be connected to the top surfaces of the first source/drain regions 221 directly and/or through additional contacts including metal silicides.

As shown in the example embodiment of FIG. 2, the access lines, 203-1, 203-2, . . . , 203-Q, extend in a vertical direction with respect to the substrate 200, e.g., in a third direction (D3) 211. Further, as shown in FIG. 2, the access lines, 203-1, 203-2, . . . , 203-Q, in one sub cell array, e.g., sub cell array 101-2 in FIG. 1, may be spaced apart from each other in the first direction (D1) 209. The access lines, 203-1, 203-2, . . . , 203-Q, may be provided, extending vertically relative to the substrate 200 in the third direction (D3) 211 between a pair of the laterally oriented access devices 230, e.g., transistors, extending laterally in the second direction (D2) 205, but adjacent to each other on a level, e.g., first level (L1), in the first direction (D1) 209. Each of the access lines, 203-1, 203-2, . . . , 203-Q, may vertically extend, in the third direction (D3) 211, on sidewalls of respective ones of the plurality of laterally oriented access devices 230, e.g., transistors, that are vertically stacked.

For example, and as shown in more detail in FIG. 3, a first one of the vertically extending access lines, e.g., 203-1, may be adjacent a sidewall of a channel and body region 225 to a first one of the laterally oriented access devices 230, e.g., transistors, in the first level (L1) 213-1, a sidewall of a channel and body region 225 of a first one of the laterally oriented access devices 230, e.g., transistors, in the second level (L2) 213-2, and a sidewall of a channel and body region 225 of a first one of the laterally oriented access devices 230, e.g., transistors, in the third level (L3) 213-M, etc. Similarly, a second one of the vertically extending access lines, e.g., 203-2, may be adjacent a sidewall to a channel and body region 225 of a second one of the laterally oriented access devices 230, e.g., transistors, in the first level (L1) 213-1, spaced apart from the first one of laterally oriented access devices 230, e.g., transistors, in the first level (L1) 213-1 in the first direction (D1) 209. And the second one of the vertically extending access lines, e.g., 203-2, may be adjacent a sidewall of a channel and body region 225 of a second one of the laterally oriented access devices 230, e.g., transistors, in the second level (L2) 213-2, and a sidewall of a channel and body region 225 of a second one of the laterally oriented access devices 230, e.g., transistors, in the third level (L3) 213-M, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 1.

As shown in the example embodiment of FIG. 2, a conductive body contact 250 may be formed extending in the first direction (D1) 209 along an end surface of the laterally oriented access devices 230, e.g., transistors, in each level (L1) 213-1, (L2) 213-2, and (L3) 213-M above the substrate 200. The body contact 250 may be connected to a body 226, e.g., body region, of the laterally oriented access devices 230, e.g., transistors, in each memory cell, e.g., memory cell 110 in FIG. 1. The body contact 250 may include a conductive material such as, for example, one of a doped semiconductor material, a conductive metal nitride, metal, and/or a metal-semiconductor compound.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3, the first and the second source/drain regions, 321 and 323, may be impurity doped regions to the laterally oriented access devices 330, e.g., transistors. The first and the second source/drain regions, 321 and 323, may be analogous to the first and the second source/drain regions 221 and 223 shown in FIG. 2. The first and the second source/drain regions, 321 and 323 may be separated by a channel and body region 325 formed in a body of semiconductor material, e.g., body region 326, of the laterally oriented access devices 330, e.g., transistors. The first and the second source/drain regions, 321 and 323, may be formed from an n-type or p-type dopant doped in the body region 326. Embodiments are not so limited.

For example, for an n-type conductivity transistor construction, the body region 326 of the laterally oriented access devices 330, e.g., transistors, may be formed of a low doped (p−) p-type semiconductor material. In one embodiment, the body region 326 and the channel 325 separating the first and the second source/drain regions, 321 and 323, may include a low doped, p-type (e.g., low dopant concentration (p−)) polysilicon material consisting of Boron (B) atoms as an impurity dopant to the polycrystalline silicon. In this example, the first and the second source/drain regions, 321 and 321, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of Phosphorus (P) atoms deposited therein. Embodiments, however, are not limited to this example. In other embodiments, the laterally oriented access devices 330, e.g., transistors, may be of a p-type conductivity construction in which case the impurity, e.g., dopant, conductivity types would be reversed.

As shown in the example embodiment of FIG. 3, the first source/drain region 321 may occupy an upper portion in the body 326 of the laterally oriented access devices 330, e.g., transistors. For example, the first source/drain region 321 may have a bottom surface 324 within the body 326 of the laterally oriented access device 330 which is located higher, vertically in the third direction (D3) 311, than a bottom surface of the body 326 of the laterally, horizontally oriented access device 330. As such, the laterally, horizontally oriented transistor 330 may have a body portion 326 which is below the first source/drain region 321 and is in electrical contact with the body contact, e.g., 250 shown in FIG. 2. Further, as shown in the example embodiment of FIG. 3, a digit line, e.g., 307-1, analogous to the digit lines 207-1, 207-2, . . . , 207-P in FIGS. 2 and 107-1, 107-2, . . . , 107-P shown in FIG. 1, may be disposed on a top surface 322 of the first source/drain region 321 and electrically coupled thereto.

As shown in the example embodiment of FIG. 3, an access line, e.g., 303-1, analogous to the access lines 203-1, 203-2, . . . , 203-Q in FIGS. 2 and 103-1, 103-2, . . . , 103-Q in FIG. 1, may be vertically extending in the third direction (D3) 311 adjacent the sidewall of the channel region 325 portion of the body 326 to the laterally oriented access devices 330, e.g., transistors horizontally conducting between the first and the second source/drain regions 321 and 323 along the second direction (D2) 305. A gate dielectric material 304 may be interposed between the access line 303-1 (a portion thereof forming a gate to the laterally oriented access devices 330, e.g., transistors) and the channel region 325. The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4:
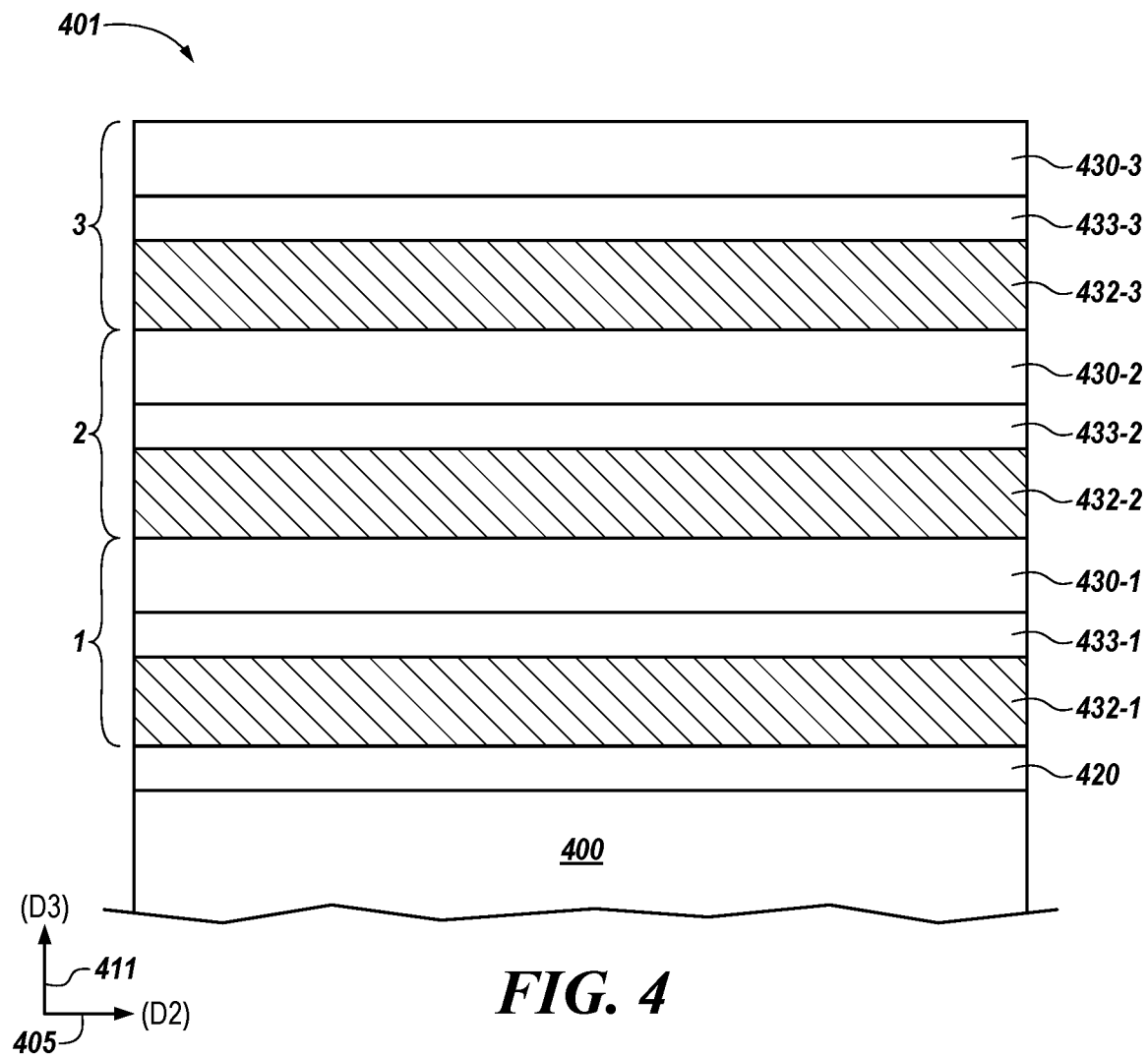
FIG. 4 is a cross-sectional view of an example method for forming arrays of vertically stacked memory cells, at one stage of a semiconductor fabrication process, with epitaxial single crystalline silicon growth for a horizontal access device, in accordance with a number of embodiments of the present disclosure.

FIG. 4 is a cross-sectional view for an example method for forming arrays of vertically stacked memory cells, at one stage of a semiconductor fabrication process, with epitaxial single crystalline silicon growth for a horizontal access device, in accordance with a number of embodiments of the present disclosure.

In the example embodiment shown in FIG. 4, the method comprises depositing alternating layers of a first dielectric material, 430-1, 430-2, . . . , 430-N (collectively referred to as first dielectric material 430), a semiconductor material, 432-1, 432-2, . . . , 432-N (collectively referred to as semiconductor material 432), and a second dielectric material, 433-1, 433-2, . . . , 433-N (collectively referred to as second dielectric 433), in repeating iterations to form a vertical stack 401 on an insulator material 420 and a working surface of a semiconductor substrate 400. In some embodiments, at least two (2) repeating iterations of the vertical stack 401 may be formed to form the vertical stack 401 to a height in a range of twenty (20) nm to three hundred (300) nm. In some embodiments, the first dielectric material 430, the semiconductor material 432, and the second dielectric material 433 may be deposited using a chemical vapor deposition (CVD) process. In one embodiment, the first dielectric material 430 can be deposited to have a thickness, e.g., vertical height in the third direction (D3), in a range of twenty (20) nanometers (nm) to sixty (60) nm. In one embodiment, the semiconductor material 432 can be deposited to have a thickness, e.g., vertical height, in a range of twenty (20) nm to one hundred and fifty (150) nm. In one embodiment, the second dielectric material 433 can be deposited to have a thickness, e.g., vertical height, in a range of ten (10) nm to thirty (30) nm. Embodiments, however, are not limited to these examples. As shown in FIG. 4, a vertical direction 411 is illustrated as a third direction (D3), e.g., z-direction in an x-y-z coordinate system, analogous to the third direction (D3) among first, second, and third directions, shown in FIGS. 1-3.

In some embodiments, the first dielectric material, 430-1, 430-2, . . . , 430-N, may be an interlayer dielectric (ILD). By way of example, and not by way of limitation, the first dielectric material, 430-1, 430-2, . . . , 430-N, may comprise an oxide material, e.g., $SiO_2$. In another example the first dielectric material, 430-1, 430-2, . . . , 430-N, may comprise a silicon nitride ($Si_3N_4$) material (also referred to herein as "SiN"). In another example the first dielectric material, 430-1, 430-2, . . . , 430-N, may comprise a silicon oxy-carbide ($SiO_xC_y$) material. In another example the first dielectric material, 430-1, 430-2, . . . , 430-N, may include silicon oxy-nitride ($SiO_xN_y$) material (also referred to herein as "SiON"), and/or combinations thereof. Embodiments are not limited to these examples.

In some embodiments the semiconductor material, 432-1, 432-2, . . . , 432-N, may comprise a silicon (Si) material in a polycrystalline and/or amorphous state. The semiconductor material, 432-1, 432-2, . . . , 432-N, may be a low doped, p-type (p−) silicon material. The semiconductor material, 432-1, 432-2, . . . , 432-N, may be formed by gas phase doping boron atoms (B), as an impurity dopant, at a low concentration to form the low doped, p-type (p−) silicon material. In some embodiments, the semiconductor material 432-1, 432-2, . . . , 432-N may be formed by gas phase doping boron atoms (B) in-situ. The low doped, p-type (p−) silicon material may be an amorphous silicon material. Embodiments, however, are not limited to these examples.

In some embodiments, the second dielectric material, 433-1, 433-2, . . . , 433-N, may be an interlayer dielectric (ILD). By way of example, and not by way of limitation, the second dielectric material, 433-1, 433-2, . . . , 433-N, may comprise a nitride material. The nitride material may be a silicon nitride ($Si_3N_4$) material (also referred to herein as "SiN"). In another example the second dielectric material, 433-1, 433-2, . . . , 433-N, may comprise a silicon oxy-carbide (SiOC) material. In another example the second dielectric material, 433-1, 433-2, . . . , 433-N, may include silicon oxy-nitride (SiON), and/or combinations thereof. Embodiments are not limited to these examples. However, according to embodiments, the second dielectric material, 433-1, 433-2, . . . , 433-N, is purposefully chosen to be different in material or composition than the first dielectric material, 430-1, 430-2, . . . , 430-N, such that a selective etch process may be performed on one of the first and second dielectric layers, selective to the other one of the first and the second dielectric layers, e.g., the second SiN dielectric material, 433-1, 433-2, . . . , 433-N, may be selectively etched relative to the semiconductor material, 432-1, 432-2, . . . , 432-N, and a first oxide dielectric material, 430-1, 430-2, . . . , 430-N.

Again, the repeating iterations of alternating first dielectric material, 430-1, 430-2, . . . , 430-N layers, semiconductor material, 432-1, 432-2, . . . , 432-N layers, and second dielectric material, 433-1, 433-2, . . . , 433-N layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a first dielectric material, a semiconductor material, and a second dielectric material, in repeating iterations to form the vertical stack 401. In some embodiments, as described in connection with FIGS. 10A-10E and 11A-11E, instead of depositing a first dielectric material, 430-1, 430-2, . . . , 430-N, a semiconductor material, 432-1, 432-2, . . . , 432-N, and a second dielectric material, 433-1, 433-2, . . . , 433-N to form the vertical stack 401, a first dielectric material, a second dielectric material, and a third dielectric material may be deposited to form the vertical stack.

The layers may occur in repeating iterations vertically. In the example of FIG. 4A, three tiers, numbered 1, 2, and 3, of the repeating iterations are shown. For example, the stack may include: a first dielectric material 430-1, a semiconductor material 432-1, a second dielectric material 433-1, a third dielectric material 430-2, a second semiconductor material 432-2, a fourth dielectric material 433-2, a fifth dielectric material 430-3, a third semiconductor material 432-3, and a sixth dielectric material 433-3. As such, a stack may include: a first oxide material 430-1, a first semiconductor material 432-1, a first nitride material 433-1, a second oxide material 430-2, a second semiconductor material 432-2, a second nitride material 433-2, a third oxide material 430-3, a third semiconductor material 432-3, and a third nitride material 433-3 in further repeating iterations. Embodiments, however, are not limited to this example and more or fewer repeating iterations may be included.

FIG. 5A illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 5A illustrates a top down view of a semiconductor structure, at a particular point in time, in a semiconductor fabrication process, according to one or more embodiments. In the example embodiment shown in the example of FIG. 5A, the method comprises using an etchant process to form a plurality of first vertical openings 515, having a horizontal direction (D1) 509 and a second horizontal direction (D2) 505, through the vertical stack to the substrate. In one example, as shown in FIG. 5A, the plurality of first vertical openings 515 are extending predominantly in the second horizontal direction (D2) 505 and may form elongated vertical, pillar columns 513 with sidewalls 514 in the vertical stack. The plurality of first vertical openings 515 may be formed using photolithographic techniques to pattern a photolithographic mask 535, e.g., to form a hard mask (HM), on the vertical stack prior to etching the plurality of first vertical openings 515.

FIG. 5B is a cross sectional view, taken along cut-line A-A' in FIG. 5A, showing another view of the semiconductor structure at a particular time in the semiconductor fabrication process, in accordance with a number of embodiments of the present disclosure. The cross sectional view shown in FIG. 5B shows the repeating iterations of alternating layers of a first dielectric material, 530-1, 530-2, . . . , 530-(N+1), a semiconductor material, 532-1, 532-2, . . . , 532-N, and a second dielectric material, 533-1, 533-2, . . . , 533-N, on an insulator material 520 and a semiconductor substrate 500 to form the vertical stack, e.g. 401 as shown in FIG. 4. FIG. 5B illustrates that a conductive material, 540-1, 540-2, . . . , 540-4, may be formed on a gate dielectric material 538 in the plurality of vertical openings, e.g., first vertical openings 515 shown in FIG. 5A. By way of example and not by way of limitation, a gate dielectric material 538 may be conformally deposited in the plurality of first vertical openings 515 using a chemical vapor deposition (CVD) process, plasma enhanced CVD (PECVD), atomic layer deposition (ALD), or other suitable deposition process, to cover a bottom surface and the vertical sidewalls of the plurality of first vertical openings 515. The gate dielectric 538 may be deposited to a particular thickness (t1) as suited to a particular design rule, e.g., a gate dielectric thickness of approximately 10 nanometers (nm). Embodiments, however, are not limited to this example. By way of example, and not by way of limitation, the gate dielectric 538 may comprise a silicon dioxide ($SiO_2$) material, aluminum oxide (Al₂O₃) material, high dielectric constant (k), e.g., high-k, dielectric material, and/or combinations thereof as also described in FIG. 3.

Further, as shown in FIG. 5B, a conductive material, 540-1, 540-2, . . . , 540-4, may be conformally deposited in the plurality of vertical openings on a surface of the gate dielectric material 538. By way of example, and not by way of limitation, the conductive material, 540-1, 540-2, . . . , 540-4, may be conformally deposited in the plurality of vertical openings on a surface of the gate dielectric material 538 using a chemical vapor deposition process (CVD), plasma enhanced CVD (PECVD), atomic layer deposition (ALD), or other suitable deposition process, to cover a bottom surface and the vertical sidewalls of the plurality of vertical openings over the gate dielectric 538. The conductive material, 540-1, 540-2, . . . , 540-4, may be conformally deposited to a particular thickness (t2) to form vertically oriented access lines, such as shown as access lines 103-1, 103-2, . . . , 103-Q (which also may be referred to a word lines) shown in FIG. 1, et. seq., and as suited to a particular design rule. For example, the conductive material, 540-1, 540-2, . . . , 540-4, may be conformally deposited to a thickness of approximately 20 nanometers (nm). Embodiments, however, are not limited to this example. By way of example, and not by way of limitation, the conductive material, 540-1, 540-2, . . . , 540-4, may be comprise a metal such as tungsten (W), metal composition, titanium nitride (TiN), doped amorphous silicon, and/or some other combination thereof.

As shown in FIG. 5B, the conductive material, 540-1, 540-2, . . . , 540-4, may be recessed back to remain only along the vertical sidewalls of the elongated vertical, pillar columns, now shown as 542-1, 542-2, and 542-3 in the cross-sectional view of FIG. 5B. The plurality of separate, vertical access lines formed from the conductive material, 540-1, 540-2, . . . , 540-4, may be recessed back by using a suitable selective, anisotropic etch process to remove the conductive material, 540-1, 540-2, . . . , 540-4, from a bottom surface of the first vertical openings, e.g., 515 in FIG. 5A, exposing the gate dielectric 538 on the bottom surface to form separate, vertical access lines, 540-1, 540-2, . . . , 540-4. As shown in FIG. 5B, a dielectric material 539, such as an oxide or other suitable spin on dielectric (SOD), may then be deposited in the vertical openings, using a process such as CVD, to fill the vertical openings. The dielectric may be planarized to a top surface of the hard mask 535 of the vertical semiconductor stack, using chemical mechanical planarization (CMP) or other suitable semiconductor fabrication technique. A subsequent photolithographic material 536, e.g., hard mask, may be deposited using CVD and planarized using CMP to cover and close the vertical openings over the separate, vertical access lines, 540-1, 540-2, . . . , 540-4. Similar semiconductor process techniques may be used at other points of the semiconductor fabrication process described herein.

Figure 6A:
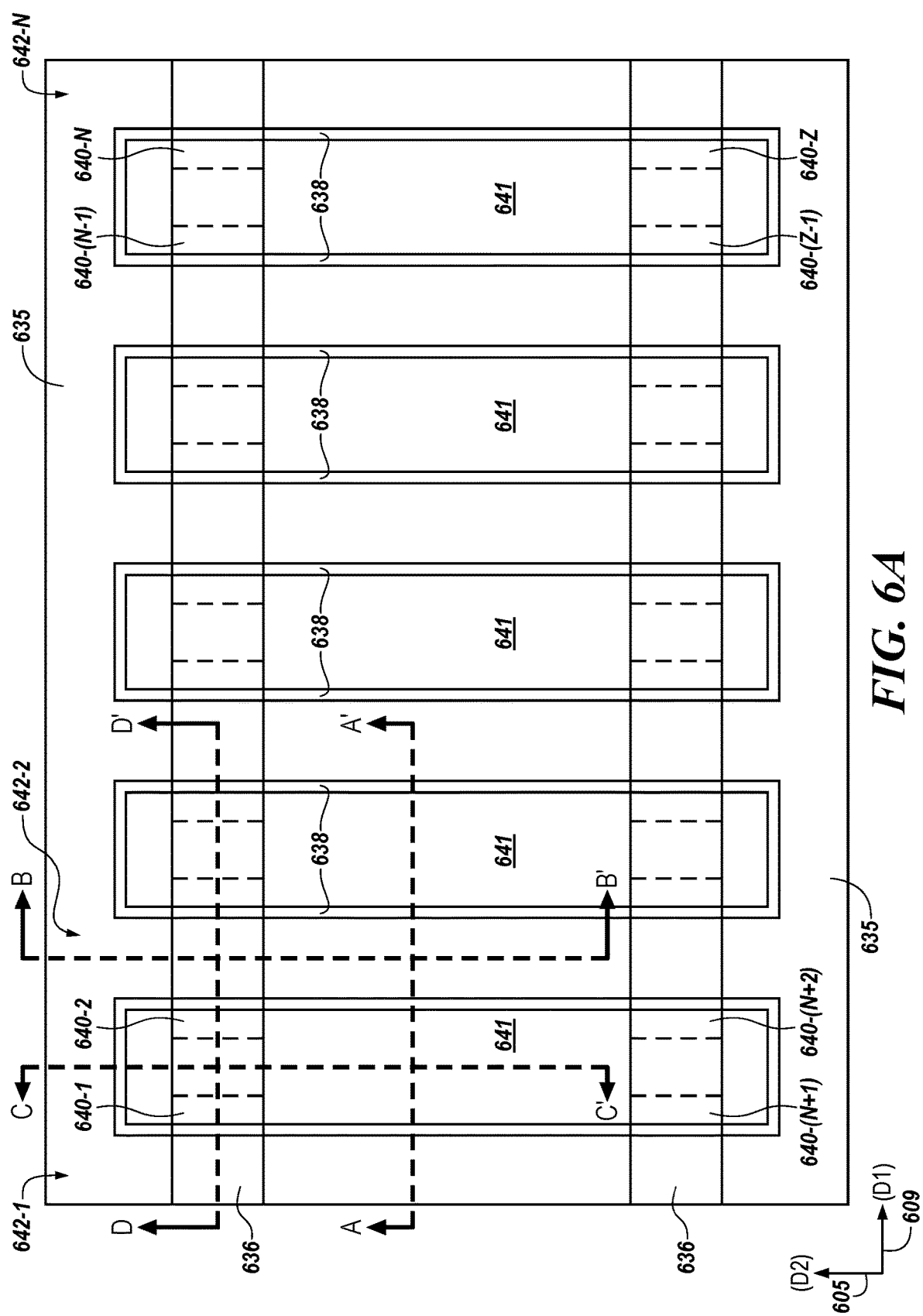

FIG. 6A illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 6A illustrates a top down view of a semiconductor structure, at a particular point in time, in a semiconductor fabrication process, according to one or more embodiments. In the example embodiment of FIG. 6A, the method comprises using a photolithographic process to pattern the photolithographic mask 636, 536 in FIG. 5B. The method in FIG. 6A, further illustrates using a selective, isotropic etchant process to remove portions of the exposed conductive material, 640-1, 640-2, . . . , 640-N, 640-(N+1), . . . , 640-(Z-1), and 640-Z, to separate and individually form the plurality of separate, vertical access lines, 640-1, 640-2, . . . , 640-N, 640-(N+1), . . . , 640-(Z-1), and 640-Z, e.g., access lines 103-1, 103-2, . . . , 103-Q in FIG. 1, et. seq. Hence the plurality of separate, vertical access lines, 640-1, 640-2, . . . , 640-N, 640-(N+1), . . . , 640-(Z-1), and 640-Z, are shown along the sidewalls of the elongated vertical, pillar columns, 642-1, 642-2, . . . , 642-N.

As shown in the example of FIG. 6A, the exposed conductive material, 640-1, 640-2, . . . , 640-N, 640-(N+1), . . . , 640-(Z-1), and 640-Z, may be removed back to the gate dielectric material 638, in the first vertical openings, e.g., 515 in FIG. 5A, using a suitable selective, isotropic etch process. As shown in FIG. 6A, a subsequent dielectric material 641, such as an oxide or other suitable spin on dielectric (SOD), may then be deposited to fill the remaining openings from where the exposed conductive material, 640-1, 640-2, . . . , 640-N, 640-(N+1), . . . , 640-(Z-1), and 640-Z, was removed using a process such as CVD, or other suitable technique. The dielectric material 641 may be planarized to a top surface of the previous hard mask 635 of the vertical semiconductor stack, e.g., 401 as shown in FIG. 4, using a process such as CMP, or other suitable technique. In some embodiments, a subsequent photolithographic material, e.g., hard mask 637 shown in FIG. 6B, may be deposited using CVD and planarized using CMP to cover and close the plurality of separate, vertical access lines, 640-1, 640-2, . . . , 640-N, 640-(N+1), . . . , 640-(Z-1), and 640-Z, over a working surface of the vertical semiconductor stack, 401 in FIG. 4, leaving the plurality of separate, vertical access lines, 640-1, 640-2, . . . , 640-N, 640-(N+1), . . . , 640-(Z-1), and 640-Z, protected along the sidewalls of the elongated vertical, pillar columns. Embodiments, however, are not limited to these process examples.

FIG. 6B illustrates a cross sectional view, taken along cut-line A-A' in FIG. 6A, showing another view of the semiconductor structure at this particular point in one example semiconductor fabrication process of an embodiment of the present disclosure. The cross sectional view shown in FIG. 6B is away from the plurality of separate, vertical access lines, 640-1, 640-2, . . . , 640-N, 640-(N+1), . . . , 640-(Z-1), and shows the repeating iterations of alternating layers of a first dielectric material, 630-1, 630-2, . . . , 630-(N+1), a semiconductor material, 632-1, 632-2, . . . , 632-N, and a second dielectric material, 633-1, 633-2, . . . , 633-N, on an insulator material 620 and a semiconductor substrate 600 to form the vertical stack, e.g. 401 as shown in FIG. 4. As shown in FIG. 6B, a vertical direction 611 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 609. In the example embodiment of FIG. 6B, the dielectric material 641 is shown filling the vertical openings on the residual gate dielectric 638 deposition. FIG. 6B further illustrates the hard mask 635 which cap the elongated vertical, pillar columns 642-1, 642-2, 642-3. The hard mask 637, described above, caps the illustrated structure.

FIG. 6C illustrates a cross sectional view, taken along cut-line B-B' in FIG. 6A, showing another view of the semiconductor structure at this particular point in one example semiconductor fabrication process of an embodiment of the present disclosure. The cross sectional view shown in FIG. 6C is illustrated extending in the second direction (D2) 605 along an axis of the repeating iterations of alternating layers of a first dielectric material, 630-1, 630-2, . . . , 630-(N+1), a semiconductor material, 632-1, 632-2, . . . , 632-N, and a second dielectric material, 633-1, 633-2, . . . , 633-N, along and in which the horizontally oriented access devices and horizontally oriented storage nodes, e.g., capacitor cells, can be formed within the layers of semiconductor material, 632-1, 632-2, . . . , 632-N. In FIG. 6C, a neighboring, opposing vertical access line 640-3 is illustrated by a dashed line indicating a location set in from the plane and orientation of the drawing sheet.

FIG. 6D illustrates a cross sectional view, taken along cut-line C-C' in FIG. 6A, showing another view of the semiconductor structure at this particular point in one example semiconductor fabrication process of an embodiment of the present disclosure. The cross sectional view shown in FIG. 6D is illustrated extending in the second direction (D2) 605 along an axis of the repeating iterations of alternating layers of a first dielectric material, 630-1, 630-2, . . . , 630-(N+1), a semiconductor material, 632-1, 632-2, . . . , 632-N, and a second dielectric material, 633-1, 633-2, . . . , 633-N, outside of a region in which the horizontally oriented access devices and horizontally oriented storage nodes, e.g., capacitor cells, will be formed within the layers of semiconductor material, 632-1, 632-2, . . . , 632-N. In FIG. 6D, the dielectric material 641 is shown filling the space between the horizontally oriented access devices and horizontally oriented storage nodes, which can be spaced along a third direction (D3) 611, extending into and out from the plane of the drawings sheet, for a three dimensional array of vertically oriented memory cells. At the left end of the drawing sheet is shown the repeating iterations of alternating layers of a first dielectric material, 630-1, 630-2, . . . , 630-(N+1), a semiconductor material, 632-1, 632-2, . . . , 632-N, and a second dielectric material, 633-1, 633-2, . . . , 633-N, at which location a horizontally oriented digit line, e.g., digit lines 107-1, 107-2, . . . , 107-P shown in FIG. 1, et. seq., can be integrated to form electrical contact with the second source/drain regions or digit line conductive contact material, described in more detail below.

FIG. 6E illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 6E is illustrated, right to left in the plane of the drawing sheet, extending in the first direction (D1) 609 along an axis of the repeating iterations of alternating layers of a first dielectric material, 630-1, 630-2, . . . , 630-(N+1), a semiconductor material, 632-1, 632-2, . . . , 632-N, and a second dielectric material, 633-1, 633-2, . . . , 633-N, intersecting across the plurality of separate, vertical access lines, 640-1, 640-2, 640-3, 640-4, and intersecting regions of the semiconductor material, 632-1, 632-2, . . . , 632-N, in which a channel and body region may be formed, separated from the plurality of separate, vertical access lines, 640-1, 640-2, -3, 640-4, by the gate dielectric 638. In FIG. 6E, the first dielectric fill material 639 is shown separating the space between neighboring horizontally oriented access devices and horizontally oriented storage nodes, which may be formed extending into and out from the plane of the drawing sheet as described in more detail below, and can be spaced along a first direction (D1) 609 and stacked vertically in arrays extending in the third direction (D3) 611 in the three dimensional (3D) memory.

FIG. 7A illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 7A illustrates a cross sectional view, taken along cut-line B-B' in FIG. 6A, showing another view of the semiconductor structure at this particular point in one example semiconductor fabrication process of an embodiment of the present disclosure.

The cross sectional view shown in FIG. 7A is illustrated extending in the second direction (D2) 705 along an axis of the repeating iterations of alternating layers of a first dielectric material, 730-1, 730-2, . . . , 730-(N+1), a semiconductor material, 732-1, 732-2, . . . , 732-N, and a second dielectric material, 733-1, 733-2, . . . , 733-N, along and in which the horizontally oriented access devices and horizontally oriented storage nodes, e.g., capacitor cells, can be formed within the layers of semiconductor material, 732-1, 732-2, . . . , 732-N. The repeating iterations of alternating layers of the first dielectric material, 730-1, 730-2, . . . , 730-(N+1), the semiconductor material, 732-1, 732-2, . . . , 732-N, and the second dielectric material, 733-1, 733-2, . . . , 733-N, may be formed on an insulator material 720 and a semiconductor substrate 700. In FIG. 7A, a neighboring, opposing vertical access line 740-3 is illustrated by a dashed line indicating a location set in from the plane and orientation of the drawing sheet.

As described in FIG. 4, the first dielectric material, 730-1, 730-2, . . . , 730-(N+1), may comprise an oxide material or a nitride material. In some embodiments, the first dielectric material, 730-1, 730-2, . . . , 730-(N+1), may be formed to a vertical thickness in a third direction (D3) 711 in a range of approximately ten (10) nm to fifty (50) nm. For example, the first dielectric material, 730-1, 730-2, . . . , 730-(N+1), may be formed to a vertical thickness in a third direction (D3) 711 of forty (40) nm. Further, as described in FIG. 4, the semiconductor material, 732-1, 732-2, . . . , 732-N, may comprise a polycrystalline and/or amorphous state, e.g., a polysilicon material. In some embodiments, the semiconductor material, 732-1, 732-2, . . . , 732-N, may be formed to a vertical thickness in the third direction (D3) 711 in a range of approximately twenty (20) nm to one hundred and fifty (150) nm. Further, as described in FIG. 4, the second dielectric material, 733-1, 733-2, . . . , 733-N, may comprise an oxide material or a nitride material. In some embodiments, the second dielectric material, 733-1, 733-2, . . . , 733-N, may be formed to a vertical thickness in the third direction (D3) 711 in a range of approximately 10-50 nm. For example, the second dielectric material, 733-1, 733-2, . . . , 733-N, may be formed to a vertical thickness in the third direction (D3) 711 of 20 nm.

FIG. 7B illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 7B illustrates a cross sectional view, taken along cut-line B-B' in FIG. 6A, showing a view as described in FIG. 7A of the semiconductor structure at different point in one example semiconductor fabrication process of an embodiment of the present disclosure.

As shown in FIG. 7B, elongated vertical, pillar columns with first vertical sidewalls in the vertical stack may be formed by a plurality of first vertical openings, e.g., first vertical openings 515 in FIG. 5A, having a first horizontal direction and a second horizontal direction, through the vertical stack and extending predominantly in the second horizontal direction. An etching process may be performed to remove portions of the repeated iterations of the first dielectric material, 730-1, 730-2, . . . , 730-(N+1), the semiconductor material, 732-1, 732-2, . . . , 732-N, and the second dielectric material, 733-1. 733-2, . . . , 733-N, in first regions, e.g., access device regions, of the elongated vertical, pillar column 742 to form second vertical openings 771-1, 771-2 (individually or collectively referred to as second vertical openings 771). As used herein, the term "access device region" refers to a region of an elongated vertical, pillar column in which an access device is formed. In some embodiments, the etching process may be an anisotropic etching process.

FIG. 7C illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 7C illustrates a cross sectional view, taken along cut-line B-B' in FIG. 6A, showing a view as described in FIG. 7A of the semiconductor structure at different point in one example semiconductor fabrication process of an embodiment of the present disclosure.

As shown in FIG. 7C, first portions of the semiconductor material may be selectively removed a first distance (DIST 1) 719 from the second vertical openings to form first horizontal openings in the second horizontal direction with a remaining second portion of the semiconductor material at a distal end of the first horizontal openings from the second vertical openings. An etching process may be performed to remove a portion of the semiconductor material, 732-1, 732-2, . . . , 732-N to form first horizontal openings 734-1, 734-2, . . . , 734-N. In some embodiments, a selective etch may be used to laterally recess a portion of the semiconductor material, 732-1, 732-2, . . . , 732-N, a first distance (DIST 1) 719 from the second vertical openings 771 described in connection with FIG. 7B. In some embodiments the first distance (DIST 1) 719 is in a range of approximately 20-300 nm. As shown in FIG. 7C, there may be a remaining portion of the semiconductor material, 732-1, 732-2, . . . , 732-N, at distal end 728 of the first horizontal openings 734-1, 734-2, . . . , 734-N from the second vertical openings 771.

FIG. 7D illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 7D illustrates a cross sectional view, taken along cut-line B-B' in FIG. 6A, showing a view as described in FIG. 7A of the semiconductor structure at different point in one example semiconductor fabrication process of an embodiment of the present disclosure.

As shown in FIG. 7D, a single crystalline silicon may be epitaxially grown within the first horizontal openings from the distal end of the first horizontal openings toward the second vertical openings to fill the first horizontal openings. The semiconductor material, e.g., single crystalline silicon, 787-1, 787-2, . . . , 787-N, may be epitaxially grown from the remaining portions of the semiconductor material 732-1, 732-2, . . . , 732-N to fill the first horizontal openings, 734-1, 734-2, . . . , 734-N. In some embodiments, the remaining semiconductor material 732-1, 732-2, . . . , 732-N, may be a seed material for epitaxially growing the single crystalline silicon 787-1, 787-2, . . . , 787-N.

In some embodiments, a gas may be flowed into the first horizontal openings, 734-1, 734-2, . . . , 734-N, at certain time and temperature parameters to epitaxially grow the single crystalline silicon, 787-1, 787-2, . . . , 787-N. For example, a disilane ($Si_2H_6$) gas may be flowed into the first horizontal openings, 734-1, 734-2, . . . , 734-N, to epitaxially grow the single crystalline silicon, 787-1, 787-2, . . . , 787-N from the remaining portion of the semiconductor material 732-1, 732-2, . . . , 732-N in the first horizontal openings, 734-1, 734-2, . . . , 734-N. Further, the single crystalline silicon, 787-1, 787-2, . . . , 787-N may be grown in the first horizontal openings, 734-1, 734-2, . . . , 734-N, from the remaining semiconductor material 732-1, 732-2, . . . , 732-N, at a temperature in a range of four hundred (400) to six hundred (600) degrees Celsius (° C.), for example. In some embodiments, the single crystalline silicon 787-1, 787-2, . . . , 787-N may be epitaxially grown within the first horizontal openings, 734-1, 734-2, . . . , 734-N, from the remaining portions of the semiconductor material, 732-1, 732-2, . . . , 732-N, along a <100> crystalline plane orientation toward the second vertical openings 771 to fill the first horizontal openings, 734-1, 734-2, . . . , 734-N.

Figure 7E:
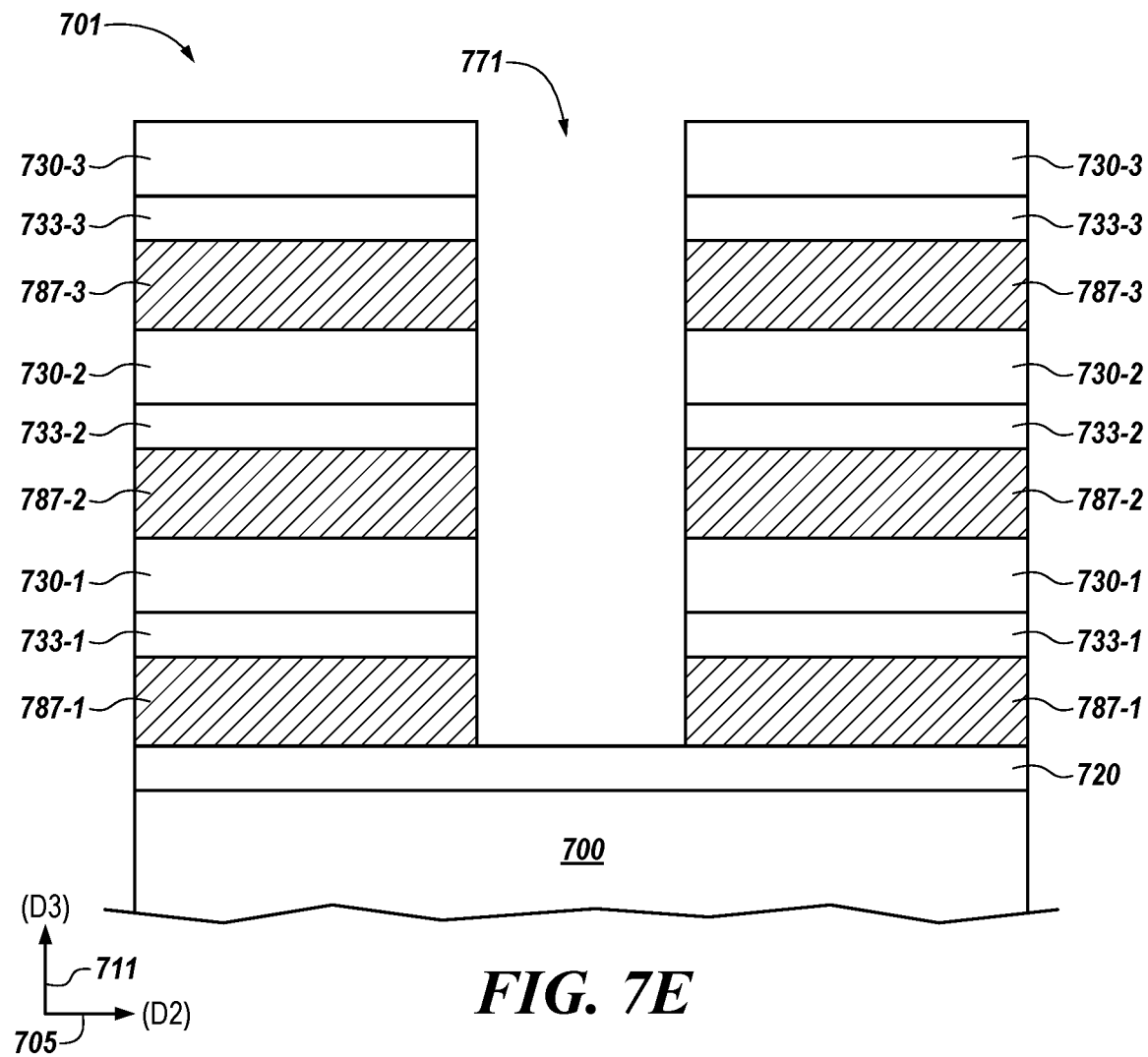

FIG. 7E illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 7E illustrates a cross sectional view, taken along cut-line B-B' in FIG. 6A, showing a view that is similar to the view described in FIG. 7A of the semiconductor structure at different point in one example semiconductor fabrication process of an embodiment of the present disclosure. Unlike FIGS. 7A-7D, the view in FIG. 7E centers on one of the second vertical openings 771.

As shown in FIG. 7E, a second vertical opening 771 may be formed through the layers within the vertically stacked memory cells to expose vertical sidewalls in the vertical stack. The second vertical opening 771 may be formed through the repeating iterations of the first dielectric material 730, the single crystalline silicon 787-1, 787-2, . . . , 787-N, and the second dielectric material 733. As such, the second vertical opening 771 may be formed through the first, first dielectric material 730-1, the first single crystalline silicon 787-1, the first, second dielectric material 733-1, the second, first dielectric material 730-2, the second single crystalline silicon 787-2, the second, second dielectric material 733-2, the third, first dielectric material 730-3, the third single crystalline silicon 787-3, and the third, second dielectric material 733-3. Embodiments, however, are not limited to the single second vertical opening 771 shown in FIG. 7E. Multiple second vertical openings 771 may be formed through the layers of materials. The second vertical opening 771 may be formed to expose vertical sidewalls in the vertical stack 701.

Figure 7F:
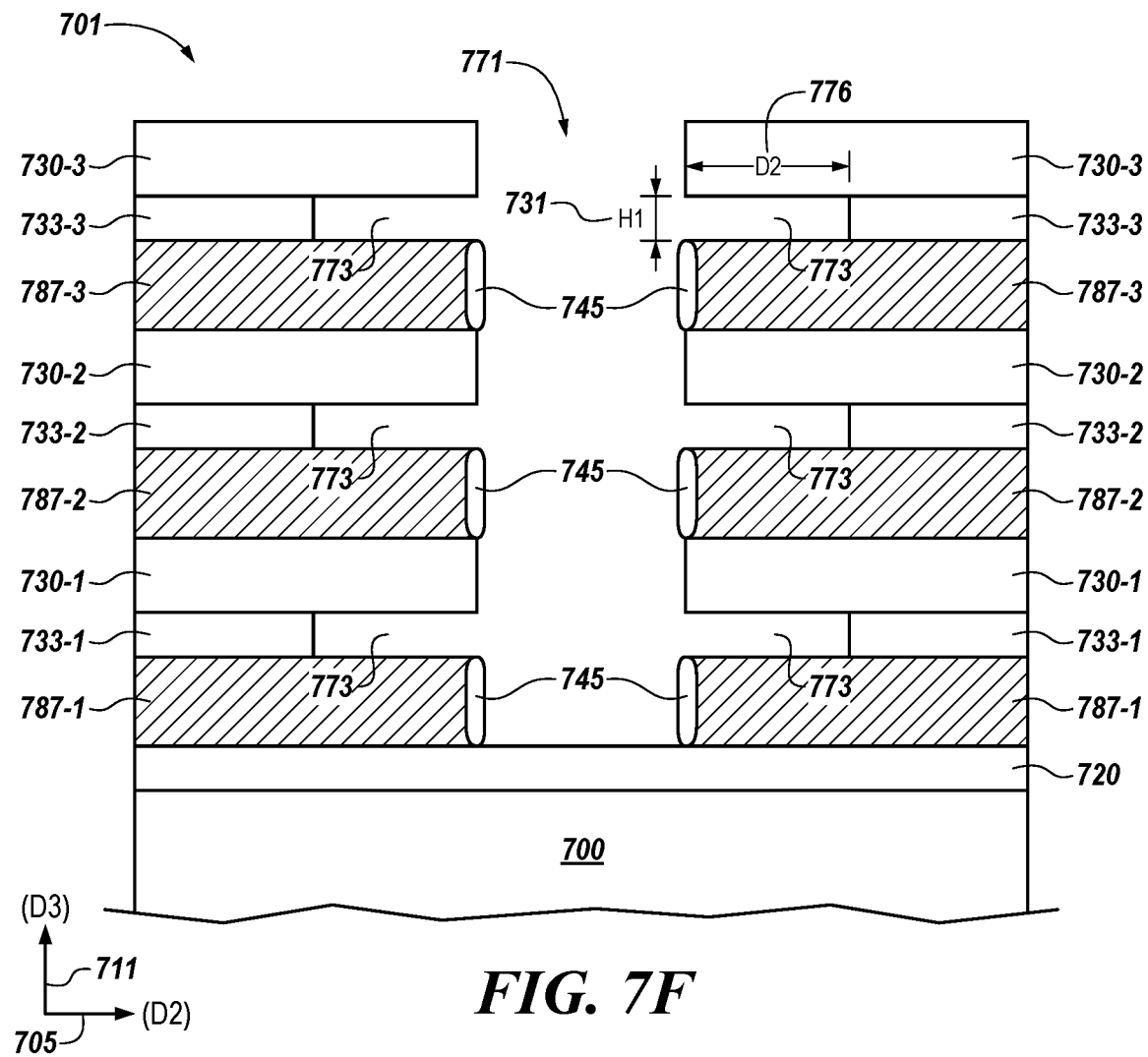

FIG. 7F illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 7F illustrates a cross sectional view, taken along cut-line B-B' in FIG. 6A, showing a view as described in FIG. 7E of the semiconductor structure at different point in one example semiconductor fabrication process of an embodiment of the present disclosure.

As shown in FIG. 7F, a selective etchant process may etch the second dielectric material 733 to form a second horizontal opening 773. The selective etchant process may be performed such that the second horizontal opening 773 has a length or depth (DIST 2) 776 a second distance (DIST 2) 776 from the second vertical opening 771. The distance (DIST 2) 776 may be controlled by controlling time, composition of etchant gas, and etch rate of a reactant gas flowed into the second vertical opening 771, e.g., rate, concentration, temperature, pressure, and time parameters. As such, the second dielectric material 733 may be etched a second distance (DIST 2) 776 from the second vertical opening 771. The selective etch may be isotropic, but selective to the second dielectric material 733, substantially stopping on the first dielectric material 730 and the single crystalline silicon 787. Thus, in one example embodiment, the selective etchant process may remove substantially all of the second dielectric material 733 from a top surface of the single crystalline silicon 787 to a bottom surface of the first dielectric material 730, e.g., oxide material, in a layer above while etching horizontally a distance (DIST 2) 776 from the second vertical opening 771 between the single crystalline silicon 787 and the first dielectric material 730. In this example the second horizontal opening 773 will have a height (H1) 731 substantially equivalent to and be controlled by a thickness, to which the second dielectric layer 733, e.g., nitride material, was deposited. Embodiments, however, are not limited to this example. As described herein, the selective etchant process may etch the second dielectric material 733 to a second distance (DIST 2) 776 and to a height (H1) 731.

Figure 7G:
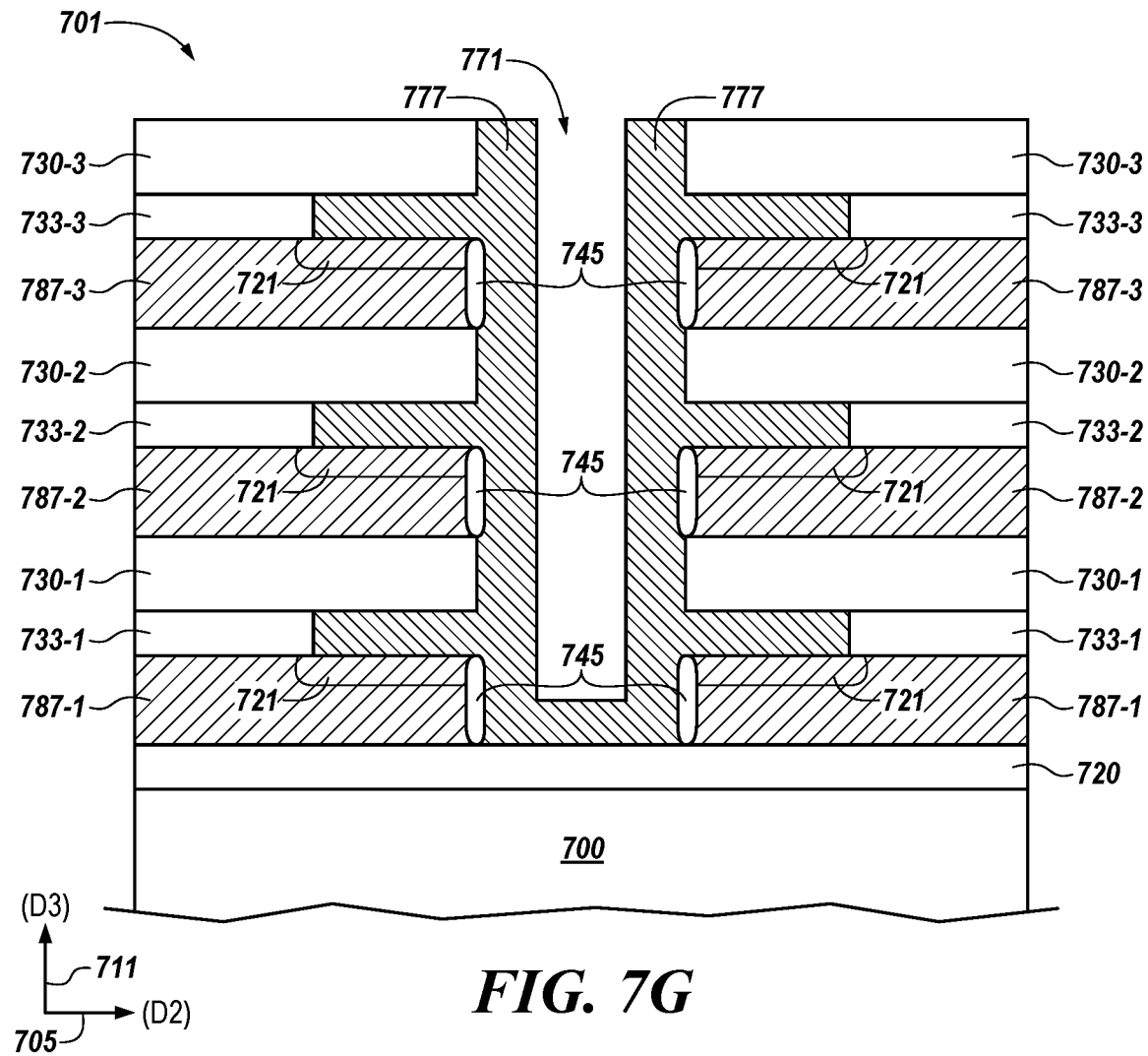

FIG. 7G illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 7G illustrates a cross sectional view, taken along cut-line B-B' in FIG. 6A, showing a view as described in FIG. 7E of the semiconductor structure at different point in one example semiconductor fabrication process of an embodiment of the present disclosure.

As show in FIG. 7G, a first source/drain region 721 may be formed by gas phase doping a top region of the single crystalline silicon material 787. Further, as shown in FIG. 7G, a conductive material 777 may be deposited into a portion of the second vertical opening 771, e.g., using a chemical vapor deposition (CVD) process, such that the conductive material 777 may also be deposited into the second horizontal opening 773. The conductive material 777 may be formed to be in contact with first source/drain region 721. In some embodiments, the conductive material 777 may comprise a titanium nitride (TiN) material. In some embodiments the conductive material 777 may be tungsten (W). In this example, some embodiments may include forming the tungsten (W) material according to a method as described in co-pending U.S. patent application Ser. No. 16/943,108, entitled "Digit Line Formation for Horizontally Oriented Access Devices", and having at least one common inventor. The conductive material 777 may form a laterally oriented digit line.

Figure 7H:
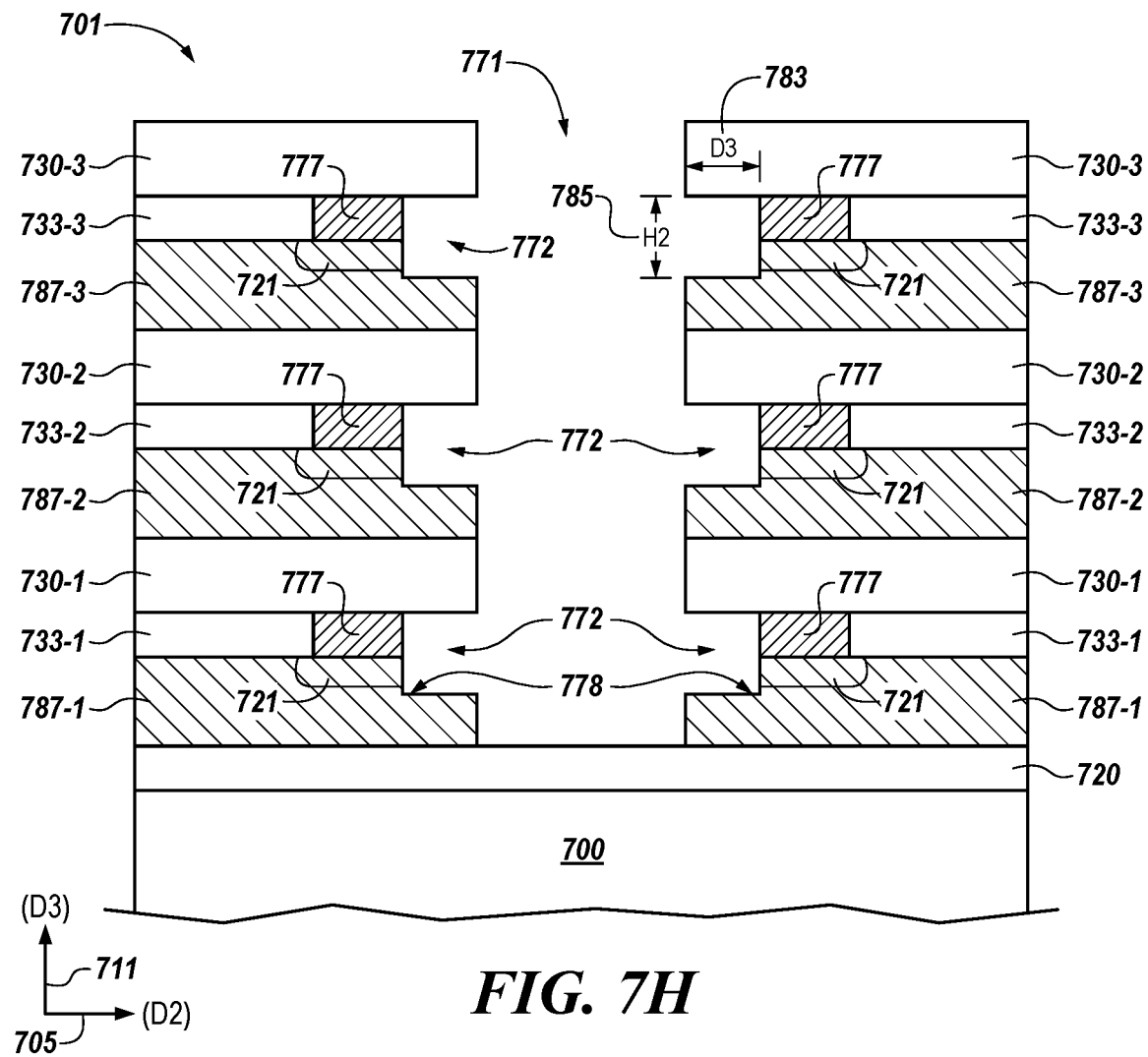

FIG. 7H illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 7H illustrates a cross sectional view, taken along cut-line B-B' in FIG. 6A, showing a view as described in FIG. 7E of the semiconductor structure at different point in one example semiconductor fabrication process of an embodiment of the present disclosure.

As shown in FIG. 7H, the oxide material protecting the sidewalls of semiconductor material (illustrated as 745 in FIGS. 7F-7G) in the second vertical opening 771, a portion of the first source/drain region 721, and a first portion 778 of the single crystalline silicon 787 beneath the first source/drain region 721 may be selectively etched away to allow for formation of a body contact to a body region of the horizontal access device. In this example, the conductive material 777, a portion of the first source/drain region 721 and a top portion, e.g., first portion 778, of the single crystalline silicon 787 beneath the first source/drain region 721 may also be etched back to a third distance (DIST 3) 783 from the second vertical opening 771. The etch may be performed using an etchant process, e.g., using an atomic layer etching (ALE) or other suitable technique. In some embodiments, the first source/drain region 721 may be etched to the same horizontal distance (DIST 3) 783 from the second vertical opening 771 as the conductive material 777.

Thus, a horizontal opening 772 may be formed by the etching the portion of the first source/drain region 721 and the top surface, e.g., 778, of the single crystalline silicon 787 beneath the first source/drain region 721 the third horizontal distance (DIST 3) 783 from the second vertical opening 771. As such, the horizontal openings 772 may have a second vertical height (H2) 785. The second vertical height (H2) 785 may be greater, e.g., taller vertically, than a combination of the height (H1) 731 of the second horizontal opening 773 formed in the second dielectric material, e.g., nitride material, and the height, e.g., depth of gas phase doping into the top surface of the single crystalline silicon 787, of the first source/drain region 721. For example, the second vertical height (H2) 785 may also include the height of the top portion, e.g., 778, of the single crystalline silicon 787 that was etched away. Thus, the third distance (DIST 3) 783 may be shorter than the second distance (DIST 2) 776, but the second vertical height (H2) 785 may be taller than the first height (illustrated as H1 in FIG. 7F).

Figure 7I:
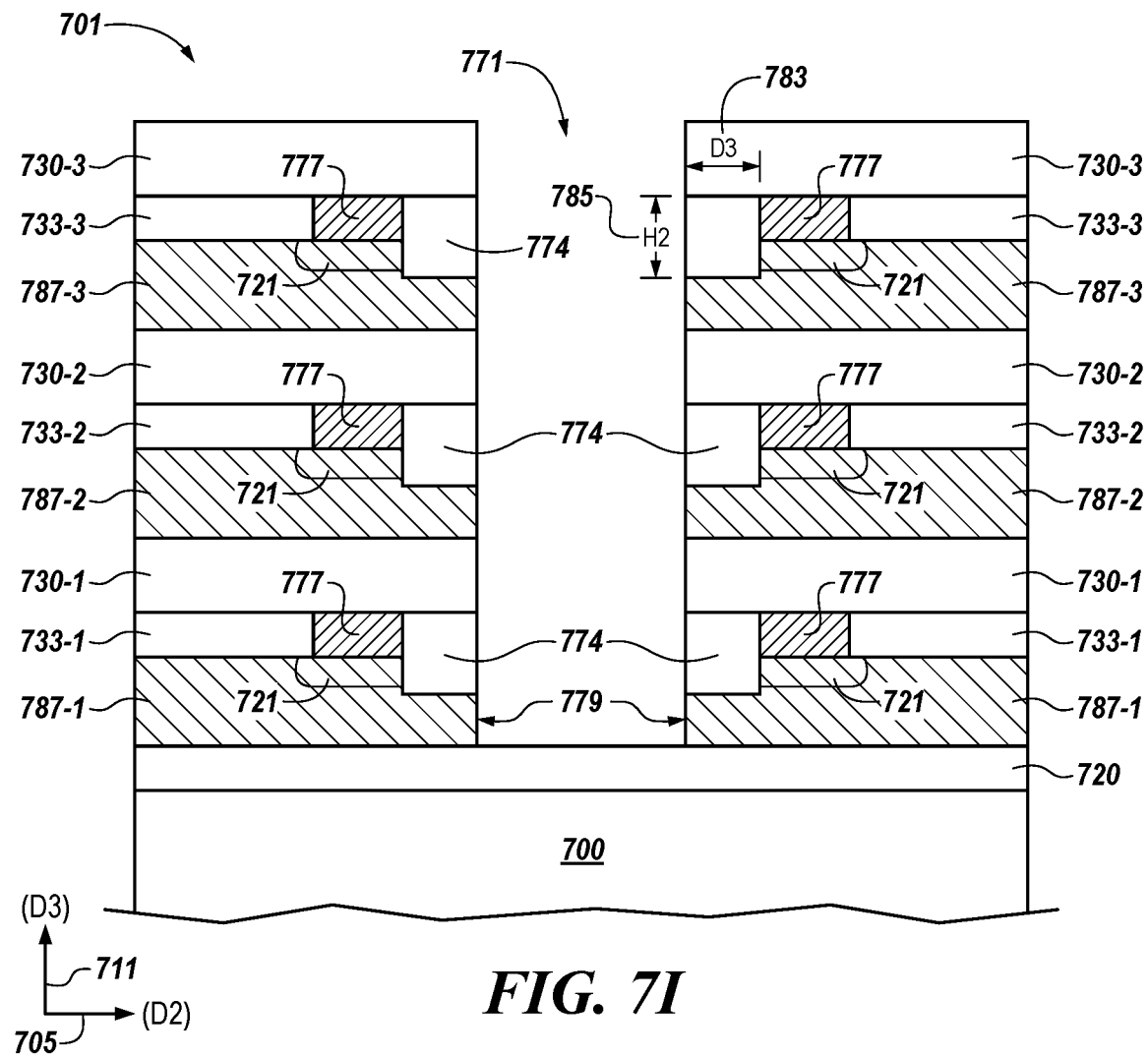

FIG. 7I illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 7I illustrates a cross sectional view, taken along cut-line B-B' in FIG. 6A, showing a view as described in FIG. 7E of the semiconductor structure at different point in one example semiconductor fabrication process of an embodiment of the present disclosure.

As shown in FIG. 7I, a third dielectric material 774 may be deposited into the second vertical opening 771 and recessed back to remove the third dielectric material 774 from the second vertical opening 771 and maintain the second vertical opening 771 to allow for deposition of a conductive material (not shown) to form a direct, electrical contact between such conductive material deposited within the second vertical opening 771 and a second portion 779 of the single crystalline silicon 787, e.g., body region contact, of the horizontally oriented access device, e.g., 230 in FIG. 2, within the vertical stack 701. In some embodiments, the third dielectric material 774 may be etched away from the second vertical opening 771 to expose the sidewalls of the first dielectric material 730, the third dielectric material 774, and a second portion 779 of the single crystalline silicon 787.

Figure 8A:
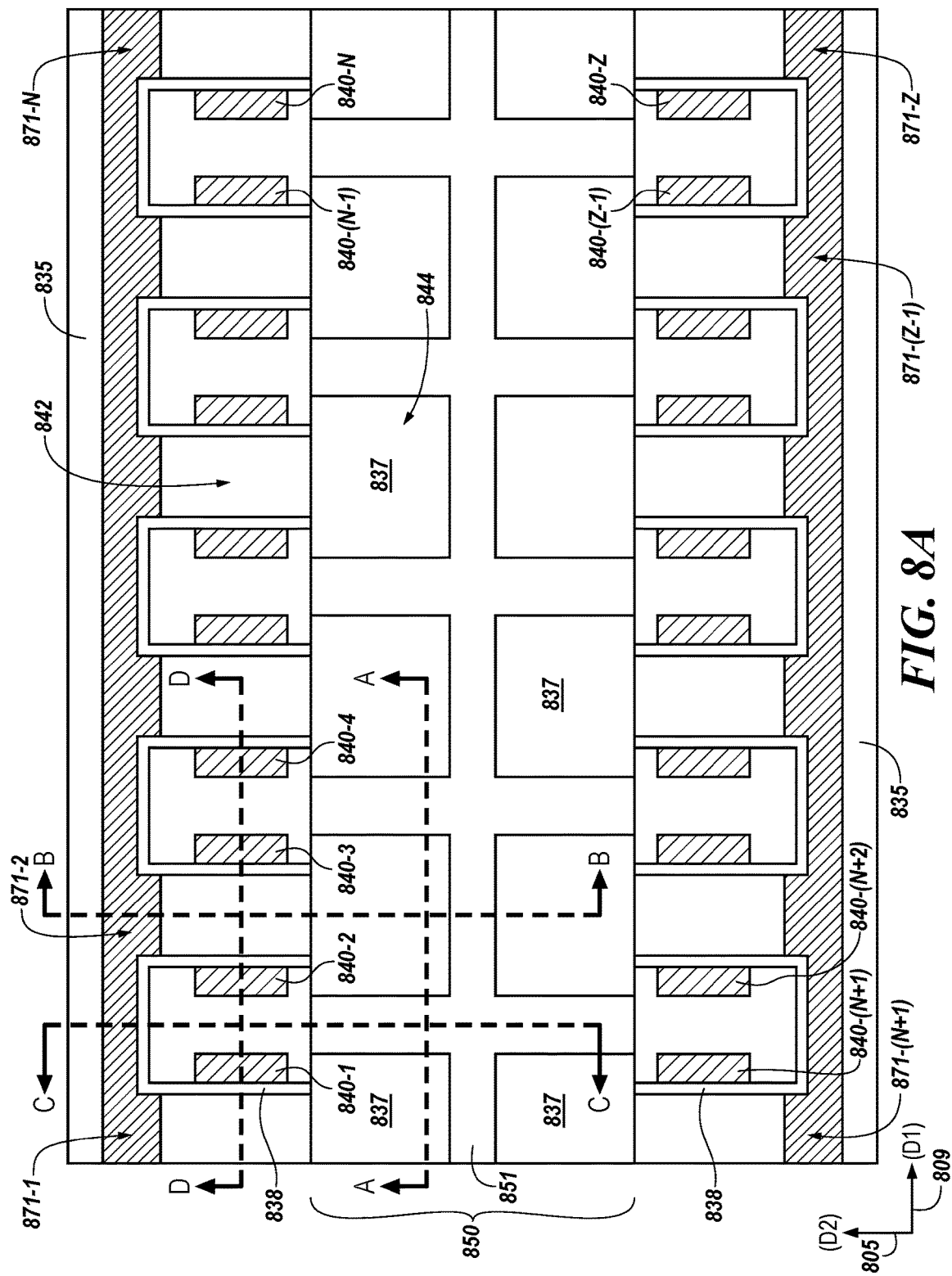

FIG. 8A illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 8A illustrates a top down view of a semiconductor structure, at a particular point in time, in a semiconductor fabrication process, according to one or more embodiments. In the example embodiment of FIG. 8A, the method comprises using a photolithographic process to pattern the photolithographic masks 835 and/or 837, e.g., 635 and/or 637 in FIGS. 6A-6E. The method in FIG. 8A, further illustrates using one or more etchant processes to form a third vertical opening 851 in a storage node region 850 (and 844 in FIGS. 8A and 8C) through the vertical stack and extending predominantly in the horizontal direction (D1) 809. The one or more etchant processes forms a third vertical opening 851 to expose third sidewalls in the repeating iterations of alternating layers of a first dielectric material, 830-1, 830-2, . . . , 830-(N+1), a single crystalline silicon, 878-1, 878-2, . . . , 878-N, and a second dielectric material, 833-1, 833-2, . . . , 833-N, in the vertical stack, shown in FIGS. 8B-8E, adjacent a second region, e.g., access device region, of the single crystalline silicon. Other numerated components may be analogous to those shown and discussed in connection with FIG. 6A-6E.

In some embodiments, this process is performed before selectively removing an access device region, e.g., transistor region, of the semiconductor material in which to form a first source/drain region, channel region, and second source/drain region of the horizontally oriented access devices. In other embodiments, this process is performed after selectively removing an access device region of the semiconductor material in which to form a first source/drain region, channel region, and second source/drain region of the horizontally oriented access devices.

According to an example embodiment, shown in FIGS. 8B-8E, the method comprises forming a third vertical opening 851 in the vertical stack, e.g., 401 in FIG. 4A, and selectively etching the second region 844 of the single crystalline silicon, 878-1, 878-2, . . . , 878-N, and the remaining semiconductor material, e.g., semiconductor material 732, to form a third horizontal opening 879 a third horizontal distance (DIST 3) back from the third vertical opening 851 in the vertical stack. According to embodiments, selectively etching the second region 844 of the single crystalline silicon, 878-1, 878-2, . . . , 878-N can comprise using an atomic layer etching (ALE) process. As will be explained more in connection with FIG. 8C, a second source/drain region 823 can be formed in the single crystalline silicon, 878-1, 878-2, . . . , 878-N at a distal end 828 of the third horizontal openings 879 from the third vertical opening 851.

FIG. 8B illustrates a cross sectional view, taken along cut-line A-A' in FIG. 8A, showing another view of the semiconductor structure at this particular point in one example semiconductor fabrication process of an embodiment of the present disclosure. The cross sectional view shown in FIG. 8B is away from the plurality of separate, vertical access lines, 840-1, 840-2, . . . , 840-N, 840-(N+1), . . . , 840-(Z-1), and shows repeating iterations of alternating layers of a dielectric material, 830-1, 830-2, . . . , 830-(N+1), a single crystalline silicon, 878-1, 878-2, . . . , 878-N, and a second dielectric material, 833-1, 833-2, . . . , 833-N, separated by a third vertical opening 851, on an insulator material 820 and a semiconductor substrate 800 to form the vertical stack. As shown in FIG. 8B, a vertical direction 811 is illustrated as a third direction (D3), e.g., z-direction in an x-y-z coordinate system, analogous to the third direction (D3) 111, among first, second, and third directions, shown in FIGS. 1-3. The plane of the drawing sheet, extending right and left, is in a first direction (D1) 809. In the example embodiment of FIG. 8B, the materials within the vertical stack—a dielectric material, 830-1, 830-2, . . . , 830-(N+1), a single crystalline silicon, 878-1, 878-2, . . . , 878-N, and a second dielectric material, 833-1, 833-2, . . . , 833-N, extend into and out of the plane of the drawing sheet in second direction (D2) and along an axis of orientation of the horizontal access devices and horizontal storage nodes of the arrays of vertically stacked memory cells of the three dimensional (3D) memory.

FIG. 8C illustrates a cross sectional view, taken along cut-line B-B' in FIG. 8A, showing another view of the semiconductor structure at this particular point in one example semiconductor fabrication process of an embodiment of the present disclosure. The cross sectional view shown in FIG. 8C is illustrated extending in the second direction (D2) 805, left and right along the plane of the drawing sheet, along an axis of the repeating iterations of alternating layers of a first dielectric material, 830-1, 830-2, . . . , 830-(N+1), a single crystalline silicon, 878-1, 878-2, . . . , 878-N, and a second dielectric material, 833-1, 833-2, . . . , 833-N, and in which the horizontally oriented access devices and horizontally oriented storage nodes, e.g., capacitor cells, can be formed within the layers of single crystalline silicon, 878-1, 878-2, . . . , 878-N. In the example embodiment of FIG. 8C, a third vertical opening 851 is illustrated where the horizontally oriented storage nodes, e.g., capacitor cells, may be formed later in this semiconductor fabrication process.

In the example embodiment of FIG. 8C, a third vertical opening 851 and third horizontal openings 879 are shown formed from the mask, patterning and etching process described in connection with FIG. 8A. As shown in FIG. 8C, the single crystalline silicon, 878-1, 878-2, . . . , 878-N, in the second region 844 has been selectively removed to form the third horizontal openings 879. In one example, an atomic layer etching (ALE) process is used to selectively etch the single crystalline silicon, 878-1, 878-2, . . . , 878-N, and remove the single crystalline silicon, 878-1, 878-2, . . . , 878-N, a distance back from the third vertical opening 851. Horizontally oriented storage nodes, e.g., capacitor cells, may be formed, as shown in FIGS. 9A-9E, later or first, relative to the fabrication process shown in FIGS. 7A-7I, in the third horizontal openings 879.

According to one example embodiment, as shown in FIG. 8C a second source/drain region 823 may be formed by flowing a high energy gas phase dopant, such as Phosphorous (P) for an n-type transistor, into the third horizontal openings 879 to implant the dopant in the single crystalline silicon, 878-1, 878-2, . . . , 878-N, at a distal end 828 of the third horizontal openings 879 from the third vertical opening 851. In one example, gas phase doping may be used to achieve a highly isotropic e.g., non-directional doping, to form the second source/drain region 823 to a horizontally oriented access device in region 842. In another example, thermal annealing with doping gas, such as phosphorous may be used with a high energy plasma assist to break the bonding. Embodiments, however, are not so limited and other suitable semiconductor fabrication techniques may be utilized.

As shown further in FIG. 9C, a first electrode, e.g., 961, for horizontally oriented storage nodes are to be coupled to the second source/drain regions 823 of the horizontal access devices. As shown later in FIG. 9C, such horizontally oriented storage nodes are shown formed in a third horizontal opening 879 extending in second direction (D2), left and right in the plane of the drawing sheet, a distance from the third vertical opening 851 formed in the vertical stack, e.g., 401 in FIG. 4A, and along an axis of orientation of the horizontal access devices and horizontal storage nodes of the arrays of vertically stacked memory cells of the three dimensional (3D) memory. In FIG. 8C, a neighboring, opposing vertical access line 840-3 is illustrated by a dashed line indicating a location set inward from the plane and orientation of the drawing sheet.

FIG. 8D illustrates a cross sectional view, taken along cut-line C-C' in FIG. 8A, showing another view of the semiconductor structure at this particular point in one example semiconductor fabrication process of an embodiment of the present disclosure. The cross sectional view shown in FIG. 8D is illustrated extending in the second direction (D2) 805, left and right in the plane of the drawing sheet, along an axis of the repeating iterations of alternating layers of a first dielectric material, 830-1, 830-2, . . . , 830-(N+1), a single crystalline silicon, 878-1, 878-2, . . . , 878-N, and a second dielectric material, 833-1, 833-2, . . . , 833-N, outside of a region in which the horizontally oriented access devices and horizontally oriented storage nodes, e.g., capacitor cells, will be formed within the layers of single crystalline silicon, 878-1, 878-2, . . . , 878-N. At the left end of the drawing sheet is shown the repeating iterations of alternating layers of a first dielectric material, 830-1, 830-2, . . . , 830-(N+1), a single crystalline silicon, 878-1, 878-2, . . . , 878-N, and a second dielectric material, 833-1, 833-2, . . . , 833-N, at which location a horizontally oriented digit line, e.g., digit lines 107-1, 107-2, . . . , 107-P shown in FIG. 1, et. seq., can be integrated to form electrical contact with first source/drain regions or digit line conductive contact material, described above in connection with FIGS. 7A-7I. As shown in FIG. 8D, a subsequent dielectric material 841, such as an oxide or other suitable spin on dielectric (SOD), may then be deposited to fill the remaining openings from where the exposed conductive material, 840-1, 840-2, . . . , 840-N, 840-(N+1), . . . , 840-(Z−1), and 840-Z, was removed using a process such as CVD, or other suitable technique. The dielectric material 841 may be planarized to a top surface of the previous hard mask 835 of the vertical semiconductor stack, e.g., 401 as shown in FIG. 4, using a process such as CMP, or other suitable technique.

Again, while first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

FIG. 8E illustrates a cross sectional view, taken along cut-line D-D' in FIG. 8A, showing another view of the semiconductor structure at this particular point in one example semiconductor fabrication process of an embodiment of the present disclosure. The cross sectional view shown in FIG. 8E is illustrated, right to left in the plane of the drawing sheet, extending in the first direction (D1) 809 along an axis of the repeating iterations of alternating layers of a first dielectric material, 830-1, 830-2, . . . , 830-(N+1), a single crystalline silicon, 878-1, 878-2, . . . , 878-N, and a second dielectric material, 833-1, 833-2, . . . , 833-N, intersecting across the plurality of separate, vertical access lines, 840-1, 840-2, . . . , 840-4, and intersecting regions of the single crystalline silicon, 878-1, 878-2, . . . , 878-N, in which a channel and body region may be formed, separated from the plurality of separate, vertical access lines, 840-1, 840-2, . . . , 840-4, by the gate dielectric 838. In FIG. 8E, the first dielectric fill material 839 is shown separating the space between neighboring horizontally oriented access devices which may be formed extending into and out from the plane of the drawing sheet as described in connection with FIGS. 7A-7I and can be spaced along a first direction (D1) 809 and stacked vertically in arrays extending in the third direction (D3) 811 in the three dimensional (3D) memory.

Figure 9A:
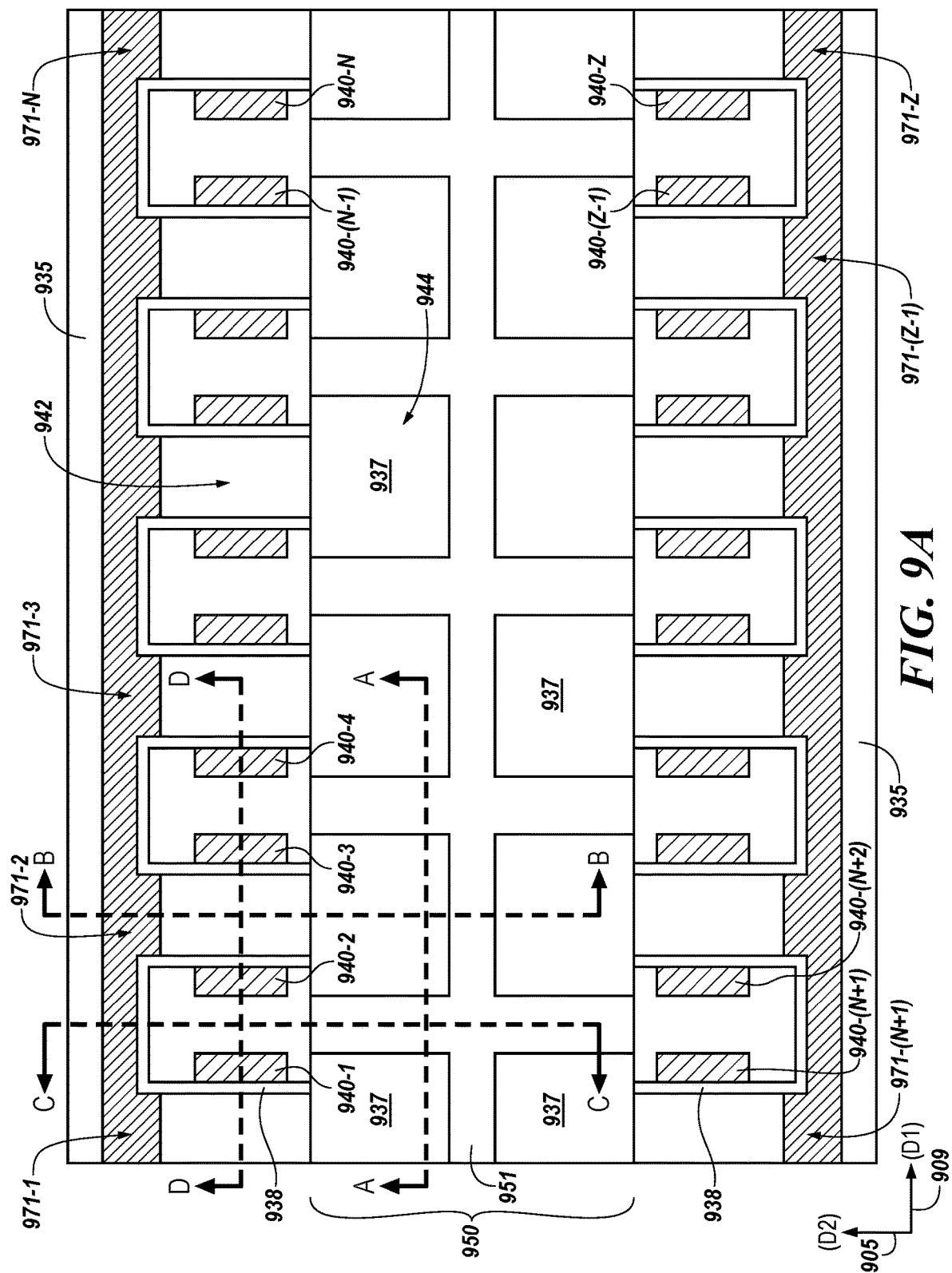

FIG. 9A illustrate an example method, at another stage of a semiconductor fabrication process, for forming arrays of vertically stacked memory cells with epitaxial single crystalline silicon growth for a horizontal access device, in accordance with a number of embodiments of the present disclosure. FIG. 9A illustrates a top down view of a semiconductor structure, at a particular point in time, in a semiconductor fabrication process, according to one or more embodiments. In the example embodiment of FIG. 9A, the method comprises using a photolithographic process to pattern the photolithographic masks 935 and/or 937, e.g., 635 and/or 637 in FIGS. 6A-6E or 735 and/or 737 in FIGS. 7A-7I. The method in FIG. 9A, further illustrates using one or more etchant processes to form a vertical opening 951 in a storage node region 950 (and 944 in FIGS. 9A and 9C) through the vertical stack and extending predominantly in the horizontal direction (D1) 909. The one or more etchant processes forms a vertical opening 951 to expose sidewalls in the repeating iterations of alternating layers of a first dielectric material, 930-1, 930-2, . . . , 930-(N+1), a single crystalline silicon, 987-1, 987-2, . . . , 987-N, and a second dielectric material, 933-1, 933-2, . . . , 933-N, in the vertical stack, shown in FIGS. 9B-9E, adjacent a second region of the single crystalline silicon, 987-1, 987-2, . . . , 987-N. Other numerated components may be analogous to those shown and discussed in connection with FIGS. 6-8.

In some embodiments, this process is performed after selectively removing an access device region of the single crystalline silicon 987-1, 987-2, . . . , 987-N in which to form a first source/drain region, channel region, and second source/drain region of the horizontally oriented access devices, as illustrated in FIG. 7. According to an example embodiment, shown in FIGS. 9B-9E, the method comprises selectively etching the second region of the single crystalline silicon, 987-1, 987-2, . . . , 987-N, to deposit a second source/drain region and capacitor cells through the horizontal opening, which is a second horizontal distance back from a vertical opening 951 in the vertical stack. In some embodiments, as shown in FIGS. 9B-9E, the method comprises forming capacitor cell as the storage node in the horizontal opening. By way of example, and not by way of limitation, forming the capacitor comprises using an atomic layer deposition (ALD) process to sequentially deposit, in the horizontal opening, a first electrode 961 and a second electrode 956 separated by a cell dielectric 963. Other suitable semiconductor fabrication techniques and/or storage nodes structures may be used.

FIG. 9B illustrates a cross sectional view, taken along cut-line A-A' in FIG. 9A, showing another view of the semiconductor structure at this particular point in one example semiconductor fabrication process of an embodiment of the present disclosure. The cross sectional view shown in FIG. 9B is away from the plurality of separate, vertical access lines, 940-1, 940-2, . . . , 940-N, 940-(N+1), . . . , 940-(Z−1), and shows repeating iterations of alternating layers of a dielectric material, 930-1, 930-2, . . . , 930-(N+1) and a second dielectric material 933-1, 933-2, . . . , 933-N, separated by horizontally oriented capacitor cells having first electrodes 961, e.g., bottom cell contact electrodes, cell dielectrics 963, and second electrodes 956, e.g., top, common node electrodes, on an insulator material 920 and a semiconductor substrate 900 to form the vertical stack. As shown in FIG. 9B, a vertical direction 911 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 909. In the example embodiment of FIG. 9B, the first electrodes 961, e.g., bottom electrodes to be coupled to source/drain regions of horizontal access devices, and second electrodes 956 are illustrated separated by a cell dielectric material 963 extending into and out of the plane of the drawing sheet in second direction (D2) and along an axis of orientation of the horizontal access devices and horizontal storage nodes of the arrays of vertically stacked memory cells of the three dimensional (3D) memory.

FIG. 9C illustrates a cross sectional view, taken along cut-line B-B' in FIG. 9A, showing another view of the semiconductor structure at this particular point in one example semiconductor fabrication process of an embodiment of the present disclosure. The cross sectional view shown in FIG. 9C is illustrated extending in the second direction (D2) 905, left and right along the plane of the drawing sheet, along an axis of the repeating iterations of alternating layers of a first dielectric material, 930-1, 930-2, . . . , 930-(N+1), a single crystalline silicon, 987-1, 987-2, . . . , 987-N, and a second dielectric material, 933-1, 933-2, . . . , 933-N, along and in which the horizontally oriented access devices and horizontally oriented storage nodes, e.g., capacitor cells, can be formed within the layers of single crystalline silicon, 987-1, 987-2, . . . , 987-N. In the example embodiment of FIG. 9C, the horizontally oriented storage nodes, e.g., capacitor cells, are illustrated as having been formed in this semiconductor fabrication process and first electrodes 961, e.g., bottom electrodes to be coupled to source/drain regions of horizontal access devices, and second electrodes 956, e.g., top electrodes to be coupled to a common electrode plane such as a ground plane, separated by cell dielectrics 963, are shown. However, embodiments are not limited to this example. In other embodiments the first electrodes 961, e.g., bottom electrodes to be coupled to source/drain regions of horizontal access devices, and second electrodes 956, e.g., top electrodes to be coupled to a common electrode plane such as a ground plane, separated by cell dielectrics 963, may be formed before forming a first source/drain region, a channel and body region, and a second source/drain region in a region of the single crystalline silicon, 987-1, 987-2, . . . , 987-N, intended for location, e.g., placement formation, of the horizontal oriented access devices, described next.

In the example embodiment of FIG. 9C, the horizontally oriented storage nodes having the first electrodes 961, e.g., bottom electrodes to be coupled to source/drain regions of horizontal access devices, and second electrodes 956, e.g., top electrodes to be coupled to a common electrode plane such as a ground plane, are shown formed in a third horizontal opening, e.g., 879 shown in FIG. 8C, extending in second direction (D2), left and right in the plane of the drawing sheet, a second distance (DIST 2 opening) from the third vertical opening, e.g., 851 in FIG. 8C, formed in the vertical stack, e.g., 401 in FIG. 4A, and along an axis of orientation of the horizontal access devices and horizontal storage nodes of the arrays of vertically stacked memory cells of the three dimensional (3D) memory. In FIG. 9C, a neighboring, opposing vertical access line 940-3 is illustrated by a dashed line indicating a location set inward from the plane and orientation of the drawing sheet.

FIG. 9D illustrates a cross sectional view, taken along cut-line C-C' in FIG. 9A, showing another view of the semiconductor structure at this particular point in one example semiconductor fabrication process of an embodiment of the present disclosure. The cross sectional view shown in FIG. 9D is illustrated extending in the second direction (D2) 905, left and right in the plane of the drawing sheet, along an axis of the repeating iterations of alternating layers of a first dielectric material, 930-1, 930-2, . . . , 930-(N+1), a single crystalline silicon, 987-1, 987-2, . . . , 987-N, and a second dielectric material, 933-1, 933-2, . . . , 933-N, outside of a region in which the horizontally oriented access devices and horizontally oriented storage nodes, e.g., capacitor cells, will be formed within the layers of single crystalline silicon, 987-1, 987-2, . . . , 987-N. In the cross sectional view of FIG. 9D, the second electrode 956, e.g., top, common electrode to the capacitor cell structure, is additionally shown present in the space between horizontally neighboring devices. At the left end of the drawing sheet is shown the repeating iterations of alternating layers of a first dielectric material, 930-1, 930-2, . . . , 930-(N+1), a single crystalline silicon, 987-1, 987-2, . . . , 987-N, and a second dielectric material, 933-1, 933-2, . . . , 933-N, at which location a horizontally oriented digit line, e.g., digit lines 107-1, 107-2, . . . , 107-P shown in FIG. 1, et. seq., can be integrated to form electrical contact with the second source/drain regions or digit line conductive contact material, described in more detail below.

FIG. 9E illustrates a cross sectional view, taken along cut-line D-D' in FIG. 9A, showing another view of the semiconductor structure at this particular point in one example semiconductor fabrication process of an embodiment of the present disclosure. The cross sectional view shown in FIG. 9E is illustrated, right to left in the plane of the drawing sheet, extending in the first direction (D1) 909 along an axis of the repeating iterations of alternating layers of a first dielectric material, 930-1, 930-2, . . . , 930-(N+1), a single crystalline silicon, 987-1, 987-2, . . . , 987-N, and a second dielectric material, 933-1, 933-2, . . . , 933-N, intersecting across the plurality of separate, vertical access lines, 940-1, 940-2, . . . , 940-4, and intersecting regions of the single crystalline silicon, 987-1, 987-2, . . . , 987-N, in which a channel and body region may be formed, separated from the plurality of separate, vertical access lines, 940-1, 940-2, . . . , 940-4, by the gate dielectric 938. In FIG. 9E, the first dielectric fill material 939 is shown separating the space between neighboring horizontally oriented access devices and horizontally oriented storage nodes, which may be formed extending into and out from the plane of the drawing sheet as described in more detail below, and can be spaced along a first direction (D1) 909 and stacked vertically in arrays extending in the third direction (D3) 911 in the three dimensional (3D) memory. FIG. 9 illustrates a cross-sectional view of a portion of an example horizontally oriented access device coupled to a horizontally oriented storage node and coupled to vertically oriented access lines and horizontally oriented digit lines, as may form part of an array of vertically stacked memory cells, in accordance with a number of embodiments of the present disclosure. The horizontally oriented access device can have a first source/drain region and a second source drain region separated by a channel and body region, and gates opposing the channel region and separated therefrom by a gate dielectric.

FIG. 10A illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 10A illustrates a cross sectional view, taken along cut-line B-B' in FIG. 6A, showing another view of the semiconductor structure at this particular point in one example semiconductor fabrication process of an embodiment of the present disclosure. The method described in FIGS. 10A-10E are an alternative method of forming arrays of vertically stacked memory cells with epitaxial single crystalline silicon growth for a horizontal access device than the method described in FIGS. 7A-7I.

As shown in FIG. 10A, layers of a first dielectric material, a second dielectric material, and a third dielectric material, may be deposited in repeating iterations vertically to form a vertical stack. In the embodiment described in FIGS. 10A-10E, the semiconductor material, e.g., semiconductor material 432-1, 432-2, . . . , 432-N shown in FIG. 4, in the vertical stack, e.g., vertical stack 401 shown in FIG. 4, is instead a second dielectric material 1029-1, 1029-2, . . . , 1029-N. Further, the second dielectric material 433-1, 433-2, . . . , 422-N in FIG. 4 is now the third dielectric material 1033-1, 1033-2, . . . , 1033-N in FIGS. 10A-10E. The cross sectional view shown in FIG. 10A is illustrated extending in the second direction (D2) 1005 along an axis of the repeating iterations of alternating layers of a first dielectric material, 1030-1, 1030-2, . . . , 1030-N, a second dielectric material, 1029-1, 1029-2, . . . , 1029-N, and a third dielectric material, 1033-1, 1033-2, . . . , 1033-N, along and in which the horizontally oriented access devices and horizontally oriented storage nodes, e.g., capacitor cells, can be formed. The repeating iterations of alternating layers of a first dielectric material, 1030-1, 1030-2, . . . , 1030-N, a second dielectric material, 1029-1, 1029-2, . . . , 1029-N, and a third dielectric material, 1033-1, 1033-2, . . . , 1033-N, may be formed on an insulator material 1020 and a semiconductor substrate 1000. In FIG. 10A, a neighboring, opposing vertical access line 1040-3 is illustrated by a dashed line indicating a location set in from the plane and orientation of the drawing sheet.

As described in FIG. 4, the first dielectric material, 1030-1, 1030-2, . . . , 1030-N, may comprise an oxide material or a nitride material. In some embodiments, the first dielectric material, 1030-1, 1030-2, . . . , 1030-N, may be formed to a vertical thickness in a third direction (D3) 1011 in a range of approximately ten (10) nm to fifty (50) nm. For example, the first dielectric material, 1030-1, 1030-2, . . . , 1030-N, may be formed to a vertical thickness in a third direction (D3) 1011 of forty (40) nm. Further, the second dielectric material, 1029-1, 1029-2, . . . , 1029-N, may comprise an oxide material or a nitride material. In some embodiments, the second dielectric material, 1029-1, 1029-2, . . . , 1029-N, may be formed to a vertical thickness in the third direction (D3) 1011 in a range of approximately twenty (20) nm to one hundred and fifty (150) nm. Further, as described in FIG. 4, the third dielectric material, 1033-1, 1033-2, . . . , 1033-N, may comprise an oxide material or a nitride material. In some embodiments, the third dielectric material, 1033-1, 1033-2, . . . , 1033-N, may be formed to a vertical thickness in the third direction (D3) 711 in a range of approximately 10-50 nm. For example, the third dielectric material, 1033-1, 1033-2, . . . , 1033-N, may be formed to a vertical thickness in the third direction (D3) 1011 of 20 nm.

According to embodiments, the second dielectric material, 1029-1, 1029-2, . . . , 1029-N, is purposefully chosen to be different in material or composition than the first dielectric material, 1030-1, 1030-2, . . . , 1030-N, and the third dielectric material, 1033-1, 1033-2, . . . , 1033-N, such that a selective etch process may be performed on the second dielectric layers, 1029-1, 1029-2, . . . , 1029-N, selective to the second dielectric layers, 1029-1, 1029-2, . . . , 1029-N, relative to the first dielectric material, 1030-1, 1030-2, . . . , 1030-N, and the third dielectric material, 1033-1, 1033-2, . . . , 1033-N.

As similarly described in FIG. 4, the first dielectric material 1030-1, 1030-2, . . . , 1030-N, the second dielectric material 1029-1, 1029-2, . . . , 1029-N, and the third dielectric material 1033-1, 1033-2, . . . , 1033-N may be deposited in at least two (2) repeating iterations to form the vertical stack, e.g., vertical stack 401 in FIG. 4, to a height in a range of twenty (20) nanometers (nm) to three hundred (300) nm.

FIG. 10B illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 10B illustrates a cross sectional view, taken along cut-line B-B' in FIG. 6A, showing another view of the semiconductor structure at this particular point in one example semiconductor fabrication process of an embodiment of the present disclosure.

As shown in FIG. 10B, a second vertical opening may be formed through the vertical stack and extending predominantly in the first horizontal direction to expose second vertical sidewalls adjacent first region of the second dielectric material. As further shown in FIG. 10B, first portions of the second dielectric material may be selectively removed a first distance (DIST 1) from the second vertical opening to form first horizontal openings in the second dielectric material. An anisotropic etch may be used to create a second vertical opening 1051 in the first region, e.g., cell-side region, of the vertical stack. Further, a subsequent isotropic etch may be used to selectively etch the second dielectric material 1029-1, 1029-2, . . . , 1029-N to a horizontal distance to form first horizontal openings 1043. In some embodiments, the first horizontal openings 1043 may be formed to a horizontal distance in a range of five (5) nm to two hundred (200) nm.

FIG. 10C illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 10C illustrates a cross sectional view, taken along cut-line B-B' in FIG. 6A, showing another view of the semiconductor structure at this particular point in one example semiconductor fabrication process of an embodiment of the present disclosure.

As shown in FIG. 10C, a semiconductor material 1032 may be deposited into the first horizontal openings 1043 to fill the first horizontal openings 1043. In some embodiments, the semiconductor material 1032 may be a polysilicon material 1032. By way of example and not by way of limitation, the semiconductor material 1032 may be conformally deposited in the plurality of first horizontal openings 1043 using a chemical vapor deposition (CVD) process, plasma enhanced CVD (PECVD), atomic layer deposition (ALD), or other suitable deposition process, to fill the first horizontal openings 1043.

FIG. 10D illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 10D illustrates a cross sectional view, taken along cut-line B-B' in FIG. 6A, showing another view of the semiconductor structure at this particular point in one example semiconductor fabrication process of an embodiment of the present disclosure.

As shown in FIG. 10D, a third vertical opening 1071 may be formed through the vertical stack and extending predominantly in the first horizontal direction to expose third vertical sidewalls adjacent a second region of the second dielectric material. The third vertical openings 1071 may be formed through the repeating iterations of the first dielectric material 1030-1, 1030-2, . . . , 1030-(N+1), the second dielectric material 1029-1, 1029-2, . . . , 1029-N, and the third dielectric material 1033-1, 1033-2, . . . , 1033-N. As such, the third vertical openings 1071 may be formed through a first, first dielectric material 1030-1, a first, second dielectric material 1029-1, a first, third dielectric material 1033-1, a second, first dielectric material 1030-2, a second, second dielectric material 1032-2, a second, third dielectric material 1033-2, a third, first dielectric material 1030-3, a third, second dielectric material 1032-3, and a third, third dielectric material 1033-3. The third vertical opening 1071 may be formed to expose vertical sidewalls in the vertical stack. In some embodiments, a dielectric material 1053 may be deposited into the second vertical opening 1051 to fill the vertical opening 1051.

Further, as shown in FIG. 10D, second portions of the second dielectric material 1029-1, 1029-2, . . . , 1029-N, may be selectively removed a second distance (DIST 2) from the third vertical opening 1071 to the deposited polysilicon material 1032 to form second horizontal openings, 1046-1, 1046-2, . . . , 1046-N, in the second horizontal direction. In some embodiments, the deposited polysilicon 1032 may be at a distal end of the second horizontal openings, 1046-1, 1046-2, . . . , 1046-N, from the third vertical opening 1071. An etching process may be performed to remove the second dielectric material, 1029-1, 1029-2, . . . , 1029-N to form second horizontal openings 1046. In some embodiments, a selective etch may be used to remove the second dielectric material, 1029-1, 1029-2, . . . , 1029-N, from the second horizontal openings 1046. The etch may be performed using an etchant process, e.g., using an atomic layer etching (ALE) or other suitable technique. In some embodiments, the horizontal distance of the second horizontal openings 1046 may be in a range of approximately 20-300 nm. In some embodiments, a dielectric material 1053 may be deposited into the second vertical opening 1051 to fill the vertical opening 1051.

FIG. 10E illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 10F illustrates a cross sectional view, taken along cut-line B-B' in FIG. 6A, showing another view of the semiconductor structure at this particular point in one example semiconductor fabrication process of an embodiment of the present disclosure.

As shown in FIG. 10E, a single crystalline silicon may be grown within the second horizontal openings, 1046-1, 1046-2, . . . , 1046-N, from the distal end of the second horizontal openings, 1046-1, 1046-2, . . . , 1046-N, toward the third vertical opening 1071 to fill the second horizontal openings, 1046-1, 1046-2, . . . , 1046-N. The semiconductor material 1087 may be epitaxially grown in the horizontal openings, 1046-1, 1046-2, . . . , 1046-N. In some embodiments, the semiconductor material 1087 is a single crystalline silicon 1087. The semiconductor material 1032 may be a seed material from which to epitaxially grow the single crystalline silicon 1087. A gas may be flowed into the second horizontal openings, 1046-1, 1046-2, . . . , 1046-N, to epitaxially grow the single crystalline silicon 1087. In some embodiments, a disilane ($Si_2H_6$) gas is flowed into the second horizontal openings 1046 to epitaxially grow the single crystalline silicon 1087 from the polysilicon material 1032 in the second horizontal openings, 1046-1, 1046-2, . . . , 1046-N. In some embodiments, the single crystalline silicon 1087 may be epitaxially grown at a temperature in a range of approximately 400-600° C. In some embodiments, the single crystalline silicon 1087 may be epitaxially grown from the polysilicon material 1032 along a <100> crystalline plane orientation toward the third vertical opening 1071 to completely fill the second horizontal openings, 1046-1, 1046-2, . . . , 1046-N. In some embodiments, a dielectric material 1054 may be deposited in the third vertical opening 1071. The dielectric material 1054 may be deposited along the sidewalls and the bottom of the third vertical opening 1071 to reduce, e.g., prevent, the occurrence of single crystalline silicon 1087 growing in an unintended horizontal direction, e.g., growing in the third vertical opening 1071. Further, the dielectric material 1053 may be deposited in the second vertical opening 1051 to reduce, e.g., prevent, the occurrence of the single crystalline material 1087 from forming in an unintended direction, e.g., in the second vertical opening 1051.

Horizontal digit lines and access devices may be formed in the access device regions of the vertical stack adjacent the third vertical openings 1071. The methods of forming the horizontal digit lines and access devices are described in FIGS. 7E-7I and 8A-8E. Further, storage nodes, e.g., capacitor cells, may be formed in the cell-side region of the vertical stack adjacent the second vertical opening 1051. The method of forming the storage nodes is described in FIGS. 8A-8E and 9A-9E.

FIG. 11A illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 11A illustrates a cross sectional view, taken along cut-line B-B' in FIG. 6A, showing another view of the semiconductor structure at this particular point in one example semiconductor fabrication process of an embodiment of the present disclosure. The method described in FIGS. 11A-11E are an alternative method of forming arrays of vertically stacked memory cells with epitaxial single crystalline silicon growth for a horizontal access device than the methods described in FIGS. 7A-7I and 10A-10E.

As shown in FIG. 11A, layers of a first dielectric material, a second dielectric material, and a third dielectric material, may be deposited in repeating iterations vertically to form a vertical stack In the embodiment described in FIGS. 11A-11E, the semiconductor material, e.g., semiconductor material 432-1, 432-2, . . . , 432-N shown in FIG. 4, in the vertical stack, e.g., vertical stack 401 shown in FIG. 4, is instead a second dielectric material 1129-1, 1129-2, . . . , 1129-N. Further, the second dielectric material 433-1, 433-2, . . . , 422-N in FIG. 4 is now the third dielectric material 1133-1, 1133-2, . . . , 1133-N in FIGS. 11A-11E.

The cross sectional view shown in FIG. 11A is illustrated extending in the second direction (D2) 1105 along an axis of the repeating iterations of alternating layers of a first dielectric material, 1130-1, 1130-2, . . . , 1130-N, a second dielectric material, 1129-1, 1129-2, . . . , 1129-N, and a third dielectric material, 1133-1, 1133-2, . . . , 1133-N, along and in which the horizontally oriented access devices and horizontally oriented storage nodes, e.g., capacitor cells, can be formed. The repeating iterations of alternating layers of a first dielectric material, 1130-1, 1130-2, . . . , 1130-N, a second dielectric material, 1129-1, 1129-2, . . . , 1129-N, and a third dielectric material, 1133-1, 1033-2, . . . , 1133-N, may be formed on an insulator material 1120 and a semiconductor substrate 1100. In FIG. 11A, a neighboring, opposing vertical access line 1140-3 is illustrated by a dashed line indicating a location set in from the plane and orientation of the drawing sheet.

As described in FIG. 4, the first dielectric material, 1130-1, 1130-2, . . . , 1130-N, may comprise an oxide material or a nitride material. In some embodiments, the first dielectric material, 110-1, 1130-2, . . . , 1130-N, may be formed to a vertical thickness in a third direction (D3) 1111 in a range of approximately ten (10) nm to fifty (50) nm. For example, the first dielectric material, 1130-1, 1130-2, . . . , 1130-N, may be formed to a vertical thickness in a third direction (D3) 1111 of forty (40) nm. Further, the second dielectric material, 1129-1, 1129-2, . . . , 1129-N, may comprise an oxide material or a nitride material. In some embodiments, the second dielectric material, 1129-1, 1129-2, . . . , 1129-N, may be formed to a vertical thickness in the third direction (D3) 1111 in a range of approximately twenty (20) nm to one hundred and fifty (150) nm. Further, as described in FIG. 4, the third dielectric material, 1133-1, 1133-2, . . . , 1133-N, may comprise an oxide material or a nitride material. In some embodiments, the third dielectric material, 1133-1, 1133-2, . . . , 1133-N, may be formed to a vertical thickness in the third direction (D3) 1111 in a range of approximately 10-50 nm. For example, the third dielectric material, 1133-1, 1133-2, . . . , 1133-N, may be formed to a vertical thickness in the third direction (D3) 1111 of 20 nm.

According to embodiments, the second dielectric material, 1129-1, 1129-2, . . . , 1129-N, is purposefully chosen to be different in material or composition than the first dielectric material, 1130-1, 1130-2, . . . , 1130-N, and the third dielectric material, 1133-1, 1133-2, . . . , 1133-N, such that a selective etch process may be performed on the second dielectric layers, 1129-1, 1129-2, . . . , 1129-N, selective to the second dielectric layers, 1129-1, 1129-2, . . . , 1129-N, relative to the first dielectric material, 1130-1, 1130-2, . . . , 1130-N, and the third dielectric material, 1133-1, 1133-2, . . . , 1133-N.

As similarly described in FIG. 4, the first dielectric material 1130-1, 1130-2, . . . , 1130-N, the second dielectric material 1129-1, 1129-2, . . . , 1129-N, and the third dielectric material 1133-1, 1133-2, . . . , 1133-N may be deposited in at least two (2) repeating iterations to form the vertical stack, e.g., vertical stack 401 in FIG. 4, to a height in a range of twenty (20) nanometers (nm) to three hundred (300) nm.

FIG. 11B illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 11B illustrates a cross sectional view, taken along cut-line B-B' in FIG. 6A, showing another view of the semiconductor structure at this particular point in one example semiconductor fabrication process of an embodiment of the present disclosure.

As shown in FIG. 11B, a second vertical opening 1171 may be formed through the vertical stack and extending predominantly in the first horizontal direction to expose second vertical sidewalls adjacent a second region of the second dielectric material. An etching process may be used to remove portions of the first dielectric material 1130-1, 1130-2, . . . , 1130-N, the second dielectric material 1129-1, 1129-2, . . . , 1129-N, and the third dielectric material 1133-1, 1133-2, . . . , 1133-N, to form second vertical opening 1171. In some embodiments, the second vertical opening 1171 may be etched down into the substrate 1100.

FIG. 11C illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 11C illustrates a cross sectional view, taken along cut-line B-B' in FIG. 6A, showing another view of the semiconductor structure at this particular point in one example semiconductor fabrication process of an embodiment of the present disclosure.

As shown in FIG. 11C, a single crystalline silicon may be grown from the substrate within the second vertical opening 1171. In some embodiments, the semiconductor material 1187 may be a single crystalline silicon 1187. In some embodiments, the substrate 1100 may be used as a seed to grow the single crystalline silicon 1187 to fill the second vertical opening 1171. In some embodiments, the single crystalline silicon 1187 may be grown at a temperature in a range of 400-600° C. In some embodiments, a dielectric material 1152 may be deposited over the vertical stack and the single crystalline silicon 1187. In some embodiments, the dielectric material 1152 may be deposited to prevent the single crystalline material 1187 from growing in the third direction (D3) 1111 past the top surface of the vertical stack.

FIG. 11D illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 11D illustrates a cross sectional view, taken along cut-line B-B' in FIG. 6A, showing another view of the semiconductor structure at this particular point in one example semiconductor fabrication process of an embodiment of the present disclosure.

As shown in FIG. 11D, a third vertical opening 1151 may be formed through the vertical stack extending predominantly in the first horizontal direction to expose third vertical sidewalls adjacent a second region of the second dielectric material, 1129-1, 1129-2, . . . , 1129-N. Further, the second dielectric material 1129-1, 1129-2, . . . , 1129-N may be selectively removed to form first horizontal openings 1149. An etching process may selectively etch the second dielectric material 1129-1, 1129-2, . . . , 1129-N. The second dielectric material 1129-1, 1129-2, . . . , 1129-N may be etched using an isotropic etch. In some embodiments, a selective etch may remove the second dielectric material 1129-1, 1129-2, . . . , 1129-N from the region, e.g., cell-side region, of the vertical stack to the single crystalline silicon 1178 grown in the second vertical opening 1171 to form first horizontal openings 1149. As used herein, the term "cell-side region" refers to a region of a vertical stack in which a storage node is formed.

FIG. 11E illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 11E illustrates a cross sectional view, taken along cut-line B-B' in FIG. 6A, showing another view of the semiconductor structure at this particular point in one example semiconductor fabrication process of an embodiment of the present disclosure.

As shown in FIG. 11E, single crystalline silicon 1187 may be epitaxially grown within the first horizontal openings 1149 from the single crystalline silicon 1187 in the second vertical opening 1171 toward the third vertical opening 1151 to fill the first horizontal openings 1149. The single crystalline silicon 1187 in the second vertical openings 1171 may be used as the seed to grow the single crystalline silicon 1187 in the first horizontal openings 1149. In some embodiments, a gas, e.g., silane ($Si_2H_6$) gas, may be flowed into the first horizontal openings 1149 to grow the single crystalline silicon 1187 to fill the first horizontal openings 1149. In some embodiments, the single crystalline silicon 1187 may be grown in the first horizontal openings 1149 from the single crystalline silicon 1187 in the second vertical opening 1171 at a temperature in a range of approximately 400-600° C. The single crystalline silicon 1187 may be epitaxially grown in the first horizontal opening 1149 along a <100> crystalline plane orientation toward the third vertical opening 1151 to fill the first horizontal openings 1149.

Horizontal digit lines and access devices may be formed in the access device regions of the vertical stack adjacent the second vertical openings 1171. The methods of forming the horizontal digit lines and access devices are described in FIGS. 7E-7I and 8A-8E. Further, storage nodes, e.g., capacitor cells, may be formed in the cell-side region of the vertical stack adjacent the third vertical opening 1151. The method of forming the storage nodes is described in FIGS. 8A-8E and 9A-9E FIG. 12 is a block diagram of an apparatus in the form of a computing system 1290 including a memory device 1293 in accordance with a number of embodiments of the present disclosure. As used herein, a memory device 1293, a memory array 1280, and/or a host 1292, for example, might also be separately considered an "apparatus." According to embodiments, the memory device 1293 may comprise at least one memory array 1280 with a memory cell formed having a digit line and body contact, according to the embodiments described herein.

In this example, system 1290 includes a host 1292 coupled to memory device 1293 via an interface 1294. The computing system 1290 can be a personal laptop computer, a desktop computer, a digital camera, a mobile telephone, a memory card reader, or an Internet-of-Things (IoT) enabled device, among various other types of systems. Host 1292 can include a number of processing resources (e.g., one or more processors, microprocessors, or some other type of controlling circuitry) capable of accessing the memory device 1293. The system 1290 can include separate integrated circuits, or both the host 1292 and the memory device 1293 can be on the same integrated circuit. For example, the host 1292 may be a system controller of a memory system comprising multiple memory devices 1293, with the system controller 1295 providing access to the respective memory devices 1293 by another processing resource such as a central processing unit (CPU).

Figure 12:
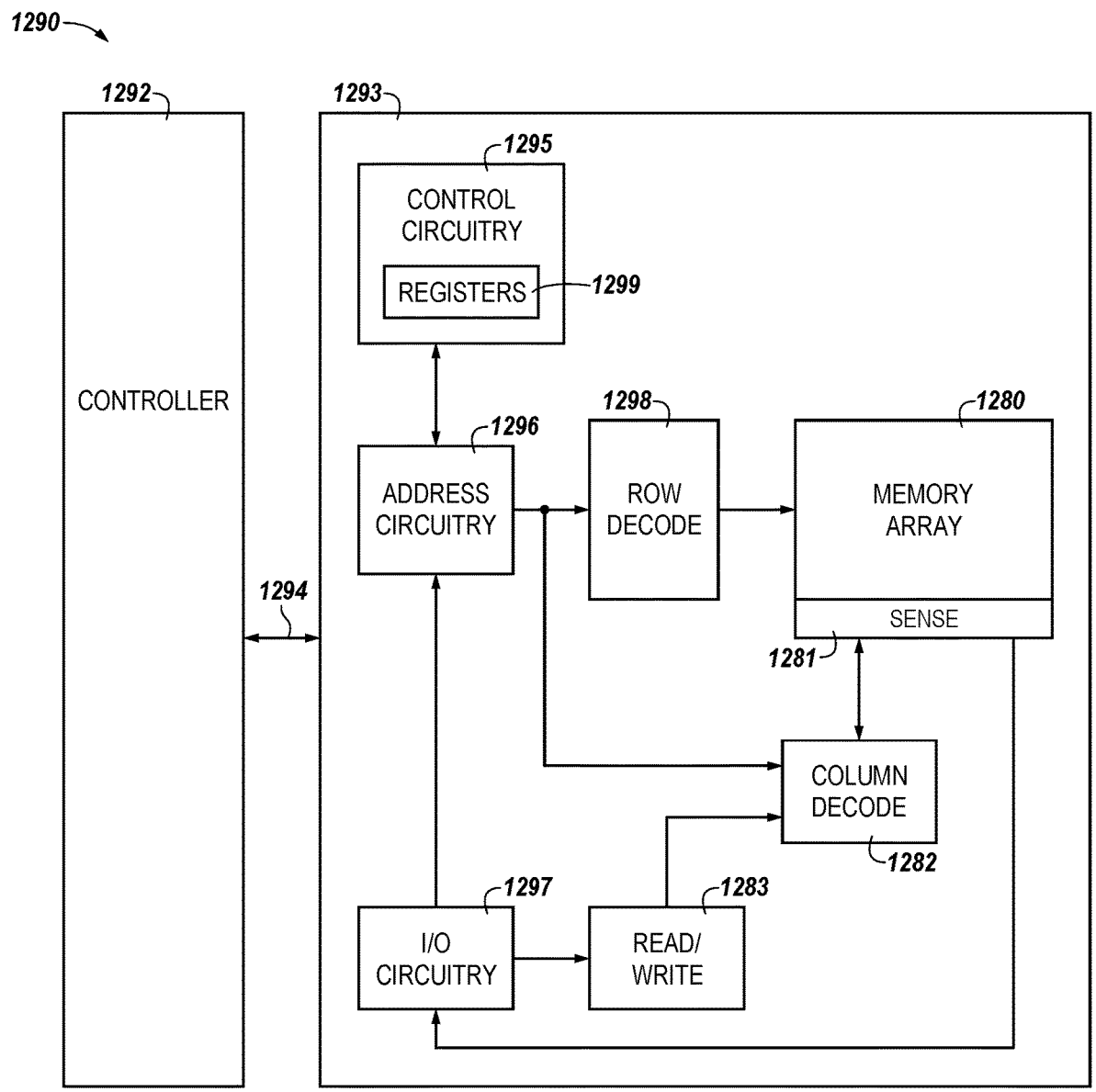
FIG. 12 is a block diagram of an apparatus in the form of a computing system including a memory device, in accordance with a number of embodiments of the present disclosure.

In the example shown in FIG. 12, the host 1292 is responsible for executing an operating system (OS) and/or various applications (e.g., processes) that can be loaded thereto (e.g., from memory device 1293 via controller 1295). The OS and/or various applications can be loaded from the memory device 1293 by providing access commands from the host 1292 to the memory device 1293 to access the data comprising the OS and/or the various applications. The host 1292 can also access data utilized by the OS and/or various applications by providing access commands to the memory device 1293 to retrieve said data utilized in the execution of the OS and/or the various applications.

For clarity, the system 1290 has been simplified to focus on features with particular relevance to the present disclosure. The memory array 1280 can be a DRAM array comprising at least one memory cell having a digit line and body contact formed according to the techniques described herein. For example, the memory array 1280 can be an unshielded DL 4F2 array such as a 3D-DRAM memory array. The memory array 1280 can comprise memory cells arranged in rows coupled by word lines (which may be referred to herein as access lines or select lines) and columns coupled by digit lines (which may be referred to herein as sense lines or data lines). Although a single array 1280 is shown in FIG. 12, embodiments are not so limited. For instance, memory device 1293 may include a number of arrays 1280 (e.g., a number of banks of DRAM cells).

The memory device 1293 includes address circuitry 1296 to latch address signals provided over an interface 1294. The interface can include, for example, a physical interface employing a suitable protocol (e.g., a data bus, an address bus, and a command bus, or a combined data/address/command bus). Such protocol may be custom or proprietary, or the interface 1294 may employ a standardized protocol, such as Peripheral Component Interconnect Express (PCIe), Gen-Z, CCIX, or the like. Address signals are received and decoded by a row decoder 1298 and a column decoder 1282 to access the memory array 1280. Data can be read from memory array 1280 by sensing voltage and/or current changes on the sense lines using sensing circuitry 1281. The sensing circuitry 1281 can comprise, for example, sense amplifiers that can read and latch a page (e.g., row) of data from the memory array 1280. The I/O circuitry 1297 can be used for bi-directional data communication with the host 1292 over the interface 1294. The read/write circuitry 1283 is used to write data to the memory array 1280 or read data from the memory array 1280. As an example, the circuitry 1283 can comprise various drivers, latch circuitry, etc.

Control circuitry 1295 includes registers 1299 and decodes signals provided by the host 1292. The signals can be commands provided by the host 1292. These signals can include chip enable signals, write enable signals, and address latch signals that are used to control operations performed on the memory array 1280, including data read operations, data write operations, and data erase operations. In various embodiments, the control circuitry 1295 is responsible for executing instructions from the host 1292. The control circuitry 1295 can comprise a state machine, a sequencer, and/or some other type of control circuitry, which may be implemented in the form of hardware, firmware, or software, or any combination of the three. In some examples, the host 1292 can be a controller external to the memory device 1293. For example, the host 1292 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory device, comprising:
   an array of vertically stacked memory cells, the array having horizontally oriented access devices and digit lines and vertically oriented access lines, comprising:
   a layer of semiconductor material, a layer of a first dielectric material formed on the layer of semiconductor material, and a layer of a second dielectric material formed on the layer of first dielectric material, wherein the layers of the semiconductor material, the first dielectric material, and the second dielectric material are formed in repeating iterations to form a vertical stack;
   the horizontally oriented access devices having a first source/drain region and a second source drain region separated by both an epitaxially grown single crystalline channel of a plurality of epitaxially grown single crystalline channels and a body region, and having gates opposing the channel and separated therefrom by a gate dielectric;
   the vertically oriented access lines separated from the channel by the gate dielectric;
   horizontally oriented storage nodes electrically coupled to the second source/drain regions of the horizontally oriented access devices, wherein each respective horizontally oriented storage node is formed on a same horizontal plane and level with a respective epitaxially grown single crystalline channel of the plurality of epitaxially grown single crystalline channels; and
   the horizontally oriented digit lines electrically coupled to the first source/drain regions of the horizontally oriented access devices.

2. The memory device of claim 1, wherein the horizontally oriented storage nodes are in direct electrical contact with the second source/drain regions of the horizontally oriented access devices on the same horizontal plane and level with the second source/drain regions.

3. The memory cell array of claim 1, wherein the horizontally oriented storage nodes comprise capacitor cells having a bottom electrode electrically coupled to the second source/drain regions of the access devices and a top electrode separated from the bottom electrode by a cell dielectric.

4. The memory device of claim 1, wherein the epitaxially grown single crystalline channel of the plurality of epitaxially grown single crystalline channels is grown from a semiconductor material in the array of vertically stacked memory cells.

5. The memory device of claim 4, wherein the epitaxially grown single crystalline channel of the plurality of epitaxially grown single crystalline channels is grown from a portion of the semiconductor material that is exposed to a disilane gas ($Si_2H_6$).

6. The memory device of claim 1, wherein the first and second source/drain regions are formed by doping a portion of the epitaxially grown single crystalline channel of the plurality of epitaxially grown single crystalline channels.

7. A memory device, comprising:
   an array of vertically stacked memory cells, the array having horizontally oriented access devices, horizontally oriented storage nodes formed on a same horizontal plane and level with a channel of each respective horizontally oriented access device, and vertically oriented access lines, wherein the array of vertically stacked memory cells comprises:

a layer of semiconductor material, a layer of a first dielectric material formed on the layer of the semiconductor material, and a layer of a second dielectric material formed on the layer of the first dielectric material, wherein the layers of the semiconductor material, the first dielectric material, and the second dielectric material are formed in repeating iterations to form a vertical stack;

a plurality of first vertical openings, having a first horizontal direction and a second horizontal direction, formed through the vertical stack and extending predominantly in the second horizontal direction to form elongated vertical pillar columns with first vertical sidewalls in the vertical stack;

a first conductive material on a gate dielectric material in the plurality of first vertical openings;

a plurality of separate vertical access lines along the sidewalls of the elongated vertical pillar columns;

second vertical openings formed through the vertical stack and extending predominantly in the first horizontal direction to expose second vertical sidewalls adjacent a first region of the semiconductor material;

first portions of the semiconductor material selectively removed a first distance (DIST 1) from the second vertical openings to form first horizontal openings in the second horizontal direction with a remaining second portion of the semiconductor material at a distal end of the first horizontal openings from the second vertical openings; and single crystalline silicon epitaxially grown within the first horizontal openings from the distal end of the first horizontal openings toward the second vertical openings to fill the first horizontal openings.

8. The memory device of claim 7, wherein the first dielectric material is an oxide material.

9. The memory device of claim 7, wherein the semiconductor material is a polysilicon material.

10. The memory device of claim 7, wherein the second dielectric material is a nitride material.

11. The memory device of claim 7, wherein the first distance has a minimum value of approximately twenty (20) nanometers (nm).

12. The memory device of claim 7, wherein the first distance has a maximum value of approximately three hundred (300) nm.

13. The memory device of claim 7, wherein the vertical stack has a minimum height of approximately 20 nm.

14. The memory device of claim 7, wherein the vertical stack has a maximum height of approximately 300 nm.

* * * * *